(12) United States Patent
Tran et al.

(10) Patent No.: US 12,300,296 B2
(45) Date of Patent: May 13, 2025

(54) CROSS-POINT ARRAY REFRESH SCHEME

(71) Applicant: SanDisk Technologies LLC, Austin, TX (US)

(72) Inventors: Michael Nicolas Albert Tran, San Jose, CA (US); Michael K. Grobis, Campbell, CA (US); Ward Parkinson, Boise, ID (US); Nathan Franklin, Belmont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/618,754

(22) Filed: Mar. 27, 2024

(65) Prior Publication Data
US 2024/0265958 A1    Aug. 8, 2024

Related U.S. Application Data

(62) Division of application No. 17/824,806, filed on May 25, 2022, now Pat. No. 11,972,787.

(51) Int. Cl.
*G11C 11/16* (2006.01)
*G06F 11/10* (2006.01)

(52) U.S. Cl.
CPC ...... *G11C 11/1659* (2013.01); *G06F 11/1044* (2013.01); *G11C 11/161* (2013.01); *G11C 11/1673* (2013.01); *G11C 11/1675* (2013.01)

(58) Field of Classification Search
CPC ............ G11C 11/1659; G11C 11/1044; G11C 11/161; G11C 11/1673; G11C 11/1675
USPC ......................................................... 365/158
See application file for complete search history.

(56) References Cited

U.S. PATENT DOCUMENTS

| | | | |
|---|---|---|---|
| 9,036,409 B2 | 5/2015 | Gordon et al. | |
| 9,842,644 B1* | 12/2017 | Kim ................... | G11C 13/0033 |
| 10,176,860 B1* | 1/2019 | Mylavarapu ....... | G11C 16/3418 |
| 10,269,442 B1 | 4/2019 | Tortorelli et al. | |
| 10,777,275 B2 | 9/2020 | Pirovano et al. | |
| 11,139,016 B1 | 10/2021 | Pellizzer et al. | |

(Continued)

OTHER PUBLICATIONS

International Search Report & the Written Opinion of the International Searching Authority dated Aug. 18, 2023, International Application No. PCT/US2023/020882.

(Continued)

*Primary Examiner* — Ly D Pham
(74) *Attorney, Agent, or Firm* — Pearl Cohen Zedek Latzer Baratz LLP

(57) ABSTRACT

Technology is disclosed herein for refreshing threshold switching selectors in programmable resistance memory cells in cross-point memory arrays. The Vt of the threshold switching selector may drift over time. The memory system resets the Vt of the threshold switching selectors with a selector refresh operation and uses a separate data refresh operation to refresh data in programmable resistance memory elements. The data refresh operation itself may also refresh the selector. However, the threshold switching selector refresh operation is faster than the data refresh operation. Moreover, the selector refresh operation consumes much less power and/or current then the data refresh operation. The selector refresh operation may thus be performed at a higher rate than the data refresh operation.

20 Claims, 27 Drawing Sheets

(56) References Cited

U.S. PATENT DOCUMENTS

| | | | |
|---|---|---|---|
| 11,222,678 B1* | 1/2022 | Parkinson | H10B 61/22 |
| 2012/0075947 A1 | 3/2012 | Kang et al. | |
| 2014/0056052 A1 | 2/2014 | Lee | |
| 2019/0043580 A1 | 2/2019 | Pirovano et al. | |
| 2019/0147941 A1 | 5/2019 | Qin et al. | |
| 2019/0341102 A1 | 11/2019 | Castro | |
| 2021/0358546 A1 | 11/2021 | Sinipete et al. | |
| 2022/0093166 A1 | 3/2022 | Pellizzer et al. | |
| 2022/0139454 A1* | 5/2022 | Robertson | G11C 13/004 365/148 |
| 2023/0326506 A1* | 10/2023 | Grobis | G11C 11/161 365/158 |
| 2023/0360700 A1* | 11/2023 | Richter | G11C 13/0028 |
| 2023/0386543 A1 | 11/2023 | Tran et al. | |

OTHER PUBLICATIONS

Restriction Requirement dated Dec. 7, 2023, U.S. Appl. No. 17/824,806, filed May 25, 2022.
Response to Restriction dated Feb. 5, 2024, U.S. Appl. No. 17/824,806, filed May 25, 2022.
Notice of Allowance dated Feb. 14, 2024, U.S. Appl. No. 17/824,806, filed May 25, 2022.

* cited by examiner

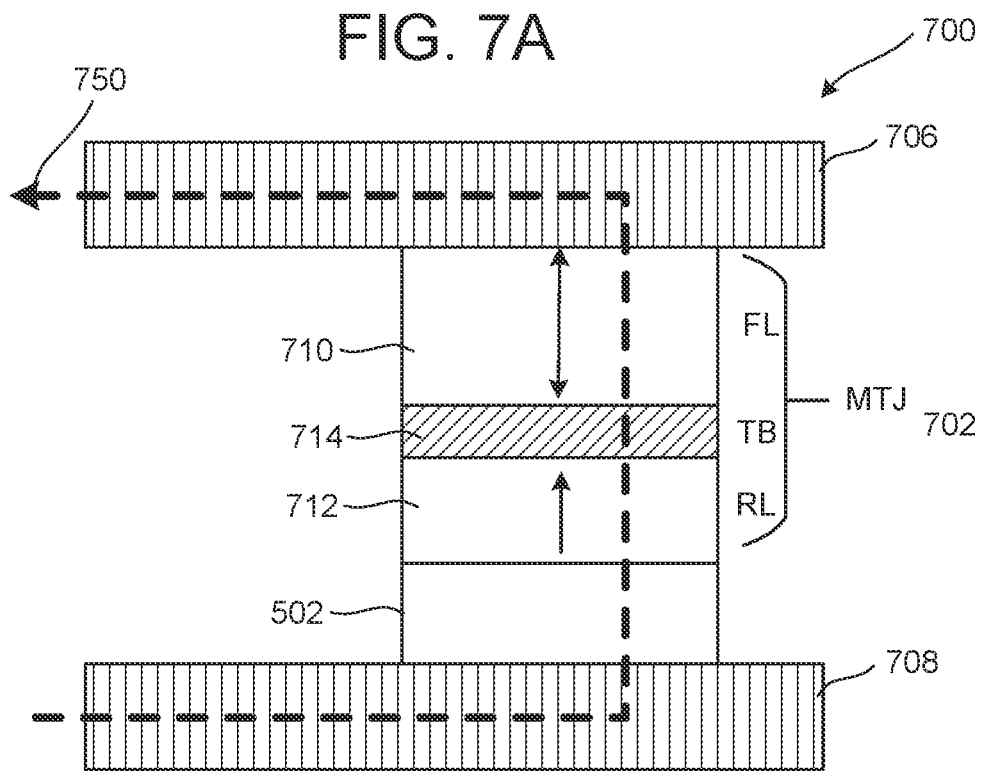
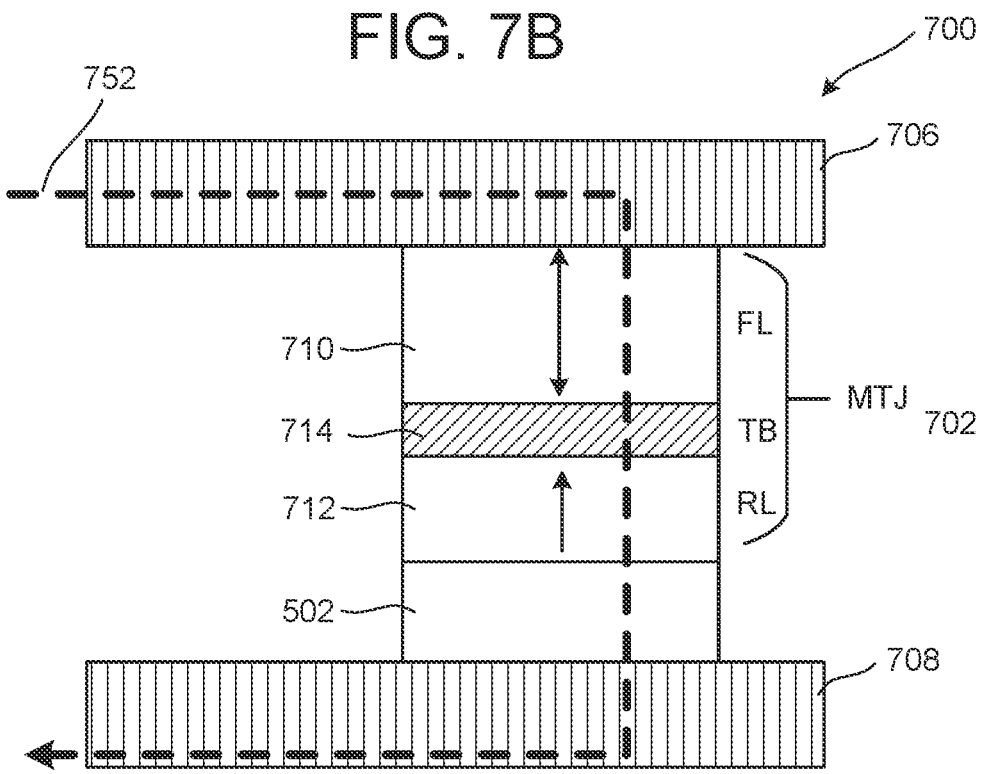

CROSS-POINT ARRAY REFRESH SCHEME

CLAIM OF PRIORITY

This application is a divisional of U.S. patent application Ser. No. 17/824,806 filed on May 25, 2022 by Tran et al., published as U.S. Publication No. 2023/386543 on Nov. 30, 2022, entitled, "CROSS-POINT ARRAY REFRESH SCHEME," which is incorporated herein by reference in its entirety.

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

The memory cells may reside in a cross-point memory array. In a memory array with a cross-point type architecture, one set of conductive lines run across the surface of a substrate and another set of conductive lines are formed over the other set of conductive lines, running over the substrate in a direction perpendicular to the other set of conductive lines. The memory cells are located at the cross-point junctions of the two sets of conductive lines.

A programmable resistance memory cell is formed from a material having a programmable resistance ("memory element"). In a binary approach, the programmable resistance memory cell at each cross-point can be programmed into one of two resistance states: high and low. In some approaches, more than two resistance states may be used. One type of programmable resistance memory cell is a magnetoresistive random access memory (MRAM) cell. An MRAM cell uses magnetization to represent stored data, in contrast to some other memory technologies that use electronic charges to store data. A bit of data is written to an MRAM cell by changing the direction of magnetization of a magnetic element ("the free layer") within the MRAM cell, and a bit is read by measuring the resistance of the MRAM cell (low resistance typically represents a "0" bit and high resistance typically represents a "1" bit).

In a cross-point memory array, each memory cell may contain a two terminal threshold switching selector in series with the memory element. The threshold switching selector has a high resistance (in an off or non-conductive state) until it is biased to a voltage higher than its threshold voltage (Vt) or current above its threshold current, and until its voltage bias falls below Vhold ("Voffset") or current below a holding current Ihold. After the Vt is exceeded and while Vhold is exceeded across the threshold switching selector, the threshold switching selector has a low resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. Accordingly, to program a memory cell at a cross-point, a voltage is applied which is sufficient to turn on the associated threshold switching selector and set or reset the memory cell. To read a memory cell, the threshold switching selector similarly is activated by being turned on before the resistance state of the memory cell can be determined. One example of a threshold switching selector is an Ovonic Threshold Switch (OTS).

Data is typically stored as ECC (Error Correction Code) codewords in a group of the programmable resistance memory cells. The ECC codeword includes data bits and parity bits. After reading an ECC codeword, the codeword is processed by an ECC decoder to detect and correct errors in the ECC codeword. However, there are limits to how many errors can be corrected.

Over time the physical condition of the programmable resistance memory element may slowly change, which relates to the ability to retain data ("data retention"). For example, the magnetization of the free layer of an MRAM cell can slowly change, which can lead to a data error. A data refresh operation can be performed to help data retention. One type of data refresh operation will read an ECC codeword from the memory cells and decode the ECC codeword to correct any errors. Then, the corrected ECC codeword is written back to the same group of memory cells, or optionally to a different group of memory cells. Such data refresh operations can take considerable time, which prevents normal user access to the memory array. Also, the data refresh operation can consume considerable power and/or current. Furthermore, the data refresh contributes to wear of the memory cell, thereby impacting endurance.

BRIEF DESCRIPTION OF THE DRAWINGS

Like-numbered elements refer to common components in the different figures.

FIGS. 7A and 7B illustrate the writing of an MRAM memory cell by flowing current that generates spin torque transfer (STT).

DETAILED DESCRIPTION

Technology is disclosed herein for refreshing threshold switching selectors in programmable resistance memory cells in cross-point memory arrays. Each programmable resistance memory cell has a programmable resistance memory element in series with a threshold switching selector. The threshold switching selector may be, but is not limited to, an Ovonic Threshold Switch (OTS). In an embodiment, the programmable resistance memory element comprises a Magnetic Tunnel Junction (MTJ).

The Vt of the threshold switching selector may vary quasi-monotonically over time, a process usually referred to as drift. For example, the Vt may increase over time. Turning the threshold switching selector on may reset the Vt to its original value. The threshold switching selector will be turned on as part of a normal read or write operation. However, it is possible for the Vt to drift substantially since the last read or write operation. If the Vt drifts too far it may not be possible to switch on the threshold switching selector. Techniques are disclosed herein for refreshing the threshold switching selector, which resets the Vt. The threshold switching selector refresh does not read or write the memory cell, and is thus fast and power/current efficient. Moreover, the selector refresh places less stress on the memory cell than a data refresh.

Figure 1:
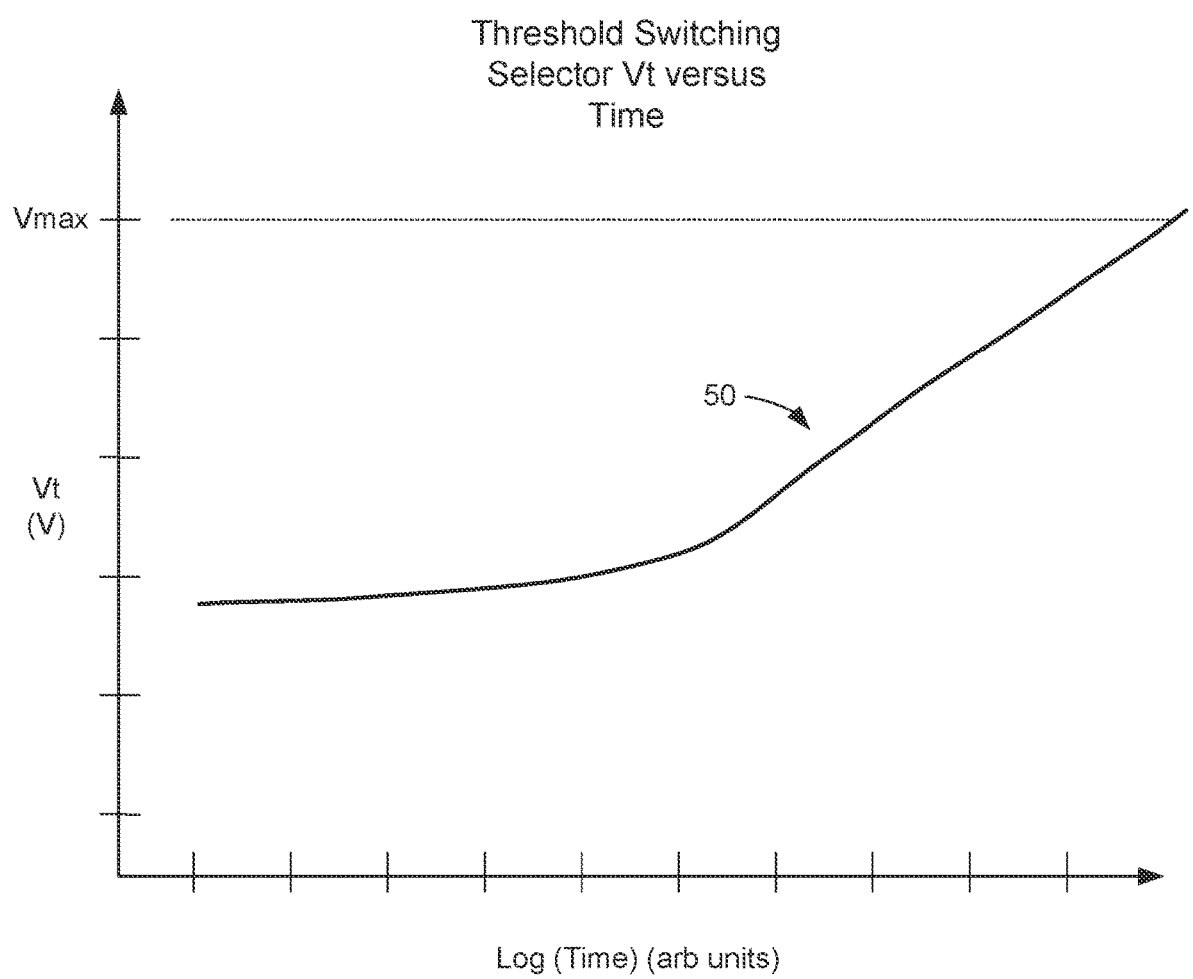
FIG. 1 is a graph of threshold switching selector Vt versus time.

FIG. 1 is a graph of threshold switching selector Vt versus time. Specifically, plot 50 on FIG. 1 depicts threshold switching selector Vt versus time. The horizontal axis is the time in seconds since the last time that the Vt of the threshold switching selector was reset. The time axis is on a log 10 scale. The vertical axis corresponds to the Vt of the threshold switching selector and is a linear scale. FIG. 1 depicts how the Vt of the threshold switching selector Vt drifts over time. FIG. 1 exemplifies that the Vt may be relatively stable for a period of time, and then start to drift upwards. The Vt may drift upward logarithmically with time. Refreshing the threshold switching selector, in an embodiment, will reset the Vt back to its lowest value.

The voltage Vmax represents the maximum voltage that can be applied across the threshold switching selector, given the architecture of the memory system. The voltage Vmax is typically limited by the supply voltage to the memory die (or "chip") that contains the memory array. The supply voltage is typically limited by the type of access transistors used on the memory die. As a general rule, longer gate transistors and thicker gate dielectrics allow a larger voltage to be applied. However, it is desirable to use shorter gate transistors and/or thinner gate dielectrics.

If the Vt of the threshold switching selector drifts up to a value larger than Vmax, applying Vmax across the threshold switching selector may fail to turn it on. The shape of the plot 50 on FIG. 1 will depend on the physical characteristics of the threshold switching selector. To some extent the initial Vt and the Vt drift can be managed by design choice, such as the materials of the threshold switching selector. Therefore, the initial Vt of the threshold switching selector can be reduced by design choice. However, there are tradeoffs between endurance, Vt, and Ihold. Therefore, designing the threshold switching selector to decrease the initial Vt can negatively impact other key parameters.

An embodiment of the threshold switching selector refresh operation can improve the endurance of the programmable resistance memory cell. The rate of wear of some programmable resistance memory cells, such as MRAM cells, depends on the length of time for which the threshold switching selector is on and hence the time that current passes through the programmable resistance memory element (e.g., MTJ). An embodiment of the selector refresh operation will cause less wear on the memory cell than a read operation, which has the threshold switching selector on for a longer period of time.

In an embodiment, the memory system refreshes the threshold switching selector with a selector refresh operation and uses a separate data refresh operation to refresh data in the programmable resistance memory element. The data refresh operation itself may also refresh the selector. However, the threshold switching selector refresh operation is faster than the data refresh operation. Thus, the threshold switching selector refresh operation does not interfere with user access nearly as much as a data refresh operation. Moreover, the threshold switching selector refresh operation does not consume nearly as much as power and/or current as a data refresh operation. The selector refresh operation may thus be performed at a higher rate than the data refresh operation. This allows the threshold switching selectors to be refreshed often enough to prevent the Vt from drifting too high to be able to turn on the threshold switching selector.

As used herein, direction of magnetization is the direction that the magnetic moment is oriented with respect to a reference direction set by another element of the MTJ ("the reference layer"). In some embodiments, the low resistance is referred to as a parallel or P-state and the high resistance is referred to as an anti-parallel or AP-state. MRAM can use the spin-transfer torque effect to change the direction of the magnetization from P-state to AP-state and vice-versa, which typically requires bipolar (bi-directional write) operation for writes. The mechanism of MRAM switching can also comprise Voltage Control of Magnetic Anisotropy switching or Spin-Orbit-Torque switching.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application.

Figure 2A:
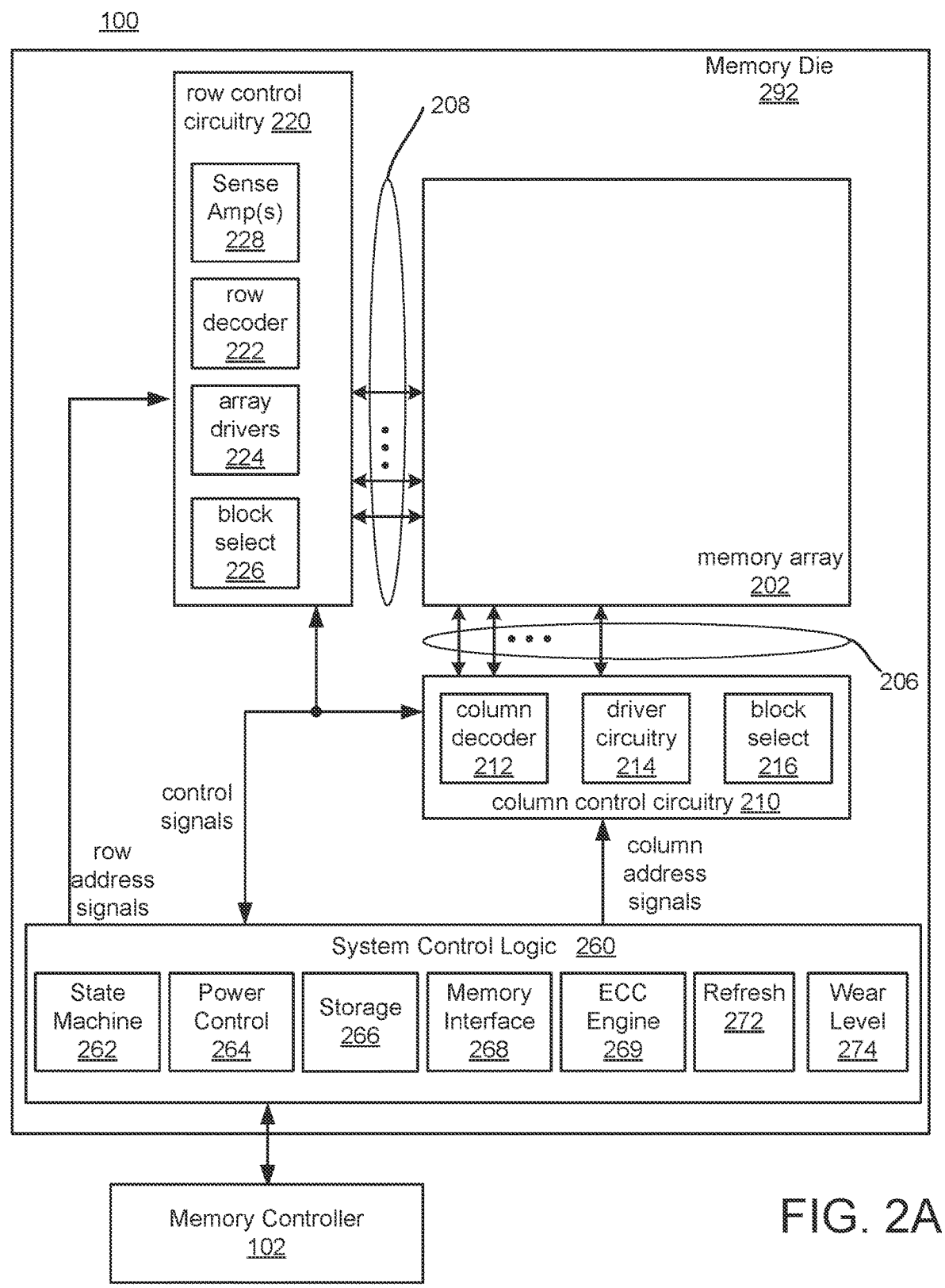
FIG. 2A is a block diagram of one embodiment of a memory die.

FIG. 2A is a block diagram that depicts one embodiment of a memory system 100 that can implement the technology described herein. The memory system 100 has a memory controller 102 and a memory die 292. Only one memory die 292 is depicted in FIG. 2A, but the memory controller 102 may control a number of memory dies 292. Memory die 292 includes a memory structure 202 that can include any of memory cells described in the following. The array terminal lines of memory structure 202 include the various layer(s) of word lines organized as rows, and the various layer(s) of bit lines organized as columns. However, other orientations can also be implemented. Memory die 292 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, row drivers 224, and block select circuitry 226 for both reading and writing operations. Row control circuitry 220 may also include read/write circuitry. In an embodiment, row decode and control circuitry 220 has sense amplifiers 228, which each contain circuitry for sensing a condition (e.g., voltage) of a word line of the memory structure 202. In an embodiment, by sensing a word line voltage, a condition of a memory cell in a cross-point array is determined. Memory die 292 also includes column decode and control circuitry 210 whose input/outputs 206 are connected to respective bit lines of the memory structure 202.

Although only single block is shown for structure 202, a memory die can include multiple arrays or "tiles" that can be individually accessed. Column control circuitry 210 receives a group of N column address signals and one or more various control signals from System Control Logic 260, and typically may include such circuits as column decoders 212, column decoders and drivers 214, block select circuitry 216, as well as read/write circuitry, and I/O multiplexers.

System control logic 260 receives data and commands from a memory controller 102 and provides output data and status to the memory controller 102. The memory controller 102 may implement an interface such as DDR, DIMM, CXL, PCIe and others. The memory controller 102 may interface with a host system, or may be embedded in a host system. In one embodiment, the memory controller 102 is embedded on the memory die 292. In such case, data and commands may be sent and received directly between memory die 292 and host system. In some embodiments, the system control logic 260 can include a state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor. The system control logic 260 can also include a power control module 264 that controls the power, current source currents, and voltages supplied to the rows and columns of the memory 202 during memory operations and may include charge pumps and regulator circuit for creating regulating voltages, and on/off control of each for word line bit line selection of the memory cells. System control logic 260 includes storage 266, which may be used to store parameters for operating the memory structure 202.

System control logic 260 also includes refresh logic 272 and wear leveling logic 274. In an embodiment, the refresh logic 272 refreshes the threshold switching selectors in the memory structure 202. Refreshing the threshold switching selectors will reset the Vt of the threshold switching selectors. In an embodiment, the refresh logic 272 refreshes programmable resistance memory elements in the memory array, which may also be referred to as a data refresh. In one embodiment, the refresh logic 272 refreshes magnetoresistance memory elements in the memory array. In an embodiment, the refresh rate for the threshold switching selectors is significantly higher than the refresh rate for the magnetoresistance memory elements. Optionally all or a portion of the refresh logic 272 may reside on the memory controller 102.

Such system control logic may be commanded by the memory controller 102 (or a host) to refresh logic 272, which may load an on-chip stored row and column address (Pointer) which may be incremented after refresh. Such address bit(s) may be selected only (to refresh the OTS). Or such address may be read, corrected by steering through ECC engine 269, and then stored in a "spare" location which is also being incremented (so all codewords are periodically read, corrected, and relocated in the entire chip under control of wear leveling logic 274) to in effect wear level so use of each bit across the chip is more uniform. Such operation may be more directly controlled by the host of an external controller, for example a PCIe or CXL controller located separately from the memory chip or on the memory die.

Commands and data are transferred between the memory controller 102 and the memory die 292 via memory controller interface 268 (also referred to as a "communication interface"). Such interface may be PCIe, CXL, DDRn for example. Memory controller interface 268 is an electrical interface for communicating with memory controller 102. In one embodiment, memory controller interface 268 includes a set of input and/or output (I/O) pins that connect to the controller 102. In various embodiments, the interface 268 is JEDEC standard DDRn or LPDDRn, such as DDR5 or LPDDR5, or a subset thereof with smaller page and/or relaxed timing. Other I/O interfaces can also be used. For example, memory controller interface 268 may implement a Toggle Mode Interface.

System control logic 260 on the memory die may include Error Correction Code (ECC) engine 269. ECC engine 269 may be referred to as an on-die ECC engine, as it is on the same semiconductor die as the memory cells. That is, the on-die ECC engine 269 may be used to encode data that is to be stored in the memory structure 202, and to decode the decoded data and correct errors. The encoded data may be referred to herein as a codeword or as an ECC codeword. The ECC codeword may contain data bits and parity bits. ECC engine 269 may be used to perform a decoding algorithm and to perform error correction. Hence, the ECC engine 269 may decode the ECC codeword. In an embodiment, the ECC engine 269 is able to decode the data more rapidly by direct decoding without iteration.

Having the ECC engine 269 on the same die as the memory cells allows for fast decoding. The ECC engine 269 can use a wide variety of decoding algorithms including, but not limited to, Reed Solomon, a Bose-Chaudhuri-Hocquenghem (BCH), and low-density parity check (LDPC). In an embodiment, the ECC engine 269 is able to determine or estimate a number of bit errors in a codeword prior to decoding the codeword. In an embodiment, the ECC engine 269 calculates the syndrome of the codeword in order to estimate the number of bit errors in the codeword. In an embodiment, the ECC engine 269 is capable of decoding a codeword provided that there are no more than a certain number of bits in error in the codeword.

In some embodiments, all of the elements of memory die 292, including the system control logic 260, can be formed as part of a single die. In other embodiments, some or all of the system control logic 260 can be formed on a different die. In some embodiments, elements of the system control logic 260, such as the ECC engine 269, refresh 272, and/or wear level 274 can be contained in the memory controller 102.

In one embodiment, memory structure 202 comprises a three-dimensional memory array of non-volatile or volatile memory cells in which multiple memory levels are formed above a single substrate, such as a wafer. The memory structure may comprise any type of non-volatile or volatile memory that are monolithically formed in one or more physical levels of memory cells having an active area disposed above a silicon (or other type of) substrate. In another embodiment, memory structure 202 comprises a two-dimensional memory array of non-volatile memory cells.

The exact type of memory array architecture or memory cell included in memory structure 202 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM or MRAM cross-point memory includes programmable resistance memory elements in series with an OTS selector arranged in cross-point arrays accessed by X lines and Y lines (e.g., word lines and bit lines). In another embodiment of cross-point is PCM in series with and OTS selector. In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data using magnetic storage elements. The magnetic storage elements are formed from two ferromagnetic layers, each of which can hold a magnetization, separated by a thin insulating layer. For a field-controlled MRAM, one of the two layers is a permanent magnet set to a particular polarity; the other layer's magnetization can be changed to match that of an external field to store memory. Other types of MRAM cells are possible. A memory device may be built from a grid of MRAM cells. In one embodiment for programming, each memory cell lies between a pair of write lines arranged at right angles to each other, parallel to the cell, one above and one below the cell. For some MRAM cells, when current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage light, or other wave. And the current forced for write can, for example, be driven rapidly to a peak value and then linearly ramped lower with, for example, a 200 ns edge rate. Such peak current force may be limited by a zoned voltage compliance that varies by position of the memory cell along the word line or bit line. In an embodiment, a phase change memory cell has a phase change memory element in series with a threshold switching selector such as an OTS.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts, the memory structure 202 and the peripheral circuitry, including all of the other elements. An important characteristic of a memory circuit is its capacity, which can be increased by increasing the area of the memory die 292 that is given over to the memory structure 202; however, this reduces the area of the memory die available for the peripheral circuitry or increases cost which is related to chip area. This can place quite severe restrictions on these peripheral elements. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die 292 is the amount of area to devote to the memory structure 202 and the amount of area to devote to the peripheral circuitry. Such tradeoffs may result in more IR drop from use of larger x-y arrays of memory between driving circuits on the word line and bit line, which in turn may be benefit more from use of voltage limit and zoning of the voltage compliance by memory cell position along the word line and bit line.

Another area in which the memory structure 202 and the peripheral circuitry are often at odds is in the processing involved in forming these regions, since these regions often involve differing processing technologies and the trade-off in having differing technologies on a single die. For example, elements such as sense amplifier circuits, charge pumps, logic elements in a state machine, and other peripheral circuitry in system control logic 260 often employ PMOS devices. In some cases, the memory structure will be based on CMOS devices. Processing operations for manufacturing a CMOS die will differ in many aspects from the processing operations optimized for NMOS-only technologies.

Figure 2B:
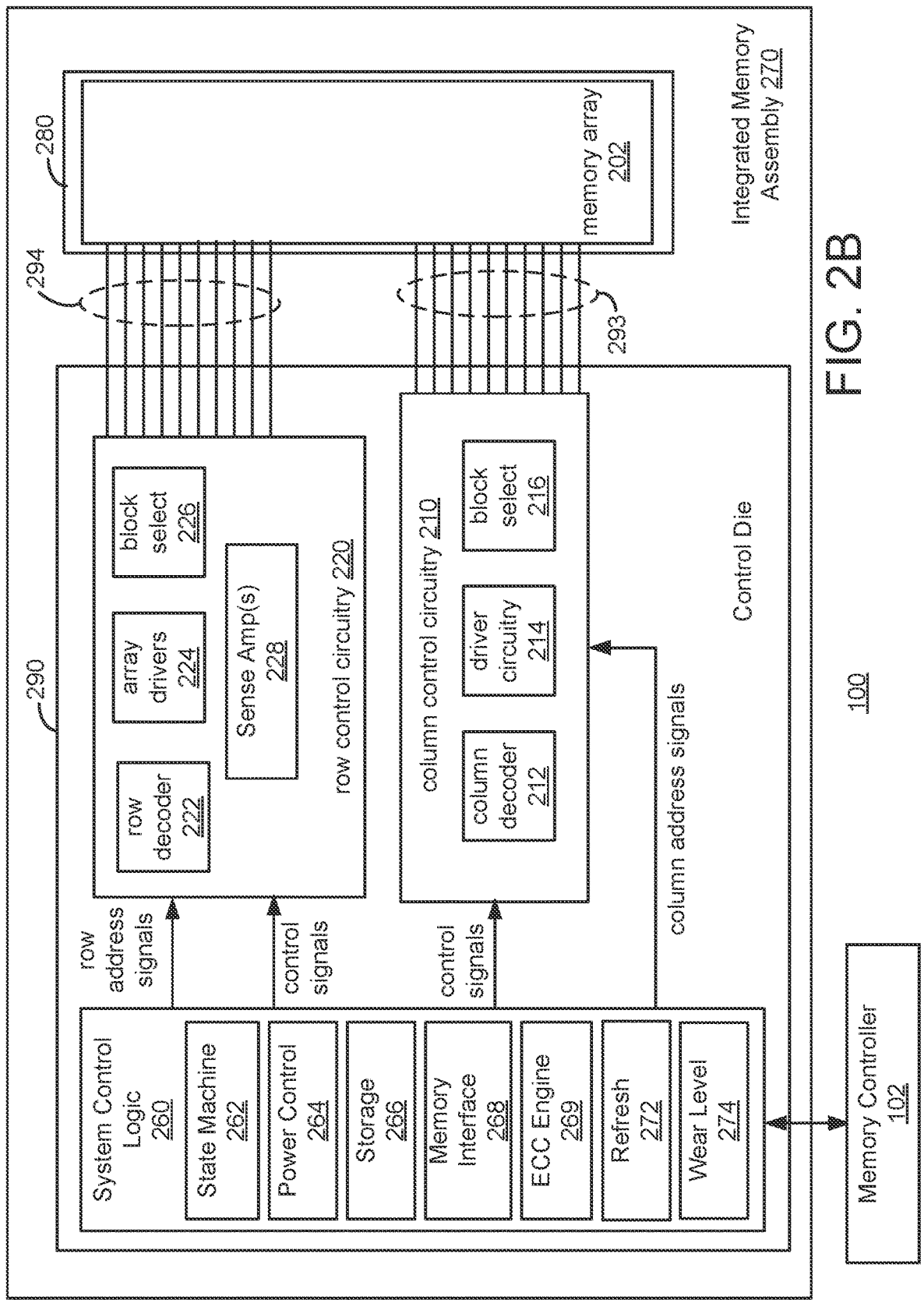
FIG. 2B is a block diagram of one embodiment of an integrated memory assembly containing a control die and a memory structure die.

To improve upon these limitations, embodiments described below can separate the elements of FIG. 2A onto separately formed die that are then bonded together. FIG. 2B depicts a memory system 100 having an integrated memory assembly 270 and a memory controller 102. The integrated memory assembly 270 has a memory structure die 280 and a control die 290. The integrated memory assembly 270 is in communication with the memory controller 102. The memory structure 202 is formed on the memory structure die 280 and some or all of the peripheral circuitry elements, including one or more control circuits, are formed on the control die 290. For example, a memory structure die 280 can be formed of just the memory elements, such as the array of memory cells of MRAM memory, PCM memory, ReRAM memory, or other memory type. Some or all of the peripheral circuitry, even including elements such as decoders and sense amplifiers, can then be moved on to the control die. This allows each of the semiconductor die to be optimized individually according to its technology. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional die, such as two memory die and one control die, for example.

As with 202 of FIG. 2A, the memory structure die 280 in FIG. 2B can include multiple independently accessible arrays or "tiles." System control logic 260, row control circuitry 220, and column control circuitry 210 are located in control die 290. In some embodiments, all or a portion of the column control circuitry 210 and all or a portion of the row control circuitry 220 are located on the memory structure die 280. In some embodiments, some of the circuitry in the system control logic 260 is located on the on the memory structure die 280.

FIG. 2B shows column control circuitry 210 on the control die 290 coupled to memory structure 202 on the memory structure die 280 through electrical paths 293. For example, electrical paths 293 may provide electrical connection between column decoder 212, column driver circuitry 214, and block select 216 and bit lines of memory structure 202. Electrical paths may extend from column control circuitry 210 in control die 290 through pads on control die 290 that are bonded to corresponding pads of the memory structure die 280, which are connected to bit lines of memory structure 202. Each bit line of memory structure 202 may have a corresponding electrical path in electrical paths 293, including a pair of bond pads, which connects to column control circuitry 210. Similarly, row control circuitry 220, including row decoder 222, row drivers 224, block select 226, and sense amplifiers 228 are coupled to memory structure 202 through electrical paths 294. Each of electrical path 294 may correspond to, for example, a word line. Additional electrical paths may also be provided between control die 290 and memory structure die 280.

In the following discussion, the memory structure 202 of FIGS. 2A and 2B will be discussed in the context of a cross-point architecture. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using memory cells having an MTJ in series with a threshold switching selector such as Ovonic Threshold Switch (OTS) to comprise a selectable memory bit. However, embodiments are not limited to a cross-point architecture having memory cells each with an MTJ in series with an OTS selector.

Figure 3:
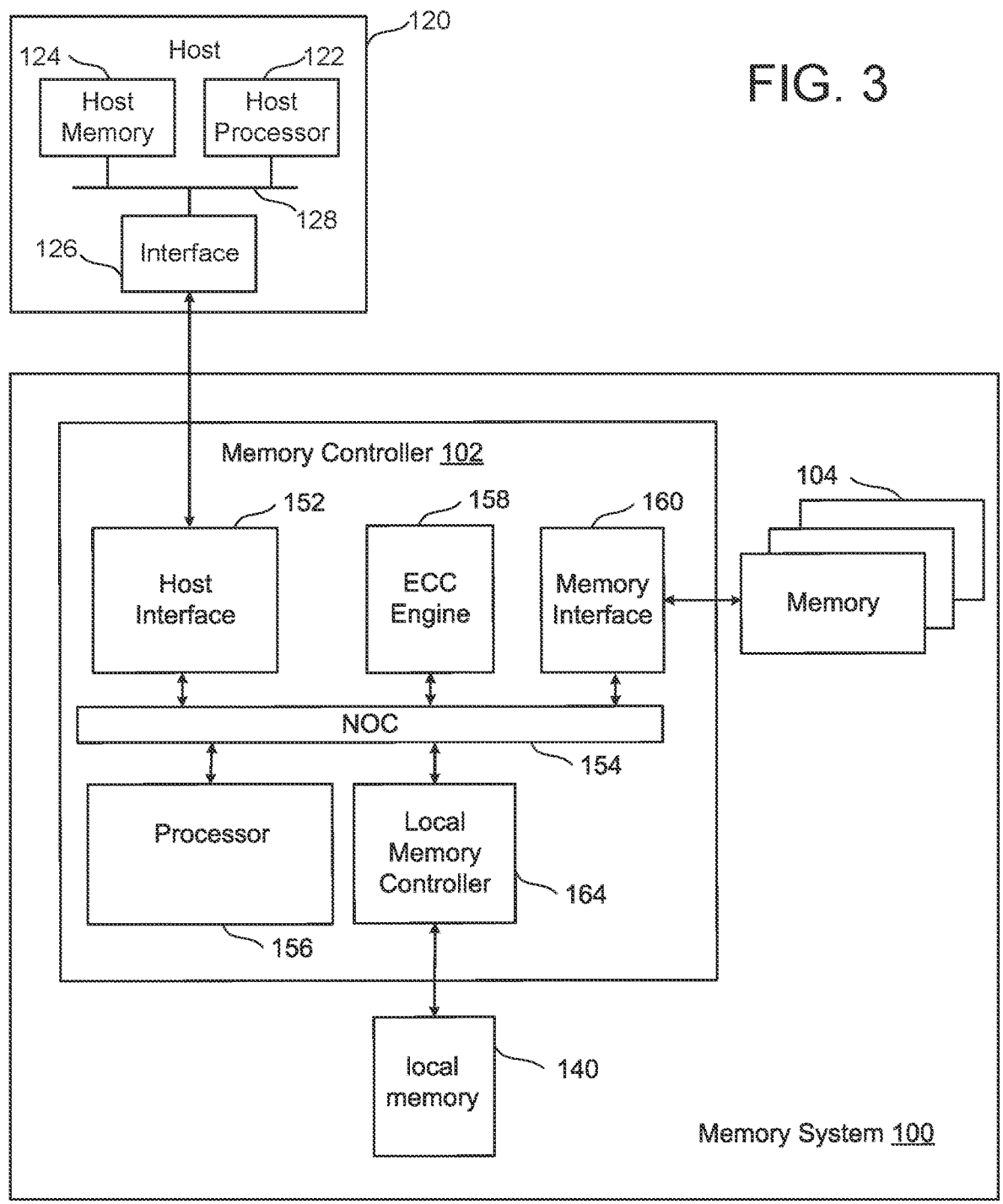
FIG. 3 is a block diagram of one embodiment of a non-volatile memory system connected to a host.

Technology for refresh in a cross-point memory array can be used in many different types of memory and memory systems. FIG. 3 is a block diagram of one embodiment of a non-volatile memory system (or more briefly "memory system") 100 connected to a host system 120. Memory system 100 of FIG. 3, as well as host 120, can implement the technology presented herein for refresh in a cross-point array. The memory die 292 and/or the control die 290 may be used in any of local memory 140, memory 104 and/or host memory 124. In an embodiment, the memory cells have a programmable resistance memory element (e.g., MTJ element) in series with a threshold switching selector such as an OTS. Many different types of memory systems can be used with the technology proposed herein. Example memory systems include dual in-line memory modules (DIMMs), solid state drives ("SSDs"), memory cards and embedded memory devices; however, other types of memory systems can also be used.

Memory system 100 of FIG. 3 comprises a memory controller 102, memory 104 for storing data, and local memory 140 (e.g., MRAM, ReRAM, DRAM). The local memory 140 may be non-volatile and retain data after power off. Alternatively, local memory 140 may be volatile or non-volatile and not be expected to retain data after power off by reloading it from data after power-up. In some embodiments, local memory 140 is DRAM or a DRAM replacement. In some embodiments, the local memory 140 is MRAM; however, it is not necessarily required to retain data after power-off. In some embodiments, the MRAM in local memory will retain data after power-off. In one embodiment, memory controller 102 and/or local memory controller 164 provides access to programmable resistance memory cells in a cross-point array in local memory 140. For example, memory controller 102 may provide for access in a cross-point array of MRAM cells in local memory 140. In another embodiment the memory controller 102 or interface 126 or both are eliminated and the memory packages 104 are connected directly to the host 120 through a bus such as DDRn. Or they are connected to a Host memory management unit (MMU). In another instance, the memory controller 102 or portions are moved onto the Memory 104 for direct connection of the Memory 104 to the Host, such as by providing parity bits, ECC, and wear level on the Memory along with an DDRn interface to/from the Host or MMU. The term memory system, as used throughout this document, is not limited to memory system 100. For example, the local memory 140 or the combination of local memory 140 and local memory controller 164 could be considered to be a memory system. Likewise, host memory 124 or the combination of host processor 122 and host memory 124 considered to be a memory system.

The components of memory system 100 depicted in FIG. 3 are electrical circuits. The memory controller 102 has host interface 152, processor 156, ECC engine 158, memory interface 160, and local memory controller 164. The host interface 152 is connected to and in communication with host 120. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., MRAM). In other embodiments, local high speed memory 140 can be DRAM, SRAM or another type of volatile memory.

ECC engine 158 performs error correction services. For example, ECC engine 158 performs data encoding and decoding for error correction of the data fetched from memory 140 or 104. In one embodiment, ECC engine 158 is an electrical circuit programmed by software. For example, ECC engine 158 can be a processor that can be programmed. In other embodiments, ECC engine 158 is a custom and dedicated hardware circuit without any software. In one embodiment, the function of ECC engine 158 is implemented by processor 156. In one embodiment, local memory 140 has an ECC engine with or without a wear level engine. In one embodiment, memory 104 has an ECC engine with or without a wear level engine.

Processor 156 performs the various controller memory operations, such as programming, erasing, reading, and memory management processes including wear level. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 102 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory 104 and a subset of the L2P tables are cached (L2P cache) in the local high speed memory 140.

Memory interface 160 communicates with non-volatile memory 104. In an embodiment, non-volatile memory 104 contains programmable resistance memory cells in a cross-point array. Each programmable resistance memory cell has a programmable resistance memory element in series with a threshold switching selector. In some embodiments, the threshold switching selector is refreshed as described herein.

In one embodiment, memory interface provides a Toggle Mode interface. Other interfaces can also be used. In some example implementations, memory interface 160 (or another portion of controller 102) implements a scheduler and buffer for transmitting data to and receiving data from one or more memory die.

In one embodiment, memory 104 comprises a plurality of memory packages. Each memory package includes one or more memory die. Therefore, memory controller 102 is connected to one or more memory die. In one embodiment, the memory package can include types of memory, such as storage class memory (SCM) based on programmable resistance random access memory (such as ReRAM, MRAM, FeRAM or RRAM) or a phase change memory (PCM). In one embodiment, memory controller 102 provides access to memory cells in a cross-point array in a memory package 104.

Memory controller 102 communicates with host system 120 via an interface 152 that implements a protocol such as, for example, Compute Express Link (CXL). Or such controller can be eliminated and the memory packages can be placed directly on the host bus, DDRn for example. For working with memory system 100, host system 120 includes a host processor 122, host memory 124, and interface 126 connected along bus 128. Host memory 124 is the host's physical memory, and can be DRAM, SRAM, ReRAM, MRAM, non-volatile memory, or another type of storage. In an embodiment, host memory 124 contains a cross-point array of programmable resistance memory cells, with each memory cell comprising a programmable resistance memory element and a two terminal threshold selector element in series with the memory element. In some embodiments, the threshold switching selector is refreshed as described herein.

Host system 120 is external to and separate from memory system 100. In one embodiment, memory system 100 is embedded in host system 120. Host memory 124 may be referred to herein as a memory system. The combination of the host processor 122 and host memory 124 may be referred to herein as a memory system. In an embodiment, such host memory can be cross-point memory using MRAM.

For purposes of this document, the phrase "a control circuit" can include one or more of memory controller 102, system control logic 260, column control circuitry 210, row control circuitry 220, a micro-controller, a state machine, host processor 122, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver.

For purposes of this document, the term "apparatus" can include, but is not limited to, one or more of host system 120, the combination of host processor 122 and host memory 124, host memory 124, memory system 100, memory controller 102, local memory 140, the combination of local memory controller 164 and/or memory controller 102 and local memory 140, memory package 104, memory die 292, integrated memory assembly 270, and/or control die 290.

Figure 4A:
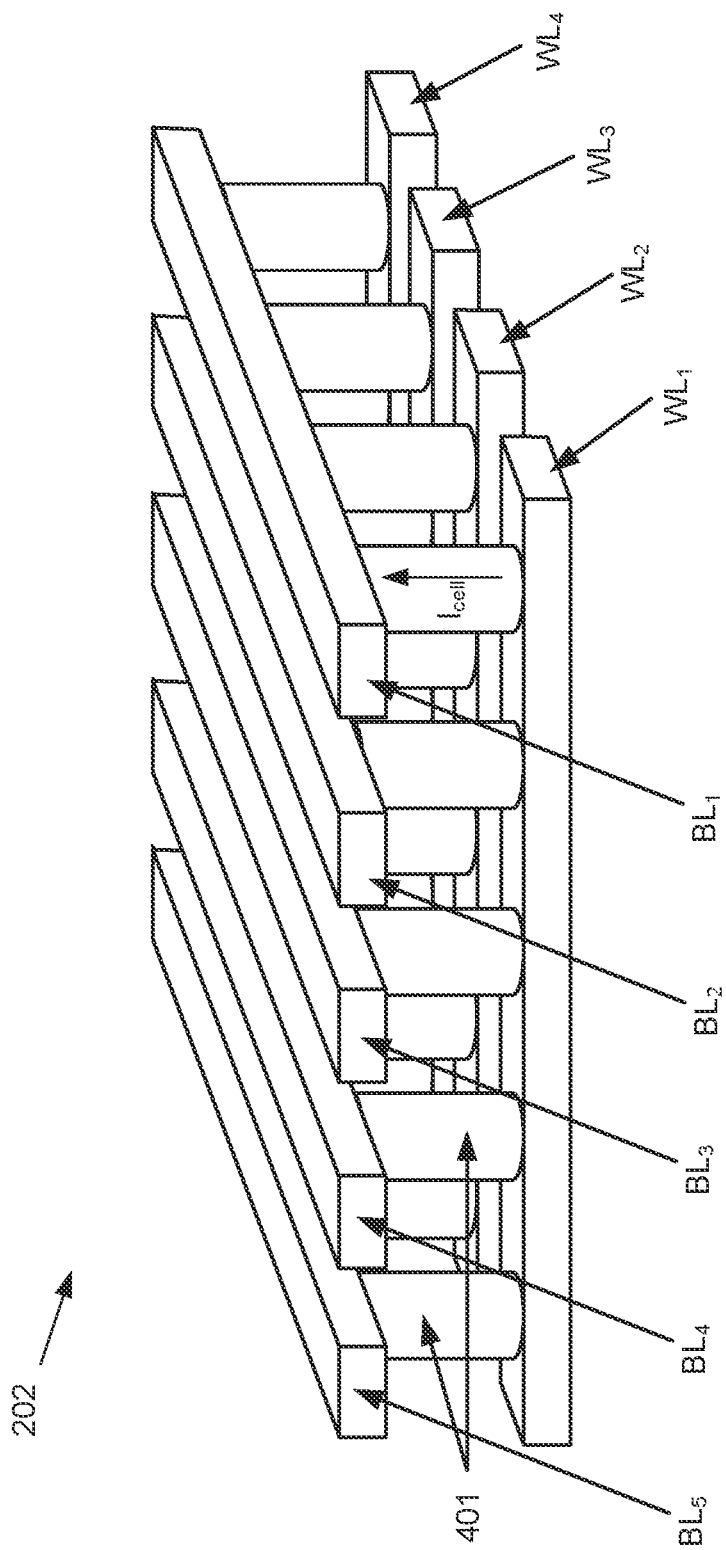
FIG. 4A depicts one embodiment of a portion of a memory array that forms a cross-point architecture in an oblique view.

FIG. 4A depicts one embodiment of a portion of a memory array that forms a cross-point architecture in an oblique view. Memory structure 202 of FIG. 4A is one example of an implementation for memory structure 202 in FIG. 2A or 2B, where a memory die 292 or memory structure die 280 can include multiple such array structures. The memory structure 202 may be included in local memory 140 or host memory 124. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 4A is an example of a horizontal cross-point structure in which word lines $WL_1$-$WL_5$ and $BL_1$-$BL_5$ both run in a horizontal direction relative to the substrate, while the memory cells, two of which are indicated at 401, are oriented so that the current through a memory cell (such as shown at $I_{cell}$) runs in the vertical direction. In a memory array with additional layers of memory cells, such as discussed below with respect to FIG. 4D, there would be corresponding additional layers of bit lines and word lines.

As depicted in FIG. 4A, memory structure 202 includes a plurality of memory cells 401. The memory cells 401 may include re-writeable memory elements, such as can be implemented using ReRAM, MRAM, PCM, or other material with a programmable resistance. A memory cell that includes a magnetoresistive memory element (e.g., MTJ) will be simply denoted as an MRAM memory cell. The memory cells 401 may also include selector elements, such as can be implemented using an Ovonic Threshold Switch (OTS), Volatile Conductive Bridge (VCB), Metal-Insulator-Metal (MIM), or other material that provides a highly non-linear dependence of current on select voltage. The following discussion will focus on memory cells composed of a magnetoresistive memory element combined in series with an Ovonic Threshold switch, although much of the discussion can be applied more generally. The current in the memory cells of the first memory level is shown as flowing upward as indicated by arrow $I_{cell}$, but current can flow in either direction, as is discussed in more detail in the following.

Figure 4B:
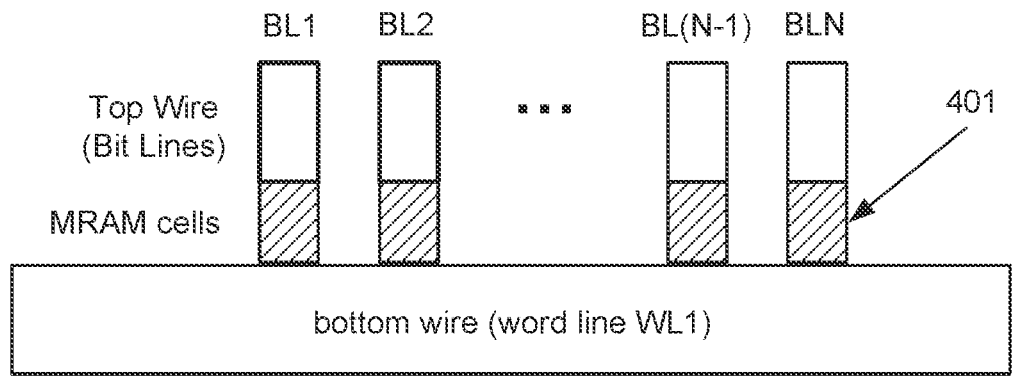
FIGS. 4B and 4C respectively present side and top views of the cross-point structure in FIG. 4A.
Figure 4C:
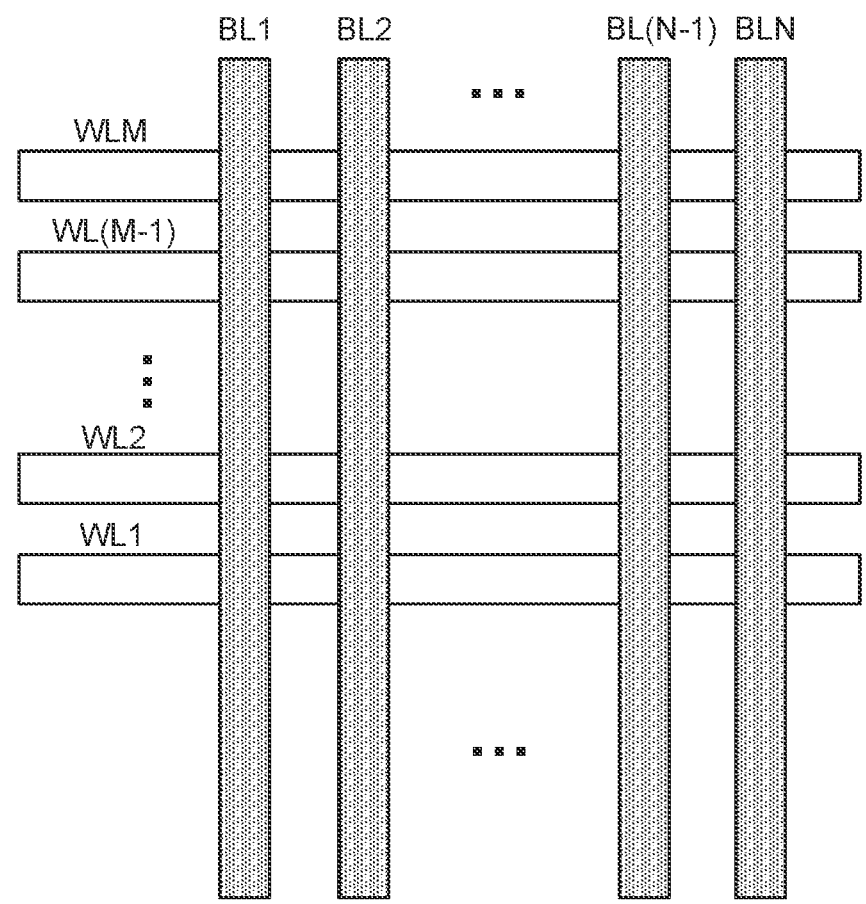

FIGS. 4B and 4C respectively present side and top views of the cross-point structure in FIG. 4A. The sideview of FIG. 4B shows one bottom wire, or word line, $WL_1$ and the top wires, or bit lines, $BL_1$-$BL_n$. At the cross-point between each top wire and bottom wire is an MRAM memory cell 401, although PCM, ReRAM, FeRAM, or other technologies can be used as the memory element. FIG. 4C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their reading are given below. In some embodiments, sets of these wires are arrayed continuously as a "tile," and such tiles may be paired adjacently in the Word Line (WL) direction and orthogonally in the Bit Line direction to create a module. Such a module may be composed of 2×2 tiles to form a four tile combination wherein the WL drivers between the tiles is "center driven" between the tiles with the WL running continuously over the driver at the approximate center of the line. Similarly, BL drivers may be located between the pair of tiles paired in the BL direction to be center driven, whereby the driver and its area is shared between a pair of tiles.

The cross-point array of FIG. 4A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A two-layer example is illustrated in FIG. 4D.

Figure 4D:
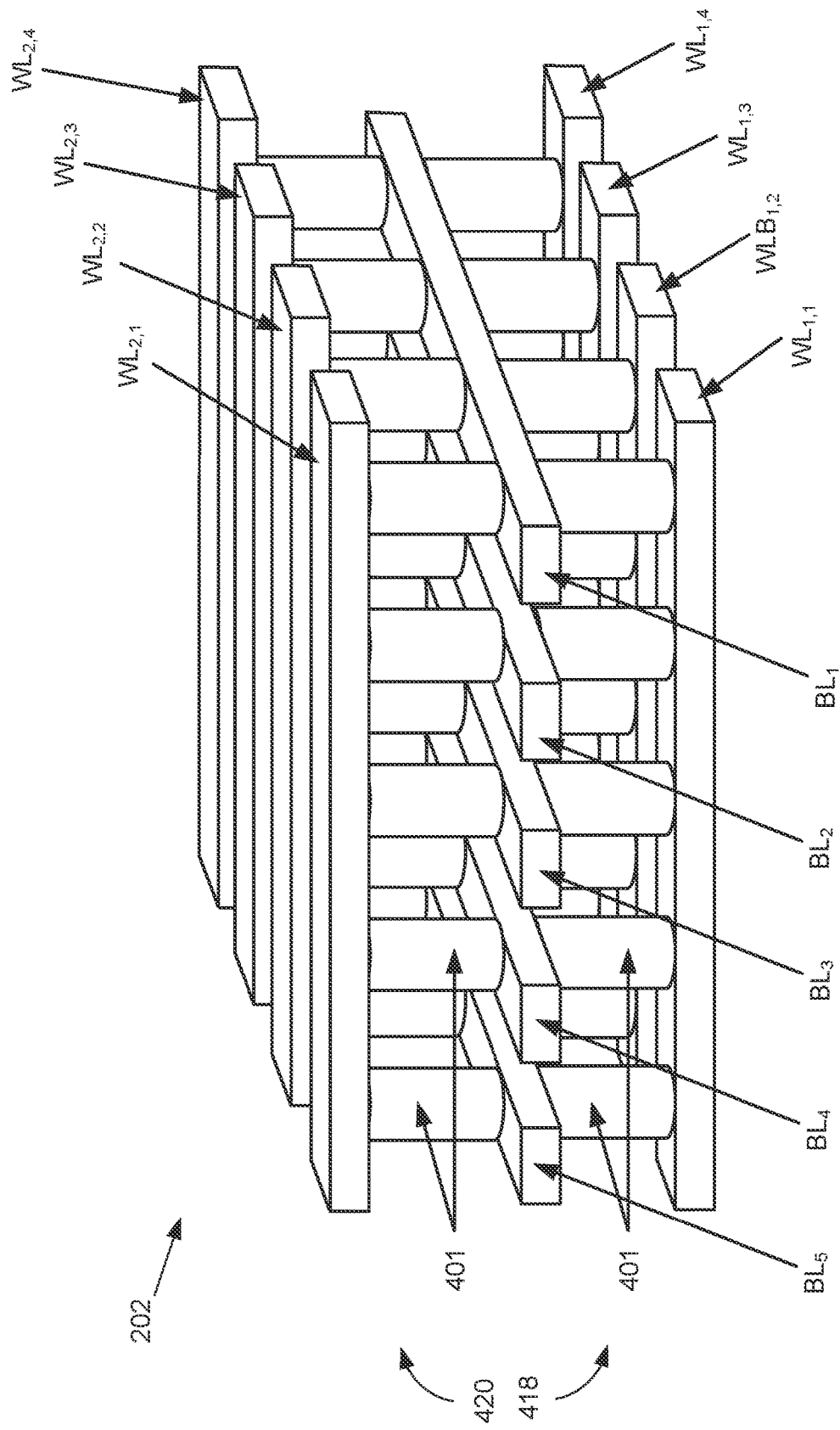
FIG. 4D depicts an embodiment of a portion of a two-level memory array that forms a cross-point architecture in an oblique view.

FIG. 4D depicts an embodiment of a portion of a two-level memory array that forms a cross-point architecture in an oblique view. As in FIG. 4A, FIG. 4D shows a first layer 418 of memory cells 401 of a structure 202 connected at the cross-points of the first layer of word lines $WL_{1,1}$-$WL_{1,4}$ and bit lines $BL_1$-$BL_5$. A second layer of memory cells 420 is formed above the bit lines $BL_1$-$BL_5$ and between these bit lines and a second set of word lines $WL_{2,1}$-$WL_{2,4}$. Although FIG. 4D shows two layers, 418 and 420, of memory cells, the structure can be extended upward through additional alternating layers of word lines and bit lines. Depending on the embodiment, the word lines and bit lines of the array of FIG. 4D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 292 of FIG. 2A, the local memory 140 in FIG. 3, and/or the host memory 124 in FIG. 3. Resistive type memory cells can be formed according to many of the technologies mentioned above, such as ReRAM, PCM, FeRAM, or MRAM. The following discussion is presented mainly in the context of memory arrays using a cross-point architecture with binary valued MRAM memory cells, although much of the discussion is more generally applicable.

Whether to read or write selected memory cells in the array structures of FIGS. 4A-4D, the bit line and word line corresponding a selected memory cell is biased to place a voltage across the selected memory cell, or a current through, and induce the flow of electrons as illustrated with respect to FIG. 7A or 7B (to be discussed below). Note that herein, a "selected memory cell" means that the memory cell is selected for access (e.g., read access, write access). An "unselected memory cell" means that the memory cell is not selected for access by, for example, placing either its WL or BL or both at a voltage approximately midway between the maximum positive and minimum negative voltages across the memory cell. The write current needed to change the MTJ from the low resistance state (LRS) to the high resistance state (HRS) could be about the same as the write current needed to change the MTJ from the HRS to the LRS. However, there could be a significant difference in the magnitude of the write current needed to change from the LRS to the HRS than the magnitude of the write current needed to change from the HRS to the LRS. For example, the difference in write current could be 20% or more. The magnitude of the write currents needed to change the resistance state of the MTJ may depend on the fabrication process.

Some biasing techniques may result in voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array. One approach to address this unwanted current leakage is to place a selector element in series with each MRAM or other resistive (e.g., ReRAM, PCM) memory cell. For example, a select transistor can be placed in series with each resistive memory cell element in FIGS. 4A-4D so that the memory cells 401 is now a composite of a select transistor and a programmable resistance. Use of a select transistor, however, requires the introduction of additional control lines and cell area to be able to turn on the corresponding transistor of a selected memory cell. Additionally, transistors will often not scale in the same manner as the resistive memory element write current, so that as memory arrays are scaled to smaller sizes, the use of transistor based selectors can be a limiting factor in reducing cost, for example. An alternate approach to select transistors is the use of a two terminal threshold switching selector in series with the programmable resistive element. A two terminal threshold switching selector does not require the aforementioned additional control lines and cell area to be able to turn on the corresponding select transistor of a selected memory cell. Moreover, and contrary to high performance transistors, two terminal threshold switching selectors are usually glasses and do not require a textured crystalline template to grow, and can therefore be used to form three-dimensional memory arrays obtained by stacking multiple layers of memory elements.

Figure 5A:
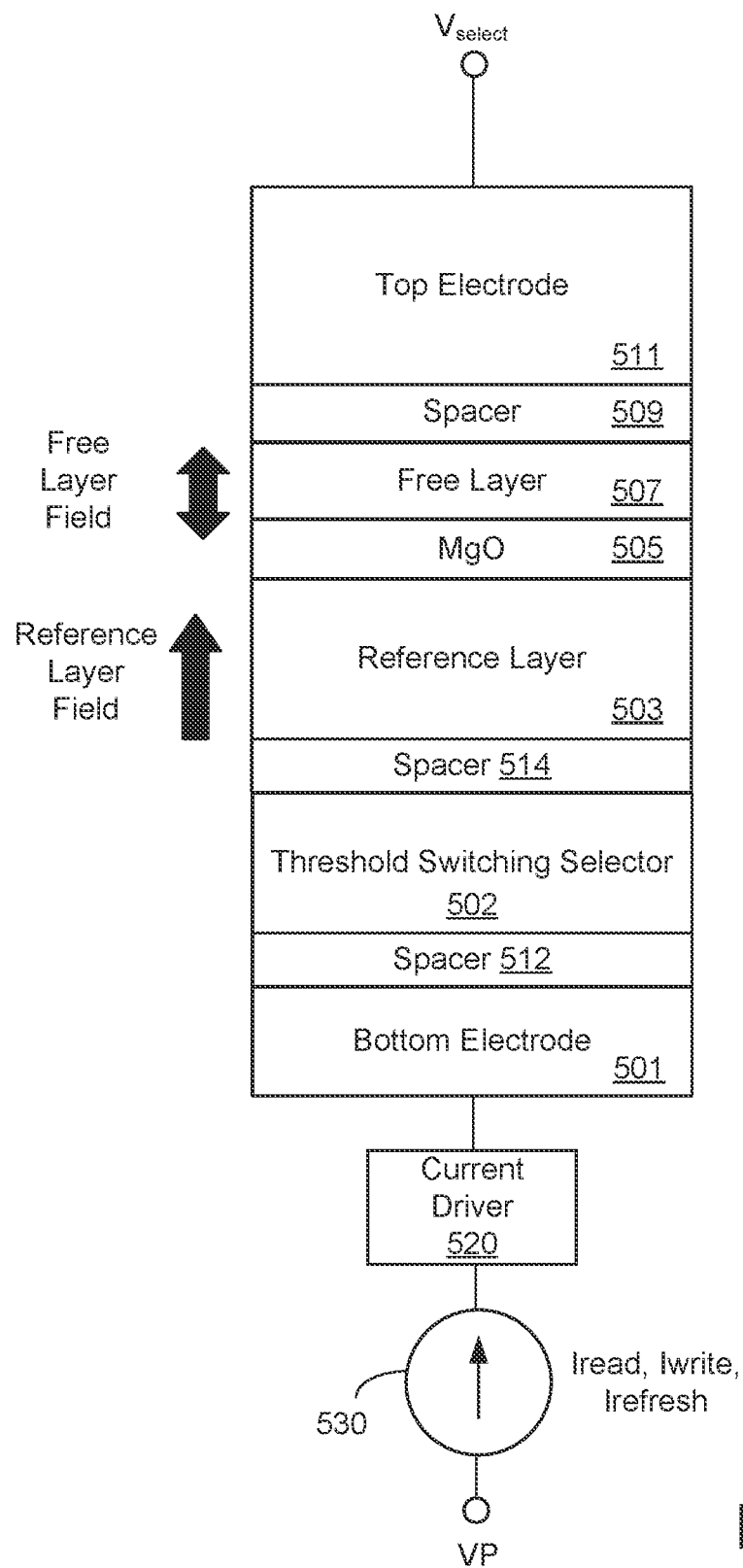
FIG. 5A illustrates an embodiment for the structure of an MRAM memory cell, here for example the selected cell is driven by a current source to read or write or refresh.

FIG. 5A illustrates an embodiment for the structure of an MRAM cell, as well as associated driver circuitry. FIG. 5A depicts an embodiment, in which the MRAM cell is read, written, and refreshed using a current-force approach. The MRAM cell includes a bottom electrode 501, spacer 512, a threshold switching selector 502, spacer 514, a pair of magnetic layers (reference layer 503 and free layer 507) separated by a separation or tunneling layer of, in this example, magnesium oxide (MgO) 505, and then a top electrode 511 separated from the free layer 507 by a spacer 509. The spacer 509 can consist of an MgO capping layer in contact with the free layer 507. The spacer 509 can also contain additional metal layers. In another embodiment, the locations of the reference layer 503 and free layer 507 are switched, with the reference layer 503 on top of MgO 505, and the free layer 507 below MgO 505. In another embodiment, the location of the threshold switching selector 502 is between the free layer 507 and the top electrode 511.

The bottom electrode 501 of the MRAM cell connected to a current driver 520. The current driver 520 is connected to a current source 530, which is capable of providing a read current (Iread), a write current (Iwrite), or a refresh current (Irefresh). In some embodiments, Iread has the same magnitude as Irefresh. Thus, the current driver 520, when selected, will drive the read current, the write current or the refresh current to the bottom electrode 501. The current may flow in either direction, depending on the technique being used. Throughout this document, the current driver 520 will be described as driving a current from the current source 530 to the conductive line (e.g., electrode) regardless of the direction of the current.

In some embodiments, the bottom electrode 501 is referred to as a word line and the top electrode 511 is referred to as a bit line. In other embodiments, the bottom electrode 501 is referred to as a bit line and the top electrode 511 is referred to as a word line. The state of the memory cell is based on the relative orientation of the magnetizations of the reference layer 503 and the free layer 507: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 503 is fixed and, in the example of FIG. 5, is oriented upward. Reference layer 503 is also known as a fixed layer or pinned layer. The reference layer 503 can be composed of multiple ferromagnetic layers coupled anti-ferromagnetically in a structure commonly referred to a synthetic anti-ferromagnet or SAF for short.

Data is written to an MRAM memory cell by programming the free layer 507 to either have the same orientation or opposite orientation as the reference layer 503. An array of MRAM memory cells may be placed in an initial, or erased, state by setting all of the MRAM memory cells to be in the low resistance state in which all of their free layers have a magnetic field orientation that is the same as their reference layers. Each of the memory cells is then selectively programmed (also referred to as "written") by placing its free layer 507 to be in the high resistance state by reversing the magnetic field to be opposite that of the reference layer 503. The reference layer 503 is formed so that it will maintain its orientation when programming the free layer 507. The reference layer 503 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

The threshold switching selector 502 has a high resistance (in an off or non-conductive state) until it is biased to a voltage higher than its threshold voltage or current above its threshold current, and until its voltage bias falls below Vhold ("Voffset") or current below Ihold. After Vt is exceeded and while Vhold is exceeded across the switching selector, the switching selector has a low resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. Accordingly, to program a memory cell at a cross-point, a voltage is applied which is sufficient to turn on the associated threshold switching selector and set or reset the memory cell; and to read a memory cell, the threshold switching selector similarly is activated by being turned on before the resistance state of the memory cell can be determined. One set of examples for a threshold switching selector is an ovonic threshold switching material of an Ovonic Threshold Switch (OTS). Example threshold switching materials include Ge—Se, Ge—Se—N, Ge—Se—As, Ge—Se—Sb—N, Ge58Se42, GeTe$_6$, Si—Te, Zn—Te, C—Te, B—Te, Ge—As—Te—Si—N, Ge—As—Se—Te—Si and Ge—Se—As—Te, with atomic percentages ranging from a few percent to more than 90 percent for each element. In an embodiment, the threshold switching selector is a two terminal device. The threshold switching selector 502 can also contain additional conducting layers on the interface with the reference layer 503. For example, spacer 514 is depicted between switching selector 502 and reference layer 503. The spacer layer 514 on the interface with reference layer 503 can be a single conducting layer or composed of multiple conducting layers. The threshold switching selector 502 can also contain additional conducting layers on the interface with the bottom electrode 501. For example, spacer 512 is depicted between switching selector 502 and reference layer 503. The spacer layer 512 on the interface with bottom electrode 501 can be a single conducting layer or composed of multiple conducting layers. Examples of conducting layers adjacent to the OTS include carbon, carbon nitride, carbon silicide, carbon tungsten, titanium, titanium nitride, tungsten, tungsten nitride, tantalum, tantalum nitride, and others. Threshold voltage switches have a Threshold Voltage (Vt) above which the resistance of the device changes substantially from insulating, or quasi insulating, to conducting.

In the embodiment of FIG. 5A, a current-force approach is used to access the MRAM cell. The current-force approach may be used to read or write the MRAM cell, as well as to refresh the threshold switching selector 502. In the current-force approach, an access current (e.g., $I_{read}$, $I_{write}$, $I_{refresh}$) is driven through the electrode 501 by a current driver 520. The current will be provided by a current source 530. The current driver 520 is a part of the row driver circuitry (e.g., array drivers 224) for the electrode 501. However, alternatively the current driver 520 may a part of the column driver circuitry (e.g., driver circuitry 214) for the electrode 501. A voltage (e.g., $V_{select}$) is provided to the electrode 511. In an embodiment, $V_{select}$ is provided by a voltage driver (not depicted in FIG. 5A). While the threshold switching selector 502 is on, the access current is driven through a portion of a first conductive line (e.g., word line), through a selected memory cell, and through a portion of a second conductive line (e.g., bit line). Herein, the terms "read current" ($I_{read}$) and "write current" ($I_{write}$) will be used in connection with access currents that are driven through MRAM cells (or other programmable resistance cells). The write current may change the state of the MRAM cell. As an example, a write current of about 30 uA during 50 ns may be used for an MRAM cell with a Critical Dimension (CD) of approximately 20 nanometers with RA10 $\Omega\mu m^2$ to switch the MTJ state from the P-state to the AP-state. Read currents may be about half the write current if applied for a limited time, such as <20 ns. A write current that flows in one direction through the MRAM cell will change an AP-state MRAM cell from the AP-state to the P-state. A write current that flows in the other direction through the MRAM cell will change a P-state MRAM cell from the P-state to the AP-state. In general, a read current will preferably be set low enough and the read duration short enough so as not to change the state of an MRAM cell from the P-state to the AP-state or from the AP-state to the P-state during read. Typically the write current required to switch the MTJ state from the P-state to the AP-state is larger in absolute magnitude than the write current required to switch the MTJ state from the AP-state to the P-state. In some embodiments, the refresh current has about the same magnitude as the read current.

As discussed more fully below in connection with FIG. 7B, in some embodiments, a read current may be applied in a P2AP direction or, alternatively, in an AP2P direction. In some embodiments, the MRAM cell is read by performing an SRR (self-referenced-read). The SRR operation can include two read operations and one or two write operations that allow direct comparison of the initial bit state resistance to the bit's resistance in a known programmed state, followed by a recovery of the initial bit state by re-writing if it was different from the initial state after first write; however, if the read operation is followed by a separate write command to the bit after SRR read, the original bit state need not be recovered prior to the execution of the write. In one embodiment, an SRR has a first read (Read1 in the P2AP direction), a first write (Write 1 to the AP-state), and a second read (Read2 in the P2AP direction), followed by optional second write (Write 2 to the P-state for bits initially in the P-state). The voltage level of the memory cell due to Read1 in the P2AP direction is stored, for example on a capacitor; or by conversion to digital bits by an Analog to Digital converter and the bits stored in memory, for example in SRAM until after use in Read2. The state stored on a capacitor can be adjusted, for example, 150 mV positive or negative by forcing a voltage on one terminal of a capacitor connected to the storage capacitor. Or the digital stored level can be adjusted by digitally adding or subtracting, for example, 150 mV to the stored bits. The 150 mV can be adjusted to be more or less dependent on the typical bit resistance. For example, if the bit low resistance state is 25 kilo-ohms (kΩ) and the high resistance 50 kΩ, the difference is 25 kΩ. If the read current is 15 micro-amperes (μA), the voltage difference between the states if 25 kΩ×15 μA=375 mV, making a choice of 150 mV acceptable but perhaps suggesting 187 mV is more optimum, for example.

Next the memory cell is written to the AP-state (Write 1). The sensed voltage level due to Read2 in the P2AP direction (after a Write 1) is compared with the voltage level stored and adjusted from Read1, both Read1 and Read2 done in the P2AP direction. An adequate change in the voltage level between Read2 and Read1, for example more than 150 mV, indicates that the MRAM cell was originally in the P-state. If the change in voltage is less than 150 mV, the MRAM cell was originally in the AP state (to which write was directing the bit state). An optional Write 2 of the bit AP2P is performed if the bit was originally in the P state and switched to the AP state by Write 1. Alternatively, the SRR has a first read (Read1 in the AP2P direction), a first (Write 1 to the P-state, and a second read (Read2 in the AP2P direction). The voltage level of the memory cell due to Read1 in the AP2P direction is stored and adjusted by, for example −150 mV. Next the memory cell is written to the P-state (Write 1). The voltage level due to Read2 in the AP2P direction is compared with the adjusted voltage level due to Read1 in the AP2P direction. An adequate change in the voltage level indicates that the MRAM cell was originally in the AP-state. An optional Write 2 is performed if the bit was originally in the AP state and switched to the P state by Write 1. In some embodiments, the same polarity is used for Read1, Write1, and Read2, which avoids switching the selector off between Read1 and Read2. In some embodiments Write 2 is delayed and performed only after other operations are performed. In some embodiments the Write 1 is performed by extending the duration of the read current applied during Read 1.

In one embodiment, the MRAM cell is read by applying, for example, 0V to the electrode 511, while driving a current of, for example, 15 μA through the electrode 501. This read current will flow from the electrode 501 to the electrode 511. Note that the read may be Read1 or Read2 in the P2AP direction. P2AP means current flows in the direction that would write the bit from P to AP or AP to AP. In some embodiments, data is written to the MRAM cell using a bipolar write operation. In one embodiment, the MRAM cell is written from the AP-state to the P-state by applying, for example, 3V to the electrode 511, while driving a write current of, for example, −30 μA through the electrode 501. This write current will flow from the top electrode 511 to the bottom electrode 501. In one embodiment, the MRAM cell is written from the P-state to the AP-state by applying, for example, 0V to the top electrode 511, while driving a current of, for example, 30 μA through the bottom electrode 501. This write current will flow from electrode 501 to the electrode 511.

As an alternative to the approach in FIG. 5A, the select voltage can be applied to the electrode 501, with the access current applied through the electrode 511. In one such embodiment, the MRAM cell is read by applying, for example, 3V to the bottom electrode 501, while driving a read current of, for example, −15 μA through the top electrode 511. This read current will flow from the bottom electrode 501 to the top electrode 511.

In one embodiment, the MRAM cell is written from the AP-state to the P-state by applying, for example, −3V to the bottom electrode 501, while driving a write current of, for example, 30 μA through the top electrode 511. The electron current will flow from the bottom electrode 501 to the top electrode 511. In one embodiment, the MRAM cell is written from the P-state to the AP-state by applying, for example, 0V to the bottom electrode 501, while driving a current of, for example, −30 μA through the top electrode 511. The electron current will flow from the top electrode 511 to the bottom electrode 501. The duration that the read current is applied can be substantially different from the duration that the write current is applied. For example, the read current can be applied for 20 ns, while the write current can be applied for 50 ns, before the current through the cell is reduced to zero or an amount that has a negligible chance of disturbing the cell for the duration it will be applied. The durations of the write and read current can also be the same or substantially similar, such as 20 ns, for example. The write time can be reduced by increasing the write current. Each Read can be performed at considerably lower applied current than Write, such as 10 μA and 40 μA, respectively. Reducing the read current reduces read signal difference at the sense amp (Read current×Higher Resistance−Read Current×Low Resistance). In this discussion it is also understood that the direction of the current polarity to switch the magnetization of the bit into the P or AP state can vary based on reference layer design and the location of the reference layer with respect the free layer.

Figure 5B:
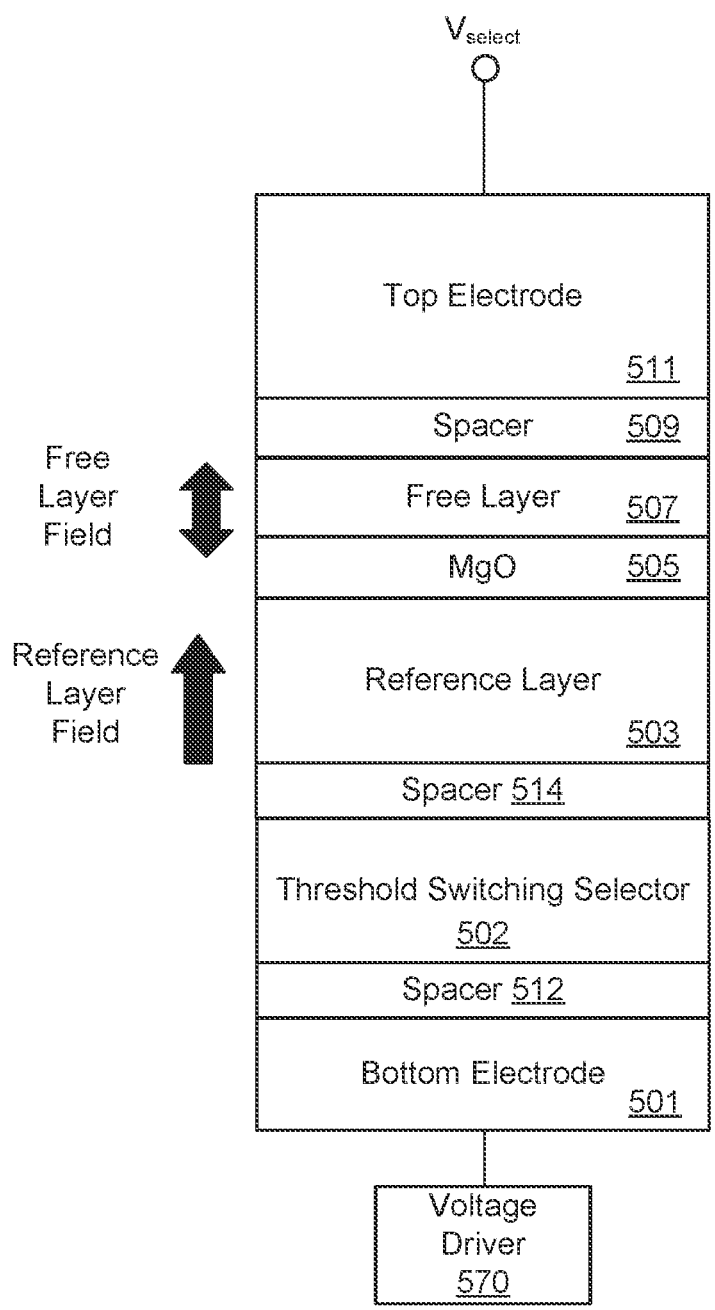
FIG. 5B illustrates an embodiment for the structure of an MRAM memory cell, here for example the selected cell is driven by a voltage source to read or write or refresh.

FIG. 5B illustrates an embodiment for the structure of an MRAM cell, as well as associated driver circuitry. FIG. 5B depicts an embodiment, in which the MRAM cell is read, written, and refreshed using a voltage-force approach. Voltage driver 570 provides a voltage to the bottom electrode 501. The voltage $V_{select}$ is provided to the top electrode by a voltage driver (not depicted in FIG. 5B).

Figure 6:
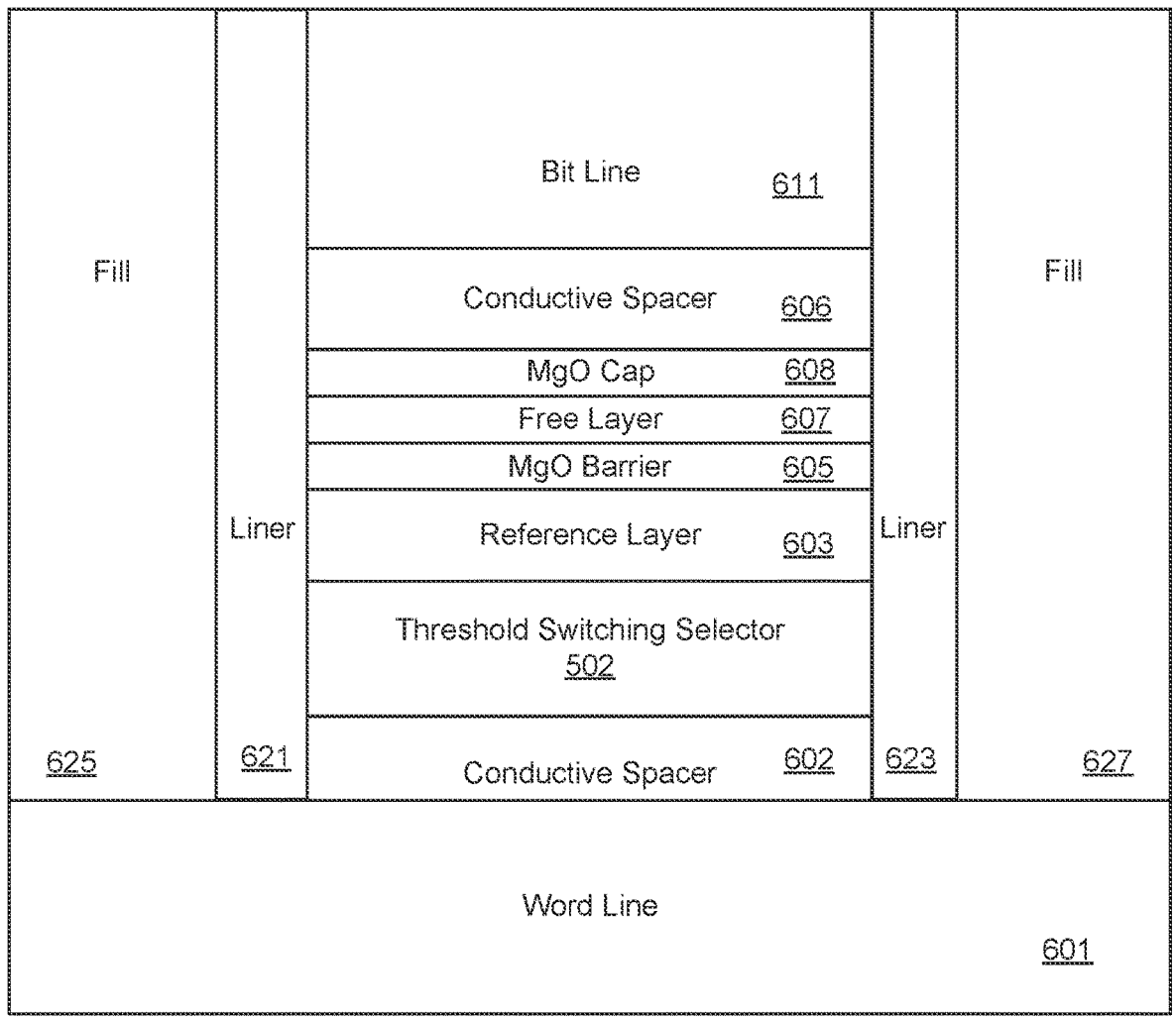
FIG. 6 illustrates an embodiment for an MRAM memory cell design as it would be implemented in a cross-point array in more detail.

FIG. 6 illustrates an embodiment for an MRAM memory cell design as it may be implemented in a cross-point array in more detail. When placed in a cross-point array, the top and bottom electrodes of the MRAM memory cells will be the top and bottom wires of the array. In the embodiment shown here, the bottom electrode is the word line 601 and the top electrode is the bit line 611 of the memory cell, but these can be reversed in other embodiments. Between the word line 601 and bit line 611 are the reference layer 603 and free layer 607, which are again separated MgO barrier 605. In the embodiment shown in FIG. 6, an MgO cap 608 is also formed on top of the free layer 607 and a conductive spacer 606 is formed between the bit line 611 and the MgO cap 608. The reference layer 603 is separated from the word line 601 by another conductive spacer 602. A threshold switching selector 502 may reside between the reference layer 603 and the conductive spacer 602. On either side of the memory cell structure is a liner 621 and 623, where these can be part of the same structure, but appear separate in the cross-section of FIG. 6. To either side of the liner 621, 623 is shown some of fill material 625, 627 used to fill in the otherwise empty regions of the cross-point structure.

With respect to the free layer design 607, embodiments include CoFe or CoFeB Alloy with a thickness on the order ~1-2 nm, where an Ir layer can be interspersed in the free layer close to MgO barrier 605 and the free layer 607 can be doped or interspersed with Ta, W, or Mo. Embodiments for the reference layer 603 can include a bilayer of CoFeB and Co/Pt multilayer coupled with an Ir or Ru spacer, or a combination or alloy of both 602. The MgO cap 608 is optional but can be used to increase anisotropy and reduce the critical switching current of free layer 607. The conductive spacers can be conductive metals such as Ta, W, Ru, CN, TiN, and TaN, among others. The free-layer can also be a composite free layer composed of multiple free-layers with conductive layers in between, such as W, Ta, W, or tunneling layers in between, such as MgO.

The following discussion will mainly be discussed with respect to a perpendicular spin transfer torque MRAM memory cell, where the free layer 507/607 of FIGS. 5 and 6 comprises a switchable direction of magnetization that is perpendicular to the plane of the free layer. Spin transfer torque ("STT") is an effect in which the orientation of a magnetic layer in a magnetic tunnel junction (MTJ) can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is injected into a second magnetic layer (the free layer), angular momentum can be transferred to this second magnetic layer, changing the direction of magnetization of the second magnetic layer. This is referred to as spin transfer torque. FIGS. 7A and 7B illustrate the use of spin transfer torque to program or write to MRAM memory. Spin transfer torque magnetic random access memory (STT MRAM) has the advantages of lower power consumption and better scalability over other MRAM variations. Compared to other MRAM implementations, such as toggle MRAM, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms electron behavior, FIGS. 7A and 7B and their discussion is given in terms of electron current, where the direction of the write current is defined as the direction of the electron flow. Therefore, the term write current in reference to FIGS. 7A and 7B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 7A and 7B illustrate the writing of an MRAM memory cell by the STT mechanism, depicting a simplified schematic representation of an example of an STT-switching MRAM memory cell 700 in which both the reference and free layer magnetization are in a perpendicular direction. Memory cell 700 includes a magnetic tunnel junction (MTJ) 702 comprising an upper ferromagnetic layer 710, a lower ferromagnetic layer 712, and a tunnel barrier (TB) 714 as an insulating layer between the two ferromagnetic layers. In this example, upper ferromagnetic layer 710 is the free layer FL and the direction of its magnetization can be switched. Lower ferromagnetic layer 712 is the reference (or fixed) layer RL and the direction of its magnetization cannot be switched. When the magnetization in free layer 710 is parallel to the magnetization in reference layer RL 712, the resistance across the memory cell 700 is relatively low.

When the magnetization in free layer FL 710 is anti-parallel to the magnetization in reference layer RL 712, the resistance across memory cell 700 is relatively high. The data ("0" or "1") in memory cell 700 is read by measuring the resistance of the memory cell 700, such as by forcing. In this regard, electrical conductors 706/708 attached to memory cell 700 are utilized to read the MRAM data. By design, both the parallel and antiparallel configurations remain stable in the quiescent state and/or during a read operation (at sufficiently low read current).

For both the reference layer RL 712 and free layer FL 710, the direction of magnetization is in the perpendicular direction (i.e., perpendicular to the plane defined by the free layer and perpendicular to the plane defined by the reference layer). FIGS. 7A and 7B show the direction of magnetization of reference layer RL 712 as up and the direction of magnetization of free layer FL 710 as switchable between up and down, which is perpendicular to the plane.

In one embodiment, tunnel barrier 714 is made of Magnesium Oxide (MgO); however, other materials can also be used. Free layer 710 is a ferromagnetic metal that possess the ability to change/switch its direction of magnetization. Multilayers based on transition metals like Co, Fe and their alloys can be used to form free layer 710. In one embodiment, free layer 710 comprises an alloy of Cobalt, Iron and Boron. Reference layer 712 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron current 750 is applied from conductor 708 to conductor 706, as depicted in FIG. 7A (hence current flows in the opposite direction). To generate the electron current 750, the top conductor 706 is placed at a higher voltage level than bottom conductor 708, due the negative charge of the electron. The electrons in the electron current 750 become spin-polarized as they pass through reference layer 712 because reference layer 712 is a ferromagnetic metal. When the spin-polarized electrons tunnel across the tunnel barrier 714, conservation of angular momentum can result in the imparting of a spin transfer torque on both free layer 710 and reference layer 712, but this torque is inadequate (by design) to affect the magnetization direction of the reference layer 712. Contrastingly, this spin transfer torque is (by design) sufficient to switch the magnetization orientation in the free layer 710 to become parallel (P) to that of the reference layer 712 if the initial magnetization orientation of the free layer 710 was anti-parallel (AP) to the reference layer 712, referred to as an anti-parallel-to-parallel (AP2P) write. The parallel magnetizations will then remain stable before and after such electron current is turned off.

In contrast, if free layer 710 and reference layer 712 magnetizations are initially parallel, the direction of magnetization of free layer 710 can be switched to become antiparallel to the reference layer 712 by application of an electron current of opposite direction to the aforementioned case. For example, electron current 752 is applied from conductor 706 to conductor 708, as depicted in FIG. 7B, by placing the higher voltage level on the lower conductor 708. This will write a free layer 710 in a P state to an AP state, referred to as a parallel-to-anti-parallel (P2AP) write. Thus, by way of the same STT physics, the direction of the magnetization of free layer 710 can be deterministically set into either of two stable orientations by judicious choice of the electron current direction (polarity).

The data ("0" or "1") in memory cell 700 can be read by measuring the resistance of the memory cell 700. Low resistance typically represents a "0" bit and high resistance typically represents a "1" bit, although sometimes the alternate convention occurs. A read current can be applied across the memory cell (e.g., across the MTJ 702) by applying an electron current from conductor 708 to conductor 706, flowing as shown for 750 in FIG. 7A (the "AP2P direction"); alternatively, the electron current can be applied from conductor 706 to conductor 708, flowing as shown for 752 in FIG. 7B (the "P2AP direction"). As is well-understood, the electron current flows in the opposite direction as conventionally defined current. In a read operation, if the electron current is too high, this can disturb data stored in a memory cell and change its state. For example, if electron current Read1 uses the P2AP direction of FIG. 7B, too high of a current or voltage level can switch any memory cells in the low resistance P state into the high resistance AP state before the bit voltage during Read1 is stored. Consequently, although the MRAM memory cell can be read in either direction, the directional nature of the write operation may make one read direction preferable over the other in various embodiments. For example, for a given read current, the error rate may be less doing SRR in the P2AP direction.

Although the discussion of FIGS. 7A and 7B was in the context of electron current for the read and write currents, the subsequent discussion will be in the context of conventional current unless otherwise specified.

Figure 8A:
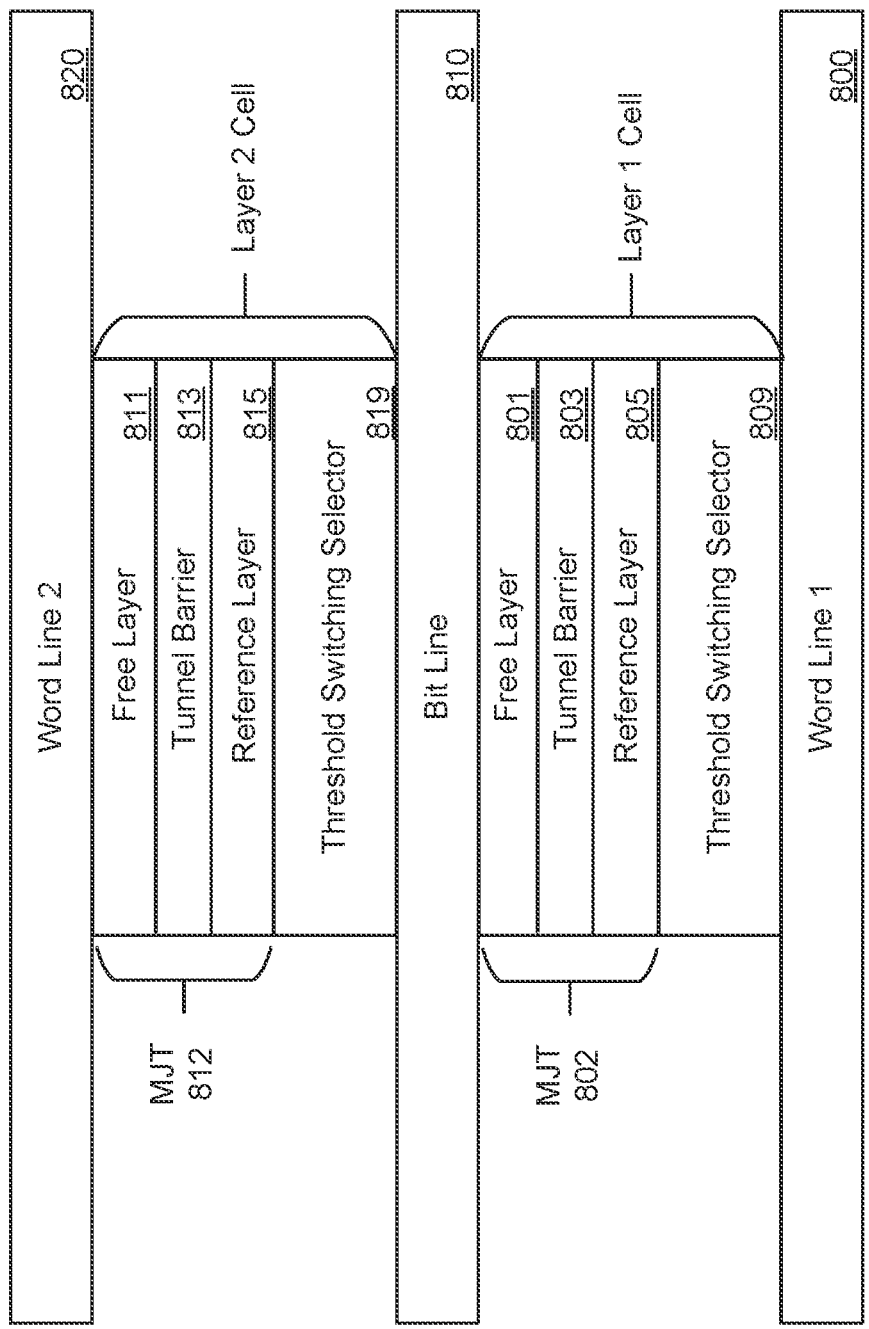
FIGS. 8A and 8B illustrate embodiments for the incorporation of threshold switching selectors into an MRAM memory array having a cross-point architecture.
Figure 8B:
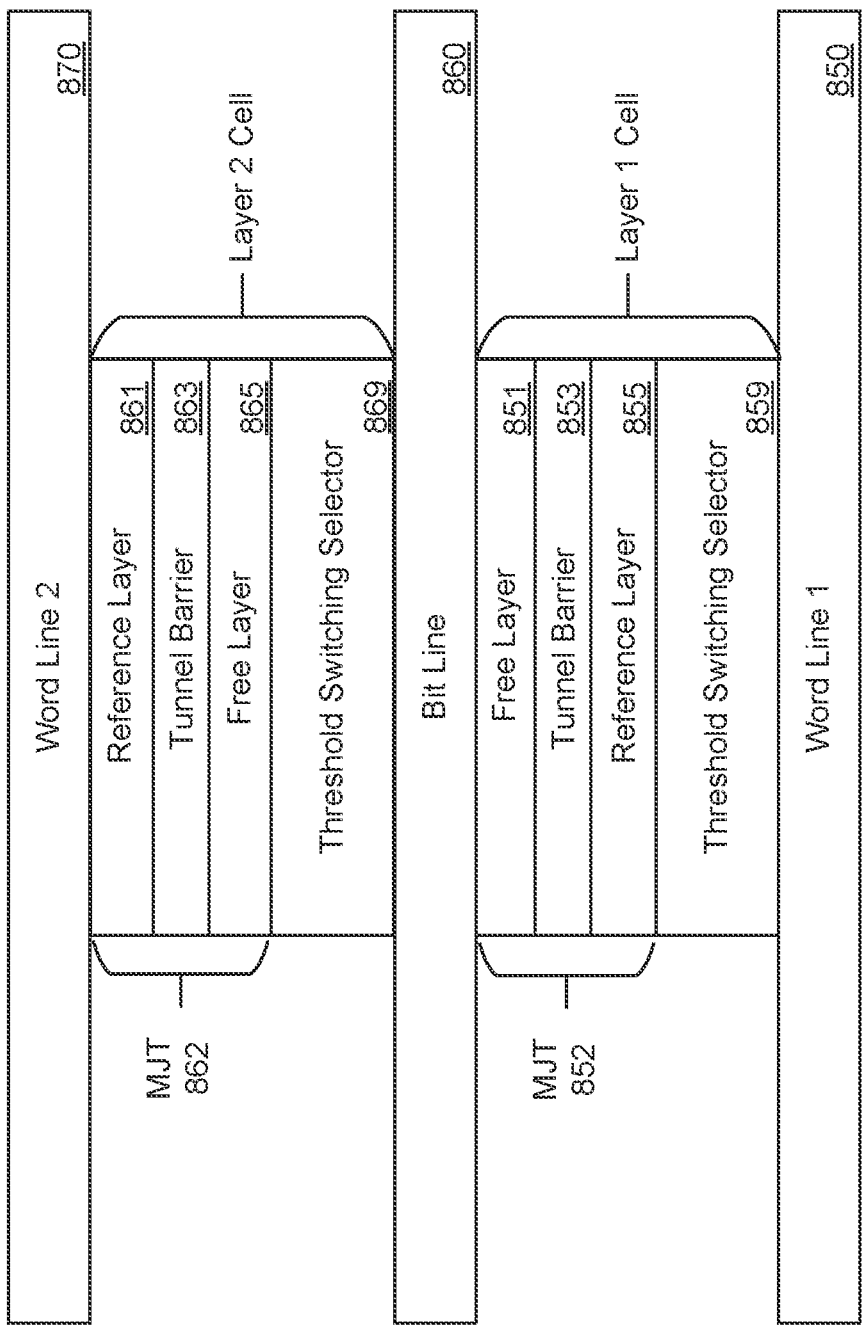

FIGS. 8A and 8B illustrate embodiments for the incorporation of threshold switching selectors into an MRAM memory array having a cross-point architecture. The examples of FIGS. 8A and 8B show two MRAM cells (Layer 1 Cell, Layer 2 Cell) in a two layer cross-point array, such as shown in FIG. 4D, but in a side view. Keeping the orientation of the MRAM layers the same in the Layer 1 Cell and the Layer 2 Cell, as depicted in FIG. 8A, allows the fabrication process to be the same for each layer. FIGS. 8A and 8B show a lower first conducting line of word line 1 800, an upper first conducting line of word line 2 820, and an intermediate second conducting line of bit line 810. In these figures, all of these lines are shown running left to right across the page for ease of presentation, but in a cross-point array they would be more accurately represented as in the oblique view of FIG. 4D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIGS. 5A and 6.

An MTJ element 802 including free layer 801, tunnel barrier 803, and reference layer 805 is formed above the threshold switching selector 809, where this series combination of the MTJ element 802 and the threshold switching selector 809 together form the layer 1 cell between the bit line 810 and word line 1 800. The series combination of the MTJ element 802 and the threshold switching selector 809 operate largely as described above with respect to FIGS. 7A and 7B when the threshold switching selector 809 is turned on. Initially, though, the threshold switching selector 809 needs to be turned on by applying a voltage above the threshold voltage Vth of the threshold switching selector 809, and then the biasing current or voltage needs to be maintained high enough above the holding current or holding voltage of the threshold switching selector 809 so that it stays on during the subsequent read or write operation.

On the second layer, an MTJ element 812 includes free layer 811, tunnel barrier 813, and reference layer 815 is formed above the threshold switching selector 819, with the series combination of the MTJ element 812 and the threshold switching selector 819 together forming the layer 2 cell between the bit line 810 and word line 2 820. The layer 2 cell will operate as for the layer 1 cell, although the lower conductor now corresponds to a bit line 810 and the upper conductor is now a word line, word line 2 820. Additional paired layers may similarly share another bit line between them, having a pattern of WL1, BL1, WL2; WL3, BL2, WL4; or have separate bit lines in a pattern such as WL1, BL1, WL2, BL2.

In the embodiment of FIG. 8A, the threshold switching selector 809/819 is formed below the MTJ element 802/812, but in alternate embodiments the threshold switching selector can be formed above the MTJ element for one or both layers. As discussed with respect to FIGS. 7A and 7B, the MRAM memory cell is directional. In FIG. 8A, the MTJ elements 802 and 812 have the same orientation, with the free layer 801/811 above (relative to the unshown substrate) the reference layer 805/815. Forming the layers between the conductive lines with the same structure can have a number of advantages, particularly with respect to processing as each of the two layers, as well as subsequent layers in embodiments with more layers, can be formed according to the same processing sequence.

FIG. 8B illustrates an alternate embodiment that is arranged similarly to that of FIG. 8A, except that in the layer 2 cell the locations of the reference layer and free layer are reversed. More specifically, between word line 1 850 and bit line 860, as in FIG. 8A the layer cell 1 includes an MTJ element 1 having a free layer 851 formed over tunnel barrier 853, that is turn formed over the reference layer 855, with the MTJ element 852 formed over the threshold switching selector 859. The second layer of the embodiment of FIG. 8B again has an MTJ element 862 formed over a threshold switching selector 869 between the bit line 860 and word line 2 870, but, relative to FIG. 8A, with the MTJ element 862 inverted, having the reference layer 861 now formed above the tunnel barrier 863 and the free layer 865 now under the tunnel barrier 863. Alternatively, the configuration of MTJ element 862 may be used for the Layer 1 cell and the configuration of MTJ element 852 may be used for the Layer 2 cell.

Although the embodiment of FIG. 8B requires a different processing sequence for the forming of layers, in some embodiments it can have advantages. In particular, the directionality of the MTJ structure can make the embodiment of FIG. 8B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 860 will be biased such as in the P2AP direction, the bit line 860 is biased low (e.g., 0V) for both the upper and lower cell, with word line 1 850 and word line 2 870 both biased to a higher voltage level. Similarly, with respect to writing, for writing to the high resistance AP state the bit line 860 is biased low (e.g., 0V) for both the upper and lower cell, with word line 1 850 and word line 2 870 both biased to a higher voltage level.

To either read data from or write data to an MRAM memory cell involves passing a current through the memory cell. In embodiments where a threshold switching selector is placed in series with the MTJ element, before the current can pass through the MTJ element the threshold switching selector needs to be turned on by applying a sufficient voltage across and current through the series combination of the threshold switching selector and the MTJ element.

Figure 9A:
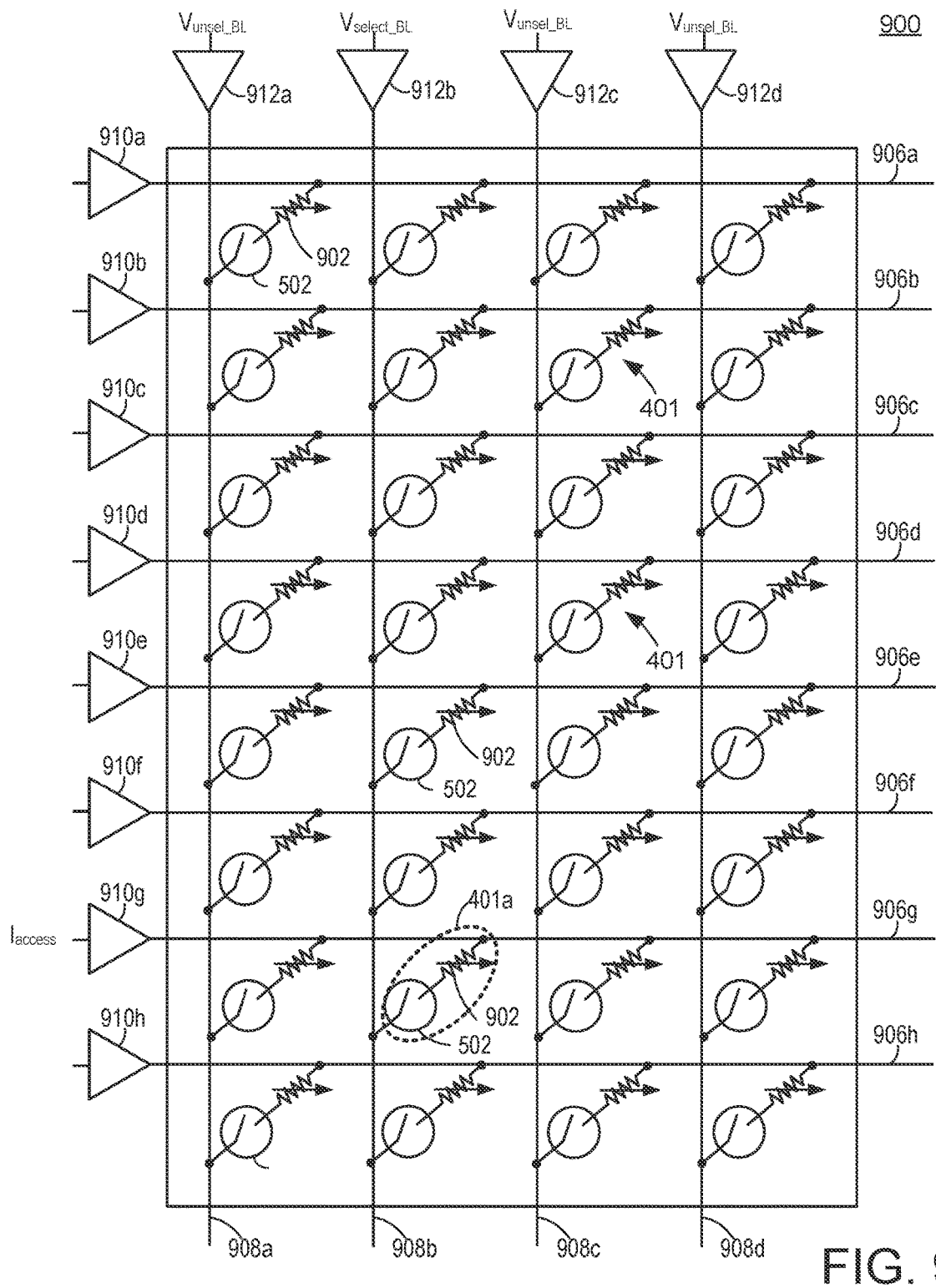
FIG. 9A depicts an embodiment of a memory array having a cross-point architecture in which a current-force approach is used.

FIG. 9A depicts an embodiment of a portion of memory structure 202 having a cross-point architecture. The structure depicted in FIG. 9A may be referred to as a cross-point array or tile 900. Typically, there are many such tiles 900 in the memory structure 202 The tile 900 is depicted as a two-dimensional structure with one layer, but can have multiple layers as in the array in FIG. 4D. Typically, a limited number of memory cells may be accessed in a tile at one time. In some cases, only a single memory cell in the tile is accessed at one point in time. However, typically many tiles may be accessed in parallel. In this manner an ECC codeword may be written, read, or refreshed (including a threshold switching selector refresh) by accessing different tiles in parallel. In some embodiments, there are many tiles 900 in a bay, with multiple bays in the memory structure 202.

The tile 202 has a set of first conductive lines 906a-906h and a set of second conductive lines 908a-908d. In one embodiment, the set of first conductive lines 906a-906h are word lines and the set of second conductive lines 908a-908b are bit lines. For ease of discussion, the set of first conductive lines 906a-906h may be referred to as word lines and the set of second conductive lines 908a-908b may be referred to as bit lines. However, the set of first conductive lines 906a-906h could be bit lines and the set of second conductive lines 908a-908b could be word lines.

The tile 202 has a number of programmable resistance memory cells 401. Each memory cell 401 is connected between one of the first conductive lines 906 and one of the second conductive lines 908. Each memory cell 401 has an MTJ element 902 in series with a threshold switching selector element 502. Hence, each memory cell ("bit") 401 may be referred to as an MRAM cell or bit. The threshold switching selector 502 is configured to become conductive with lower resistance in response to application of a voltage level exceeding a threshold voltage of the threshold switching selector 502, and remains conductive with lower resistance until the current through the switching selector 502 is reduced below the selector holding current, Ihold. The threshold switching selector element 502 may be a two terminal device. In an embodiment, the threshold switching selector element 502 comprises an OTS.

Each first conductive line 906 may be driven by one of the WL drivers 910a-910h. For example, first conductive line 906a may be driven by WL driver 910a, first conductive line 906b may be driven by WL driver 910b, etc. Each second conductive line 908 is driven by one of the BL drivers 912a-912d. For example, second conductive line 908a is driven by BL driver 912a, second conductive line 908b is driven by BL driver 912b, etc. In one embodiment, the word lines and the bit lines are driven from one end of the word line or bit line. FIG. 9A depicts such an embodiment in which the word lines and the bit lines are driven from one end. In an alternative embodiment, the bit lines and/or the word lines are driven from a midpoint. Driving a word line or bit line from a midpoint reduces the worst case IR drop.

A driver 910 may be connected to the selected word line by decode circuitry that selects the WL 906 to be driven. The decode circuitry can be configured to eliminate the need for a separate driver 910 for each WL 906 in the array. The decode circuitry may be capable of connecting each selected WL 906g to a distinct current driver, while connecting the unselected WLs to a node that is connected to $V_{unsel\_WL}$. Similarly, the decode circuitry can be configured to connect the unselected BLs to a different node that is connected to $V_{unsel\_BL}$, while connecting each selected BL 908b to a node connected to $V_{unsel\_BL}$.

For purpose of discussion, memory cell 401a is being selected for access. This could be a read, a write access, or refresh access (e.g., threshold switching selector refresh). Selected memory cell 401a is at the cross-point of selected word line 906g and selected bit line 908b. The other memory cells not selected for access (i.e., are unselected memory cells). All other word lines and all other bit lines are unselected by forcing them to an unselect voltage, such as Vmid, for example 1.65V, at approximately one half the drive compliance voltage, for example 3.3V. To select a memory cell 401 (e.g., cell 401a), a select voltage ($V_{select\_BL}$) such as near ground is provided to the selected bit line (e.g., bit line 908b) and an access current is driven (or forced) through a selected word line (e.g., word line 906g). The access current may flow between a portion of the selected word line, through the selected memory cell, and through a portion of the selected bit line. An unselect voltage ($V_{unsel\_BL}$) is provided to the unselected bit lines (e.g., bit lines 908a, 908c, 908d). In one embodiment, $V_{select\_BL}$ has a magnitude such that the threshold switching selector 502 in a selected memory cell will turn on, assuming that $I_{access}$ is applied to the selected word line. For example, $V_{select\_BL}$ may be approximately 0V. On the other hand, $V_{unsel\_BL}$ has a magnitude such that the threshold switching selector 502 in an unselected memory cell will not turn on, for example $V_{select\_BL}$ may be approximately 1.65V if the positive power supply is 3.3V. Word line driver 910g drives an access current ($I_{access}$) through at least a portion of selected word line 906g. This access current may also flow through the selected memory cell 401a and in a portion of selected bit line 908b, assuming that the selector 502 is on. Such a selected WL may, for example, be driven high by 15pa to read or 30pa to write by a current source with compliance voltage of, for example, 3.3V. In one embodiment, $I_{access}$ is a refresh current used during a refresh operation. In one embodiment, the refresh current has about the same magnitude as the read current. As one example, the refresh current is 15 µa. In an embodiment, the threshold voltage selector 502 in selected memory cell 401a is refreshed using a current-force approach.

The WL drivers 910 are configured to either source a current or sink a current. Thus, $I_{access}$ could flow in either direction through the selected word line (as well as the selected bit line). By convention used herein, when a current driver 910 is used as a current source the magnitude of the access current is positive. By convention used herein, when a current driver 910 is used as a current sink the magnitude of the access current is negative. Whether a current driver 910 sources or sinks a current, herein this will be referred to as forcing or driving the current to or through the selected word line. In one embodiment, no current other than leakage is forced through unselected word lines (e.g., 906a, 906b, 906c, 906d, 906e, 906f, and 906h). Note that herein, a "selected word line" forced with, for example for a 20 nm CD, at 15pa for read or 30pa for write with voltage compliance of approximately 3.3V, means that the word line is connected to a selected memory cell, such cell further determined by its connection to a "selected" bit line at approximately 0V. To write the opposite polarity, the selected word line is forced, for example, with −30 μa and the selected bit line to 3.3V. A selected word line may also be connected to unselected memory cells if the other cell terminal is connected to an unselected bit line at Vmid, such as 1.65V. An "unselected word line" means that the word line is connected to only unselected memory cells. In other words, all memory cells that connect to an unselected word line are unselected memory cells, for example when the unselected WL is forced at Vmid 1.65V for Vp 3.3V, for example; or when the unselected BL is forced at Vmid 1.65V, for example. Note that herein, a "selected bit line" means that the bit line at, for example, near 0V if reading and writing P2AP, or near Vp (−3.3V, for example) if writing APP, is connected to at least one selected memory cell. An "unselected bit line" means that the bit line is connected to only unselected memory cells. In other words, all memory cells that connect to an unselected bit line are unselected memory cells, and the BL is at 1.65V for Vp=3.3V for example. As noted above, a selected memory cell is a memory cell that is selected for access to read or write. A selected memory cell is connected between a selected word line and a selected bit line.

In the example of FIG. 9A there are more word lines than bit lines in the cross-point array. In one embodiment, there are more bit lines than word lines in the cross-point array. In one embodiment, the number of bit lines equals the number of word lines in the cross-point array. In the example of FIG. 9A there are twice as many word lines as bit lines in the cross-point array; however, a different ratio could be used. Thereby, different tile sizes may be realized. For example, a tile 900 may have 1024 BL by 2048 WL, which may be composed into a module of 2048×4096 cells by center driving the WL and BL between the four tiles 900.

Figure 9B:
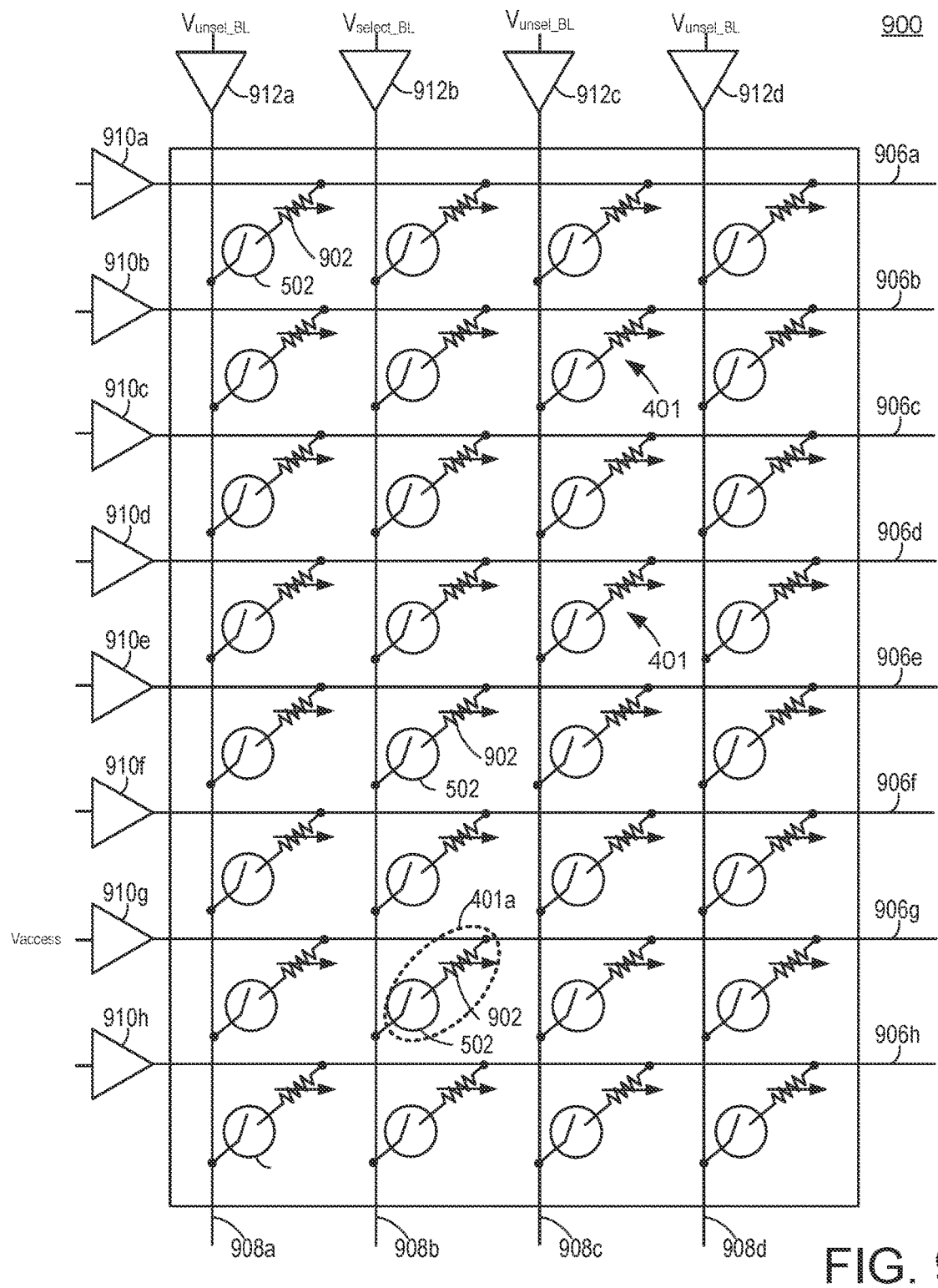
FIG. 9B depicts an embodiment of a memory array having a cross-point architecture in which a voltage-force approach is used.

In some embodiment, the programmable resistance memory cells are read, written, and/or refreshed using a voltage force approach. FIG. 9B depicts an embodiment of a portion of memory structure 202 having a cross-point architecture in which a voltage force approach is used. The architecture is similar to the one in FIG. 9A and will not be discussed in detail. In FIG. 9B, an access voltage $V_{access}$ is driven on word line 906g while the select voltage $V_{select\_BL}$ is driven on bit line 908b to select memory cell 401a. In this manner memory cell 401a may be read, written and/or refreshed. In an embodiment, the threshold voltage selector 502 is refreshed using a voltage-force approach.

Figure 10:
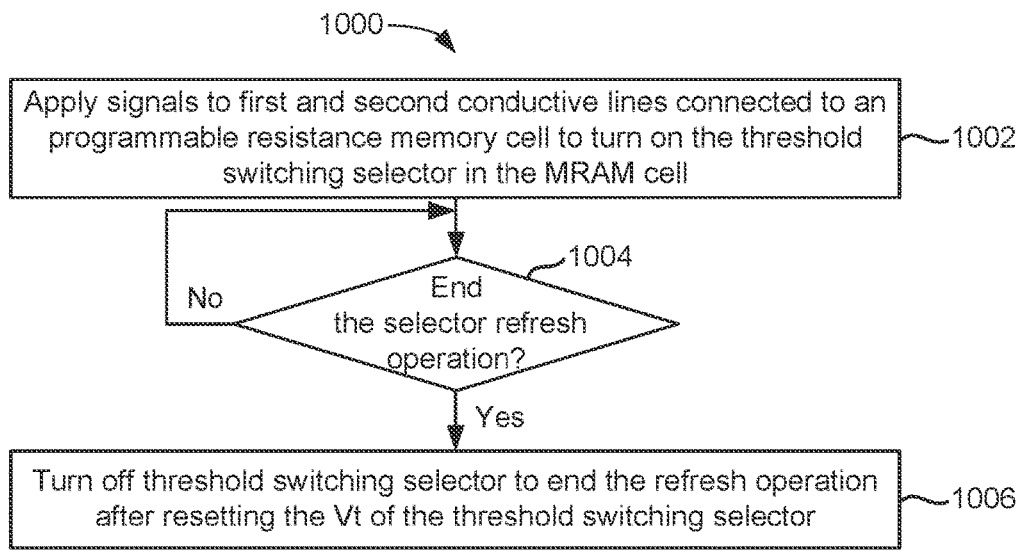
FIG. 10 is a flowchart of one embodiment of a process of refreshing a threshold switching selector of a MRAM cell in a cross-point memory array.

FIG. 10 is a flowchart of one embodiment of a process 1000 of refreshing a threshold switching selector of a programmable resistance memory cell in a cross-point memory array. Refreshing threshold switching selector 502 of the programmable resistance memory cell 401 will reset the Vt of the threshold switching selector 502. In an embodiment, the Vt of the threshold switching selector 502 drifts upward, such that the refresh will reset the Vt to about its lowest value. There may be some variance of the Vt to which the threshold switching selector 502 is reset between refresh operations. The process 1000 describes refreshing the threshold switching selector 502 of one programmable resistance memory cell 401, but may be applied in parallel to reset the threshold switching selectors 502 of a group of programmable resistance memory cells. The group of programmable resistance memory cells may be in a number of tiles 900. In one embodiment, the threshold switching selector 502 of a single memory cell per tile 900 is reset in parallel using process 1000. In one embodiment, the threshold switching selectors 502 of multiple memory cells per tile 900 are reset in parallel using process 1000. In one embodiment, the programmable resistance memory cell is an MRAM cell. In one embodiment, the threshold switching selector 502 is an OTS. In one embodiment, the programmable resistance memory cell has an MTJ element in series with an OTS.

Step 1002 includes applying signals to first and second conductive lines connected to a programmable resistance memory cell 401 to turn on the threshold switching selector 502 in the programmable resistance memory cell. In one embodiment, a current-force approach is used to drive a current into the first conductive line while applying a select voltage to the second conductive line. In one embodiment, a voltage-force approach is used to drive a voltage onto the first conductive line while applying a select voltage to the second conductive line. With either the current-force approach or the voltage-force approach the volage on the first conductive line may ramp up over time. In an embodiment, the voltage on the second conductive line is about 0V and changes little, if any, during the refresh operation. As a result the voltage across the programmable resistance memory cell may ramp up over time. At some point, the voltage across the programmable resistance memory cell is sufficient to turn on the threshold switching selector 502 in the programmable resistance memory cell.

Step 1004 is a determination of whether to end the selector refresh operation. In one embodiment, the selector refresh operation is ended at a pre-determined time. In an embodiment, the pre-determined time starts when the signal (current or voltage) is first applied to the first conductive line. In one embodiment, the selector refresh operation is ended in response to detecting that the threshold switching selector has turned on.

Step 1006 includes turning off threshold switching selector to end the refresh operation after resetting the Vt of the threshold switching selector. In various embodiment, the selector refresh operation is faster than a read or write operation. Also, the selector refresh operation is faster than a data refresh of the programmable resistance memory cell. Therefore, the selector refresh operation is faster than and consumes less current/power than a read operation or a data refresh operation. The low current/power consumption allows the selector refresh operation to be performed in parallel on a large group of programmable resistance memory cells. Also, the speed of the selector refresh operation allows the selector refresh operation to be performed more frequently than a data refresh operation.

Figure 11:
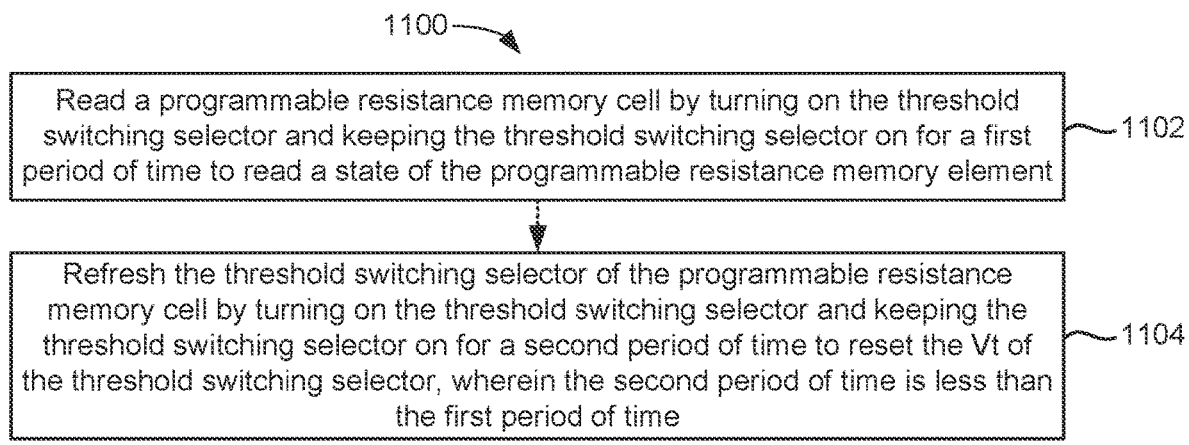
FIG. 11 is a flowchart of one embodiment of a process of reading a programmable resistance memory cell and refreshing the selector of the programmable resistance memory cell.

FIG. 11 is a flowchart of one embodiment of a process 1100 of reading a programmable resistance memory cell and refreshing the selector of the programmable resistance memory cell. Similar to process 1000, process 1100 may be performed in parallel in a group of programmable resistance memory cells. The read operation and the selector refresh are performed at different times. As noted herein, the selector refresh operation will reset the Vt of the threshold switching selector due to turning on the threshold switching selector. The read operation also will turn on the threshold switching selector and may therefore also reset the Vt of the threshold switching selector. However, the selector refresh operation keeps the threshold switching selector on for a significantly shorter time than the read operation. Therefore, the selector refresh operation is faster than and consumes less current/power than the read operation. Moreover, the selector refresh operation places less stress on the programmable resistance memory element than the read operation.

Step 1102 includes reading the programmable resistance memory cell by turning on the threshold switching selector 502 of the memory cell 401 and keeping the threshold switching selector on for a first period of time to read a state of the programmable resistance memory element of the memory cell. In some embodiments, step 1102 could be performed in a data refresh operation. In one embodiment, reading the state of the memory cell 401 include sampling the voltage on the word line. In one embodiment, reading the state of the memory cell 401 includes sampling the current in the bit line. Other techniques may be used to read the state of the memory cell 401. However, the threshold switching selector 502 needs to be on to read the state of the memory cell. Note that it typically takes some time after the threshold switching selector 502 switches on for conditions to stabilize prior to being able to read the memory cell's state. For example, the voltage on the word line may need time to settle down after the threshold switching selector 502 switches.

Step 1104 includes refreshing the threshold switching selector 502 of the programmable resistance memory cell by turning on the threshold switching selector 502 and keeping the threshold switching selector 502 on for a second period of time to reset the Vt of the threshold switching selector 502. The second period of time is less than the first period of time. Therefore, the selector refresh takes less time and consumes less power/current than the read operation. Also, the selector refresh places less stress on the programmable resistance memory element than the read operation. In one embodiment, process 1000 is used to perform step 1104. It is understood that step 1104 can be performed whether or not step 1102 immediately preceded step 1104 in the same operation.

Figure 12:
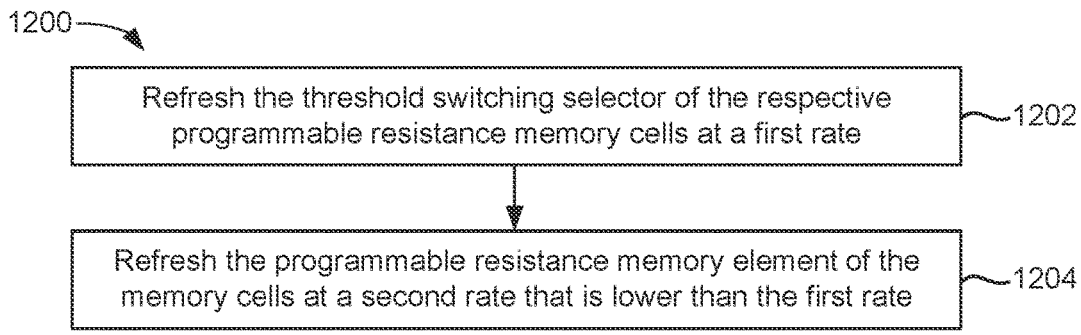
FIG. 12 is a flowchart of one embodiment of a process of refresh in a cross-point memory array.

In some embodiments, the memory system performs a threshold switching selector refresh and a separate data refresh of the programmable resistance memory element. FIG. 12 is a flowchart of one embodiment of a process 1200 of refresh in a memory structure having one or more cross-point arrays. The process 1200 is used to refresh the selector and to refresh data stored in the programmable resistance memory element, but at different rates.

Step 1202 includes refreshing the threshold switching selector of the respective programmable resistance memory cells at a first rate. The first rate refers to the gap in time between refreshing the selector of a particular memory cell. In an embodiment, process 1000 is used in step 1202. The first rate could refresh the threshold switching selector 502 for each particular memory cell at a rate somewhere between once per second and once per hour. However, the first rate could be more frequent than once per second or less frequent than once per hour.

Step 1204 includes refreshing the programmable resistance memory element of the memory cells at a second rate that is lower than the first rate. The second rate refers to the gap in time between refreshing the programmable resistance memory element of a particular memory cell. The second rate could refresh the memory element for each particular memory cell at a rate somewhere between once per hour and once per month. However, the second rate could be more frequent than once per hour or less frequent than once per month. Refreshing the programmable resistance memory element may refresh the data in the memory element. One technique for this data refresh is to read a group of memory cells, decode and error correct the data, and write back the corrected data to the group. Note that refreshing the programmable resistance memory element may also refresh the threshold switching selector. Hence, if both the threshold switching selector 502 and the MTJ element 902 are due for a refresh, rather than performing step 1202 step 1204 may be performed.

Figures 13A, 13B:
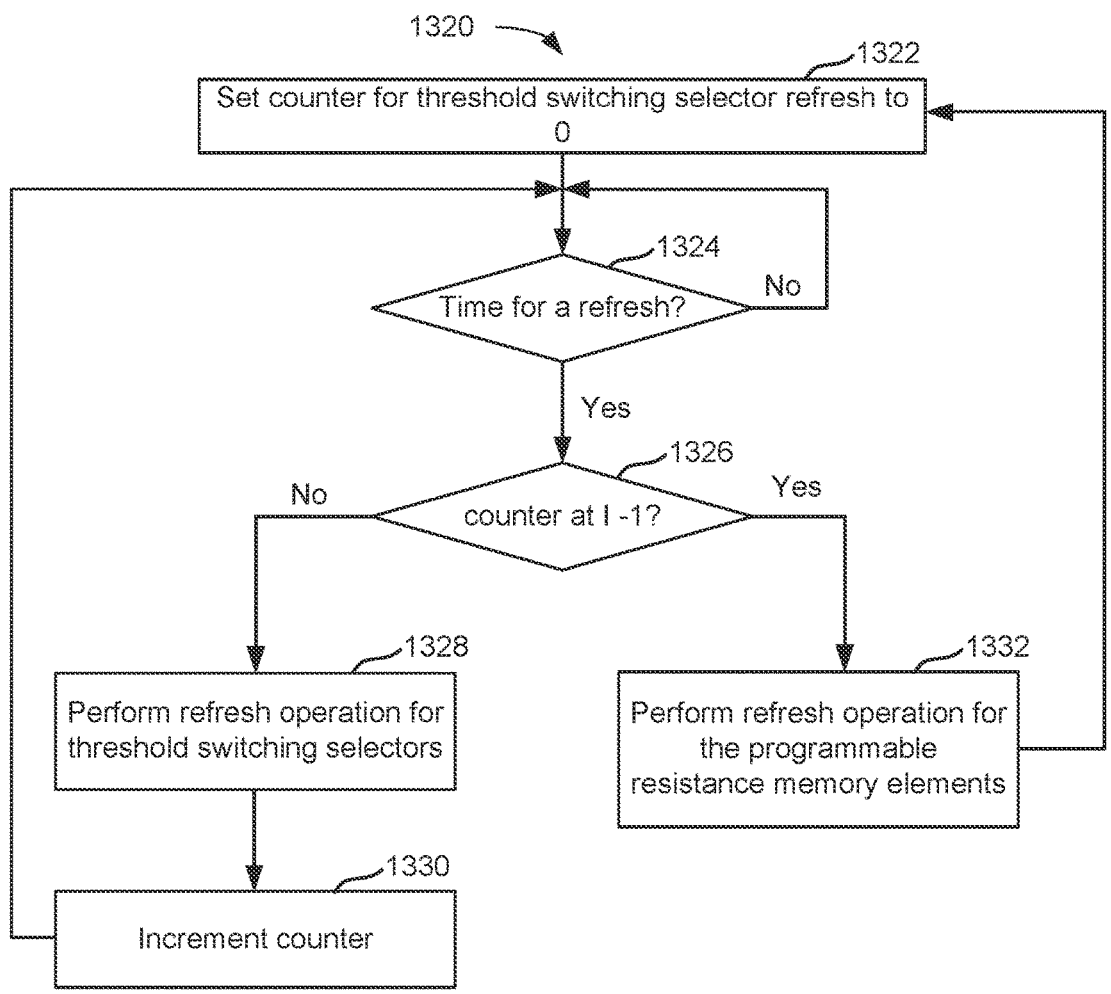
FIG. 13A depicts a table illustrating one embodiment of rates of refresh.
FIG. 13B is a flowchart of one embodiment of a process of performing threshold switching selector refresh and at a higher rate than programmable resistance element refresh.

FIG. 13A depicts a table 1300 illustrating one embodiment of rates of refresh. The table 1300 covers two types of refresh operations: refresh of the threshold switching selector (S) and data refresh of the programmable resistance memory element (M). In an embodiment, the programmable resistance memory element comprises a magnetoresistive element. In an embodiment, programmable resistance memory element comprises an MTJ. A total of "i" refresh operations are performed in each iteration. Each iteration, the first i–1 refresh operations are selector refreshes (S), with the last refresh operation each iteration being a programmable resistance memory element refresh (M). The value of i may be, for example, between 2 and 100. Thus, if "i" is 2, the threshold switching selector refresh rate will be twice the programmable resistance memory element refresh rate. If "i" is 100, the threshold switching selector refresh rate will be 100 times the programmable resistance memory element refresh rate.

FIG. 13B is a flowchart of one embodiment of a process 1320 of performing threshold switching selector refresh at a higher rate than memory element data refresh. The process is based on the table 1300 in FIG. 13A and pertains to a group of memory cells that undergo refresh operations concurrently. Step 1322 includes setting a counter of refresh operations to 0. The counter will count selector refresh operations. The counter serves as a ratio of a number of selector refresh operations to memory element data refreshes.

Step 1324 is a determination of whether it is time to perform a refresh operation for this group of memory cells. In an embodiment, the refresh operation for this group is performed at some regular interval (e.g., once per second, once per 6 minutes, once per hour, etc.). In one embodiment, the group of memory cells stores an ECC codeword. In one embodiment, the group of memory cells stores multiple ECC codewords. In one embodiment, the group of memory cells are an ECC crossword, which means that the memory cells are selected from multiple ECC codewords, but only a subset (i.e., less than all) of the memory cells in each ECC codeword are selected. Further details of an ECC crossword are discussed below.

Step 1326 is a determination of whether the counter has reached i–1. If not, then a refresh of the threshold switching selector 502 is performed in step 1328. This will reset the Vt of threshold switching selector 502 but will not refresh the data in the programmable resistance memory element. In one embodiment, process 1000 is used in step 1328. In step 1330 the counter is incremented. Then, the process returns to step 1324. When the counter reaches i–1, the data in the memory elements is refreshed in step 1332. This will also refresh the threshold switching selector 502. That is, step 1332 will also reset the Vt of the threshold switching selectors 502. Then, the counter is reset in step 1322.

Figure 14A:
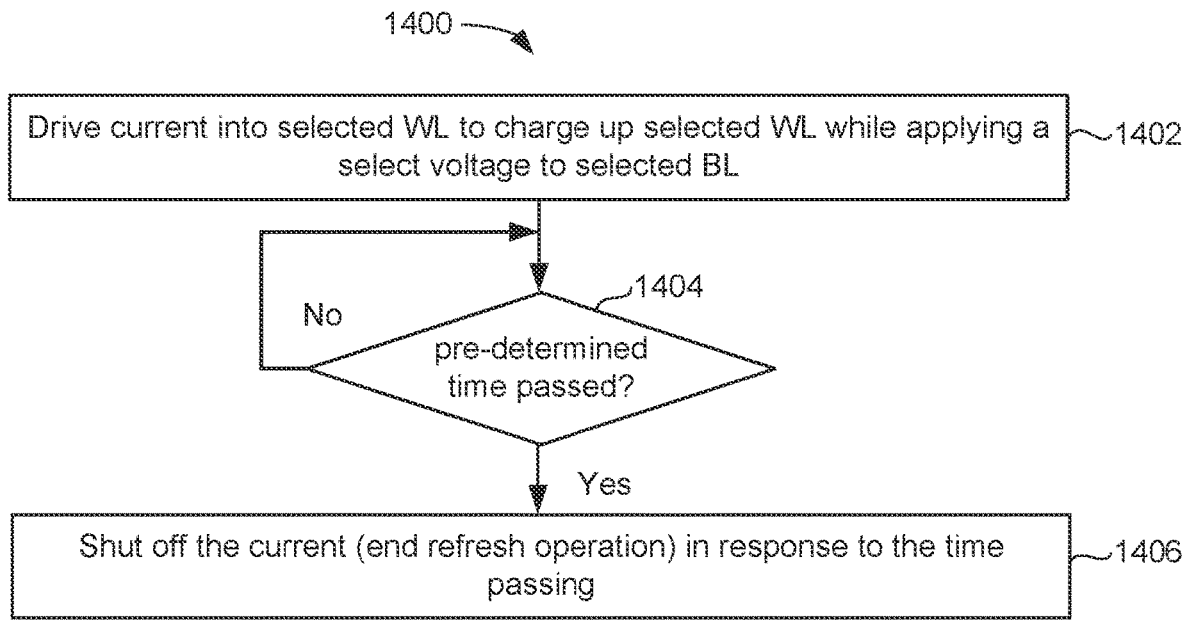
FIG. 14A is a flowchart of one embodiment of a process of performing a refresh of a threshold switching selector.
Figure 15A:
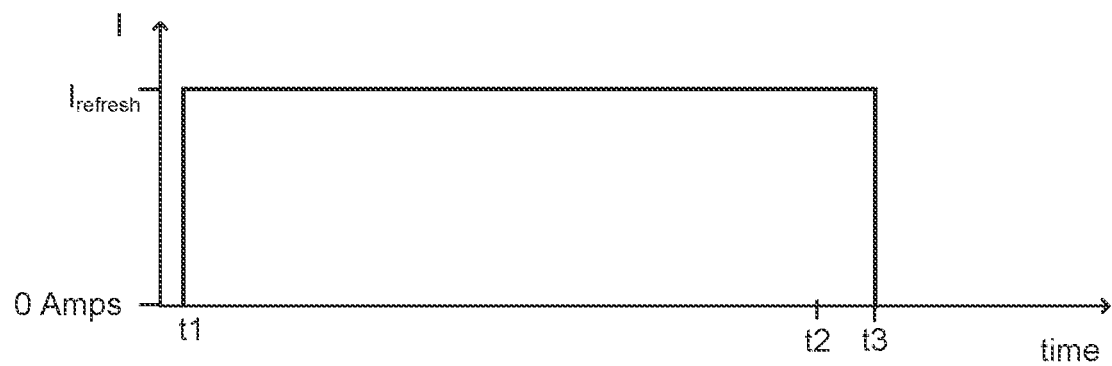
FIG. 15A depicts the current that is driven into the selected WL in an embodiment of a current-forced selector refresh.
Figure 15B:
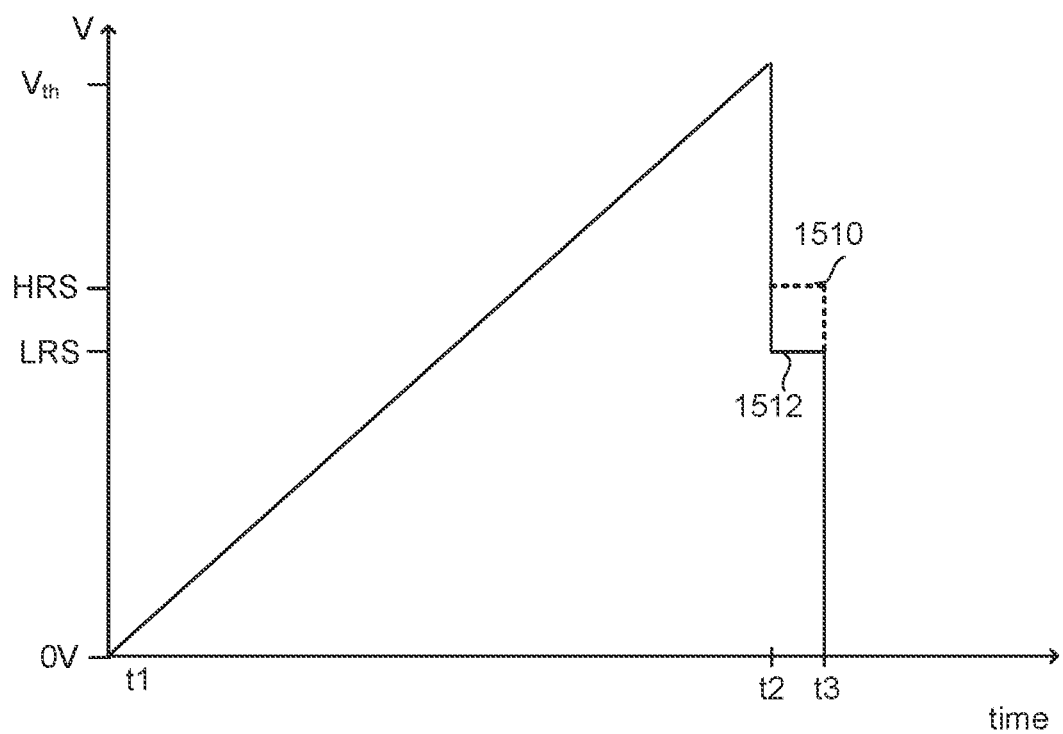
FIG. 15B depicts the voltage on the selected WL in an embodiment of a current-forced selector refresh.

As noted above, one way to determine when to end the threshold selector refresh operation is based on a predetermined time. FIG. 14A is a flowchart of one embodiment of a process 1400 of performing a refresh of a threshold switching selector. The process 1400 is one embodiment of process 1000. The process 1400 is used in one embodiment of step 1104 of FIG. 11. The process 1400 is used in one embodiment of step 1202 of FIG. 12. Process 1400 uses a current-force approach. FIGS. 15A and 15B depict a current and a voltage waveform, respectively, for the selected word line (WL) and will be discussed in connection with process 1400. The process 1400 may be performed in parallel on a number of memory cells.

Step 1402 includes driving a current into the selected WL to charge up the selected WL while applying a select voltage to a selected BL. The memory cell that has been selected to have its threshold switching selector 502 refreshed is connected to the selected WL and to the selected BL. In an embodiment, the current is about 15 uA.

Step 1404 is a determination of whether a pre-determined time has passed since the start of the application of the current to the selected WL. If not, the current continues to be applied to the selected WL, thereby ramping up the selected WL voltage. FIG. 15A depicts the current that is driven into the selected WL. At t1 the current begins to be driven into the selected WL. The pre-determined time is the time gap between t1 and t3, at which point the current is turned off. FIG. 15B depicts the voltage on the selected WL. At t1 the voltage on the selected WL begins to ramp up. The voltage ramps up until t2, which is when the threshold switching selector turns on.

The threshold switching selector 502 is off between t1 and t2. Between t1 and t2, the current causes the word line voltage to increase. The current also supports any leakage in the path. Thus, the voltage across the series combination of the threshold switching selector 502 and the resistive MTJ element 902 ramps up between t1 and t2 as the threshold switching selector is in an off state. When the threshold switching selector 502 is off its resistance is very high so that most of the word line voltage appears across the threshold switching selector 502. Once the voltage across threshold switching selector 502 reaches the threshold voltage Vth of the threshold switching selector 502, it will turn on and switch to a low resistance state (at t2).

With reference to FIG. 15A, the current remains at $I_{refresh}$ between t2 and t3. With reference to FIG. 15B, the threshold switching selector 502 remains on between t2 and t3 (in a low resistance state). Once the threshold switching selector 502 is in the on state (at t2), the $I_{refresh}$ current will flow through the selected memory cell 401. As the refresh current is held fixed at $I_{refresh}$, the voltage across the memory cell will drop to a level dependent upon the series resistance of the MTJ element 902 and the on-state resistance of the threshold switching selector 502.

For a binary embodiment in which a memory cell only stores two states, the memory cell will have a high resistance, AP-state, for example 50 kΩ, and a low resistance, P-state, for example 25 kΩ. The resultant voltage across the series connected MTJ element 902 and threshold switching selector 502 in response to the $I_{refresh}$ current for the high resistance state (HRS) and low resistance state (LRS) are respectively shown as lines 1510 and 1512. Although the discussion here is in the context of an MRAM based memory cell being placed in series with the threshold switching selector, this read technique can similarly be applied to other programmable resistance memory cells, such as PCM or ReRAM devices.

Step 1406 is to shut off the current in response to the passage of the pre-determined time. Shutting off the current ends the refresh operation. As noted, the current is shut off at time t3 (see FIG. 15A). Referring to FIG. 15B, the WL voltage will drop to zero in response to shutting off the current. However, note that the word line has some capacitance. Therefore, the WL voltage will not drop immediately at either time t2 or t3. Thus, the depicted waveforms in FIGS. 15A and 15B are somewhat idealized.

The time t3 may be determined based on engineering analysis such that most of the threshold switching selectors 502 in the group being refreshed will turn on prior to t3. It is possible that some of the threshold switching selectors 502 in the group fail to turn on prior to t3. The time t3 may also be based on gap in time since the last time that the threshold switching selectors 502 were turned on.

Note that the threshold switching selector 502 is on for a relatively short period of time relative to, for example, a read operation. The rate of wear of the memory cell depends on the length of time for which the threshold switching selector 502 is on. Therefore, the selector refresh operation will cause less wear on the memory cell than a read operation, which has the threshold switching selector 502 on for a longer period of time.

In rare cases, refreshing the threshold switching selector could lead to an MTJ free layer read disturb event that goes undetected. Turning on the threshold switching selector could result in a current spike which could disturb the MTJ free layer, which is referred to as a snapback event. If the disturbance of the MTJ free layer is too severe this could lead to a read error (when the cell is read at a later time). The reason why the read disturb event that goes undetected goes undetected is that the selector refresh operation does not read and refresh the data stored in the memory cell. However, the memory system is typically designed to tolerate such cases provided that the error rate is not too high. For example, the memory system may be designed with a snapback read error rate budget of 10^−5. The possibility of the MTJ free layer read disturb during refresh may be factored into the snapback read error rate budget.

Figure 14B:
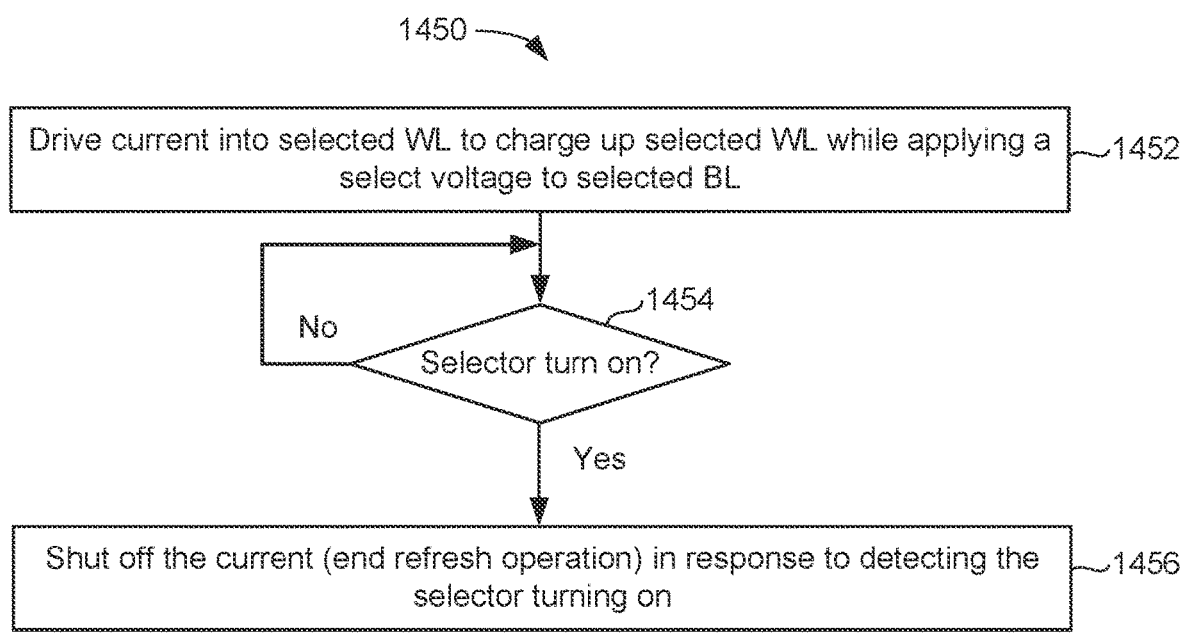
FIG. 14B is a flowchart of one embodiment of a process of performing a refresh of a threshold switching selector.

As noted above, one way to determine when to end the threshold selector refresh operation is based on detection of the threshold switching selector turning on. FIG. 14B is a flowchart of one embodiment of a process 1450 of performing a refresh of a threshold switching selector. The process 1450 is one embodiment of process 1000. The process 1450 is used in one embodiment of step 1104 of FIG. 11. The process 1450 is used in one embodiment of step 1202 of FIG. 12. Process 1450 uses a current-force approach.

Step 1452 includes driving a current into a selected WL to charge up the selected WL while applying a select voltage to a selected BL. The memory cell that has been selected to have its threshold switching selector 502 refreshed is connected to the selected WL and to the selected BL. In an embodiment, the current is about 15 uA.

Step 1454 is a determination of whether the threshold switching selector 502 has turned on in response to the current. In one embodiment, the voltage on the selected word line is monitored to detect the event at t2 in FIG. 15B at which the WL voltage drops. In one embodiment, the rate of change of the selected WL voltage is positive prior to the threshold switching selector 502 turning on. After the threshold switching selector 502 turns on the rate of change of the selected WL voltage is negative. Thus, in one embodiment, circuitry monitors for a negative rate of change in the selected WL voltage. In one embodiment, the current of the selected BL is monitored to detect the point at which the BL increases in response to the threshold switching selector 502 turning on. In another embodiment, the circuitry monitors whether the selected WL voltage is less than the expected WL voltage if the selector did not turn on after a sufficient amount of time has elapsed.

Step 1456 is to shut off the current in response to the detecting that the switching selector 502 has turned. Shutting off the current ends the refresh operation.

Figure 16A:
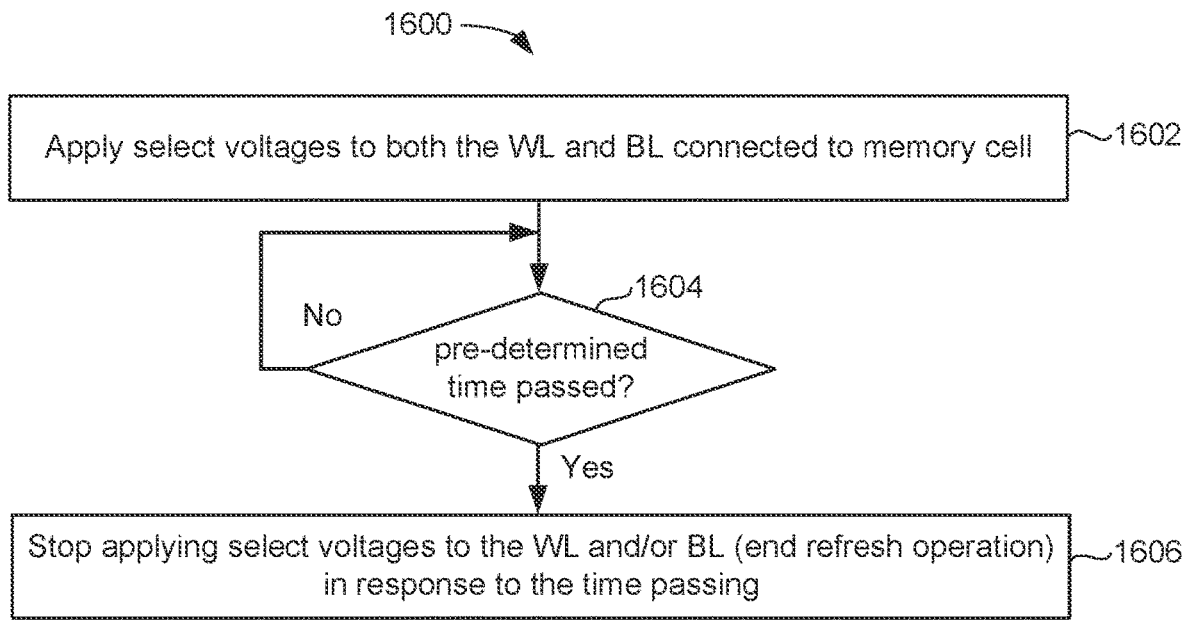
FIG. 16A is a flowchart of one embodiment of a process of performing a refresh of a threshold switching selector using a current-force approach.

As noted above, in some embodiments, a voltage-force approach is used in the selector refresh. FIG. 16A is a flowchart of one embodiment of a process 1600 of performing a refresh of a threshold switching selector. Process 1600 uses a voltage-force approach. The process 1600 is one embodiment of process 1000. The process 1600 is used in one embodiment of step 1104 of FIG. 11. The process 1600 is used in one embodiment of step 1202 of FIG. 12.

Step 1602 includes driving a voltage onto the selected WL to charge up the selected WL while applying a select voltage to a selected BL. The memory cell that has been selected to have its threshold switching selector 502 refreshed is connected to the selected WL and to the selected BL. Initially, the voltage may be low, such as at t1 in FIG. 15B for the current-force approach. As the selected WL charges up, the WL voltage ramps up. In an embodiment, the maximum WL voltage is about 3 or 3.5V. As with the example in FIG. 15B, the threshold switching selector 502 will turn on when the voltage reaches the Vt of the threshold switching selector 502. The Vt of the threshold switching selector 502 needs to be below this maximum voltage. Refreshing the threshold switching selector 502 keeps the Vt from drifting above this maximum voltage.

Step 1604 is a determination of whether a pre-determined time has passed since the start of the application of the voltage to the selected WL. If not, the voltage continues to be applied to the selected WL, thereby ramping up the selected WL voltage. Step 1606 is to stop applying the voltage to the selected WL and/or BL in response to the passage of the pre-determined time, which ends the refresh operation.

Figure 16B:
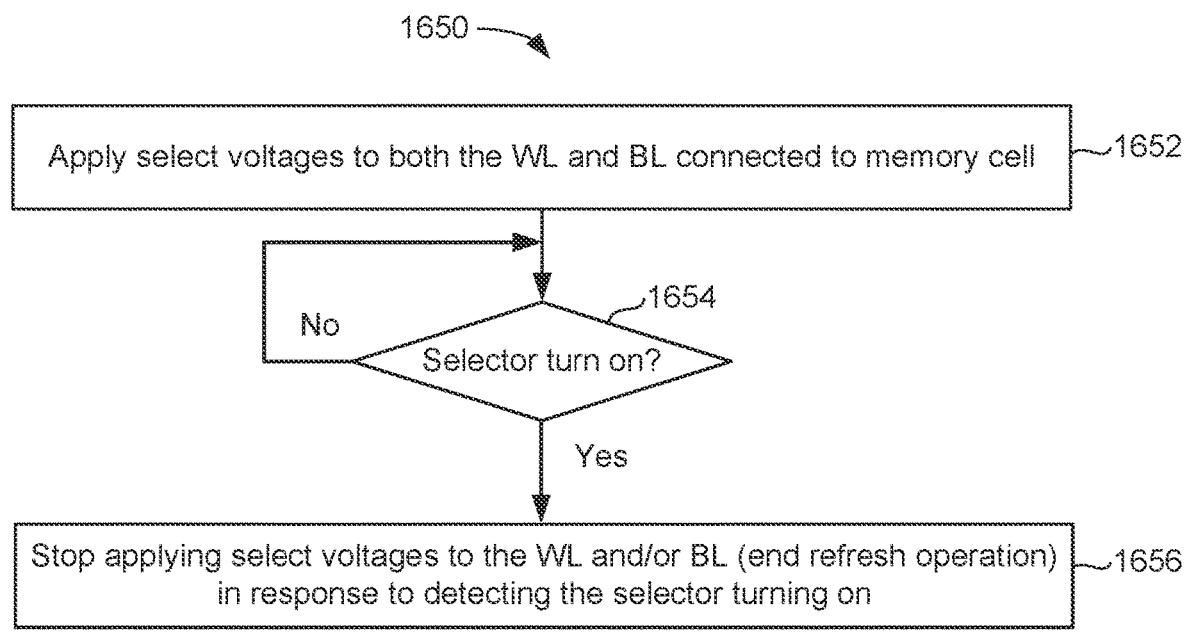
FIG. 16B is a flowchart of one embodiment of a process of performing a refresh of a threshold switching selector using a voltage-force approach.

FIG. 16B is a flowchart of one embodiment of a process 1650 of performing a refresh of a threshold switching selector. Process 1650 uses a voltage-force approach but differs in that the refresh operation ends in response to detection of the threshold switching selector 502 turning on. The process 1650 is one embodiment of process 1000. The process 1650 is used in one embodiment of step 1104 of FIG. 11. The process 1650 is used in one embodiment of step 1202 of FIG. 12.

Step 1652 includes driving a voltage onto the selected WL to charge up the selected WL while applying a select voltage to a selected BL. Step 1652 is similar to step 1602.

Step 1654 is a determination of whether the threshold switching selector 502 has turned on in response to the voltage. In one embodiment, the current of the selected BL is monitored to detect the point at which the BL current increases in response to the threshold switching selector 502 turning on. Step 1656 is to shut off the voltage to the selected WL and/or BL response to detecting that the switching selector 502 has turned. Shutting off the voltage ends the refresh operation.

Figure 17A:
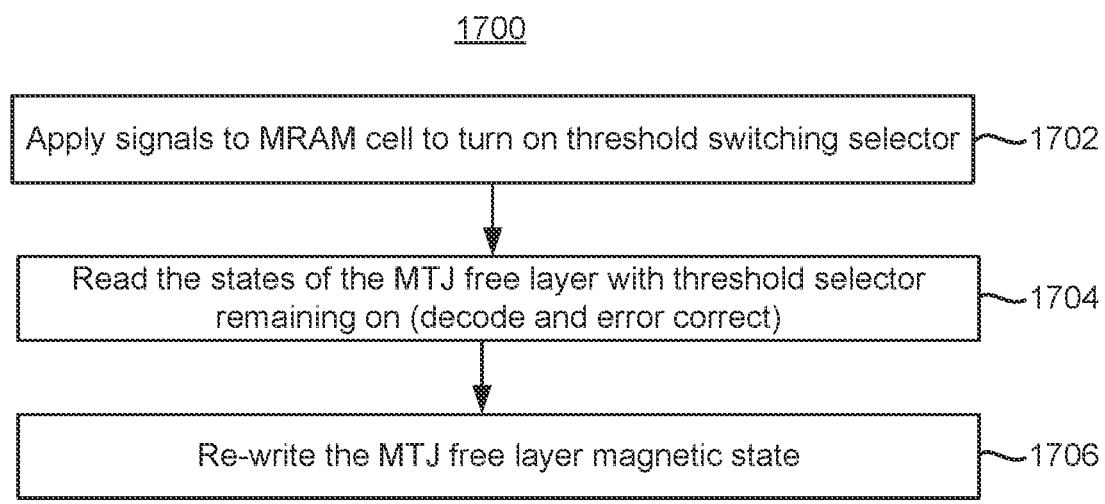
FIG. 17A is a flowchart of one embodiment of a process of a refresh of a Magnetic Tunnel Junction element of a memory cell.

FIG. 17A is a flowchart of one embodiment of a process 1700 of a refresh of an MTJ element. The process 1700 may be performed in parallel on a group of MRAM cells. Process 1700 uses what may be referred to as a "fast read." Process 1700 is used in one embodiment of step 1204 in FIG. 12. Process 1700 is used in one embodiment of step 1332 in FIG. 13B. One embodiment uses a current-force approach. One embodiment uses a volage-force approach. Step 1702 includes applying signals to the MRAM cell to turn on the threshold switching selector 502. Step 1704 includes reading the state of the MTJ free layer with the threshold switching selector 502 remaining on. After reading the respective states of a group of memory cells that store an ECC codeword, error detection and correction may be applied to correct any errors in the ECC codeword.

Figure 17B:
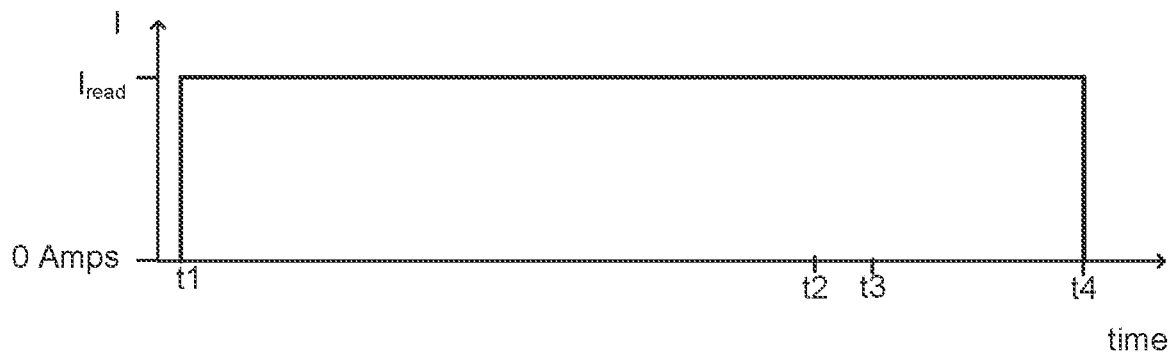
FIG. 17B depicts the current (Iread) that is driven into the selected WL during the read process in an embodiment of the process of FIG. 17A.
Figure 17C:
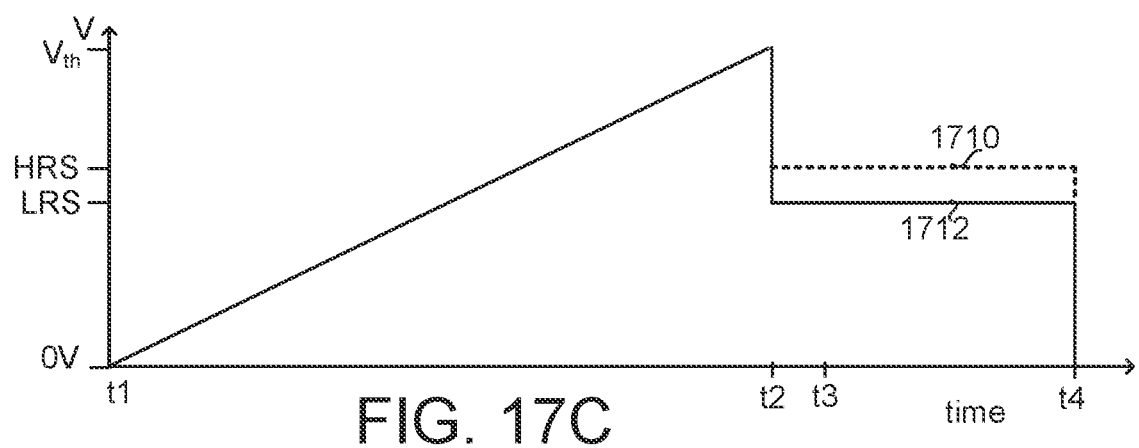
FIG. 17C depicts the voltage on the selected WL during the read process in an embodiment of the process of FIG. 17A.

FIGS. 17B and 17C depict a current and a voltage waveform, respectively, for the selected word line (WL) during an embodiment of a refresh of an MTJ element that uses a current-force approach. FIG. 17B depicts the current (Iread) that is driven into the selected WL. At t1 the current begins to be driven into the selected WL. FIG. 17C depicts the voltage on the selected WL. At t1 the voltage on the selected WL begins to ramp up. The voltage ramps up until t2, which is when the threshold switching selector turns on.

The threshold switching selector 502 is off between t1 and t2. Between t1 and t2, the current causes the word line voltage to increase. The current also supports any leakage in the path. Once the voltage across threshold switching selector 502 reaches the threshold voltage Vth of the threshold switching selector 502, it will turn on and switch to a low resistance state (at t2). Thus, the voltage across the series combination of the threshold switching selector 502 and the resistive MTJ element 902 ramps up between t1 and t2 as the threshold switching selector is in an off state.

With reference to FIG. 17B, the current remains at $I_{read}$ between t2 and t4. With reference to FIG. 17C, the threshold switching selector 502 remains on between t2 and t4 (in a low resistance state). The times t1, t2, and t3 in FIGS. 17B and 17C correspond to the times t1, t2, and t3 in an embodiment of the selector refresh waveforms in FIGS. 15A and 15B. Once the threshold switching selector 502 is in the on state (at t2), the $I_{read}$ current will flow through the selected memory cell 401. As the refresh current is held fixed at $I_{read}$, the voltage across the memory cell will drop to a level dependent upon the series resistance of the MTJ element 902 and the on-state resistance of the threshold switching selector 502.

For a binary embodiment in which a memory cell only stores two states, the memory cell will have a high resistance, AP-state, for example 50 kΩ, and a low resistance, P-state, for example 25 kΩ. The resultant voltage across the series connected MTJ element 902 and threshold switching selector 502 in response to the $I_{read}$ current for the high resistance state (HRS) and low resistance state (LRS) are respectively shown as lines 1710 and 1712. The memory cell is read between t2 and t4 to determine the state of the MTJ free layer. Note that the threshold switching selector 502 is on until at least t4 for the refresh of an MTJ element, which means that the threshold switching selector 502 is on for significantly longer than in the selector refresh.

Step 1706 includes writing the MTJ free layer magnetic state of the respective memory cells if there is a desire to refresh the MTJ. Therefore, the data in the group that stores the ECC codeword is refreshed. Step 1706 is not depicted in FIG. 17B or 17C, but may involve forcing a write current through the MRAM cell.

Figure 18:
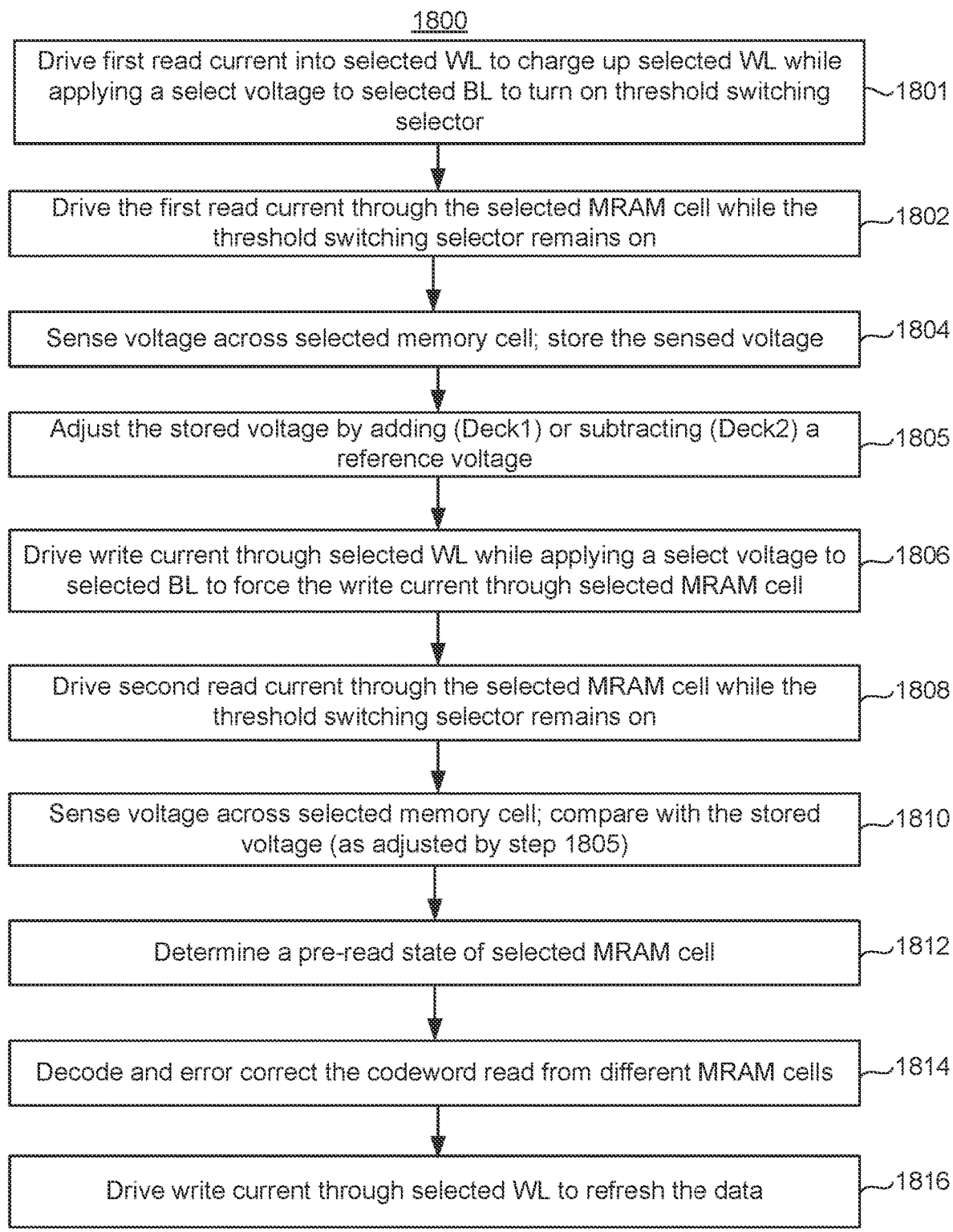
FIG. 18 is a flowchart depicting one embodiment of a process of current-force SRR.

FIG. 18 is a flowchart of one embodiment of a process 1800 of a refresh of an MTJ element. Process 1800 uses what may be referred to as a "self-references read" (SRR). Process 1800 is used in one embodiment of step 1204 in FIG. 12. Process 1800 is used in one embodiment of step 1332 in FIG. 13B. One embodiment uses a current-force approach. One embodiment uses a volage-force approach. The SRR may be referred to as a destructive SRR, which means that the original state of the memory cell may be changed during the SRR.

Figure 19A:
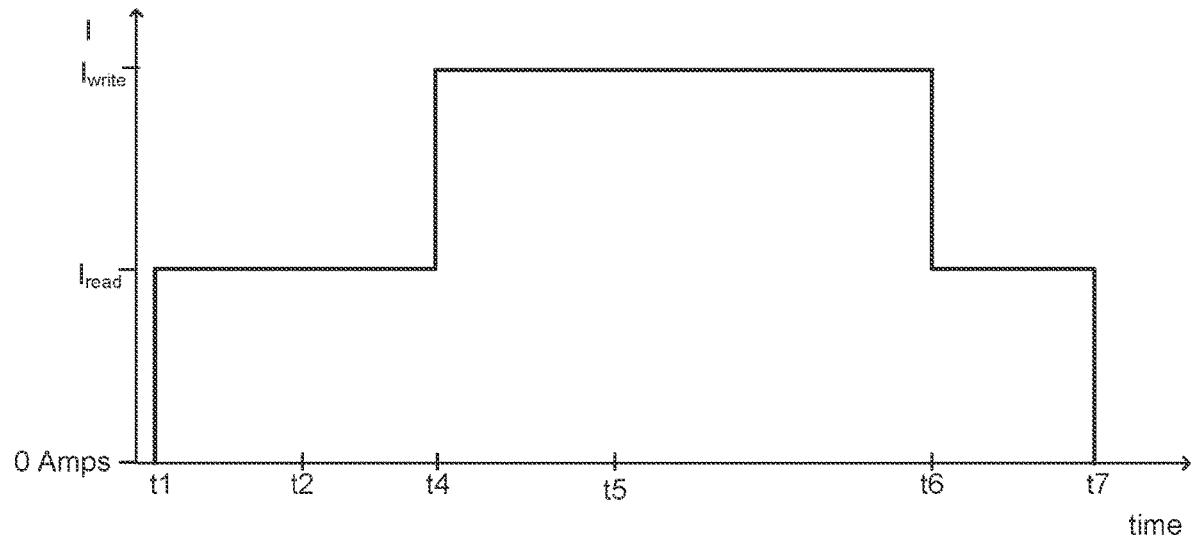
FIG. 19A depicts current versus time for an accessed bit current that is driven through a selected word line during an embodiment of current-force SRR.
Figure 19B:
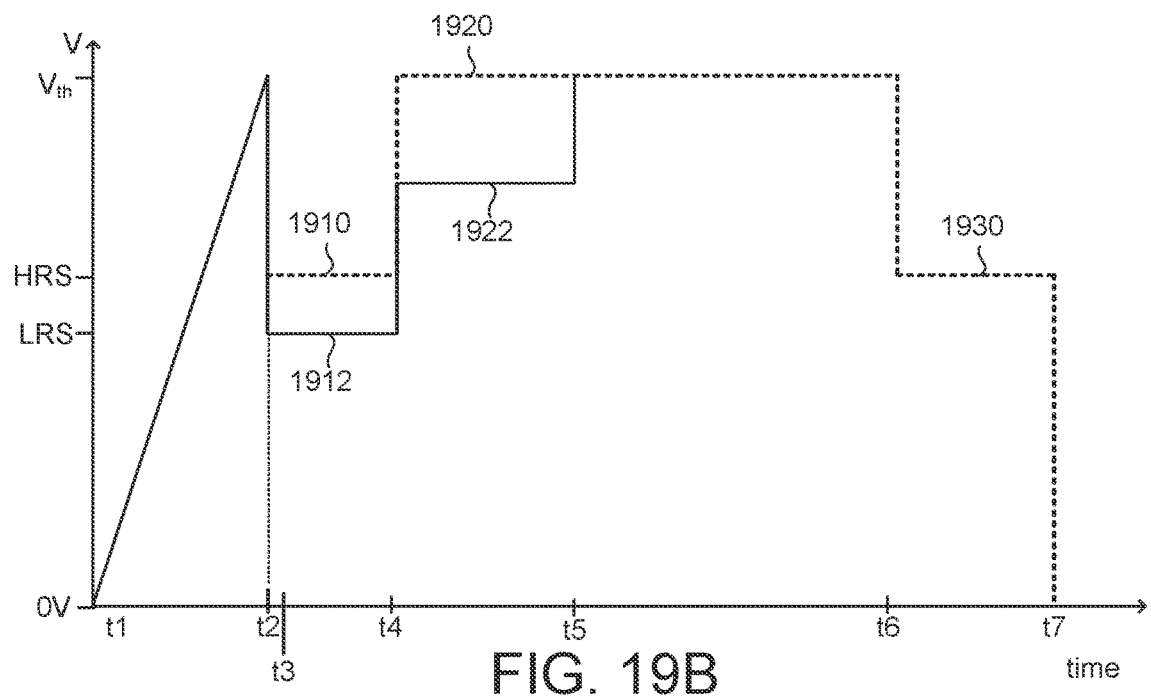
FIG. 19B depicts voltage versus time for the voltage across a selected MRAM cell during an embodiment of current-force SRR.

Process 1800 describes refreshing the MTJ element of one memory cell, and may be performed in parallel on the MRAM cells in a code-word group (which may reside in different tiles or groups of tiles). In one embodiment, the process 1800 is performed by a control circuit in the memory die 292. In one embodiment, the process 1800 is performed by a control circuit in the control die 290. In one embodiment, the process 1800 is performed by a control circuit (e.g., host processor 122) in the host 120. Process 1800 will be discussed with reference to FIGS. 19A and 19B. FIG. 19A depicts current versus time for the access current that is driven through a selected word line during an embodiment of current-force MTJ element refresh using SRR. FIG. 19B depicts voltage versus time for the voltage across a selected MRAM cell during an embodiment of current-force SRR.

Step 1801 includes driving a first read current into the selected word line to charge up the selected word line while applying a select voltage to a selected bit line in order to turn on the threshold switching selector of the selected MRAM cell. FIGS. 19A and 19B will now be discussed with respect to one MRAM cell 401 to further elaborate on step 1801. With reference to FIG. 19A, the current is increased to $I_{read}$ at time t1. With reference to FIG. 19B, the voltage across the memory cell 401 increases from t1 to t2. The threshold switching selector 502 is off between t1 and t2. Between t1 and t2, the current causes the word line voltage to increase. The current also comprises any leakage in the path. Once the voltage across threshold switching selector 502 reaches the threshold voltage Vth of the threshold switching selector 502, it will turn on and the voltage will drop to LRS (1912) or HRS (1910) voltage depending on the state of the MTJ 902 that is part of the selected cell 401 (at t2). Thus, the voltage across the series combination of the threshold switching selector 502 and the resistive MTJ element 902 ramps up between t1 and t2 as the threshold switching selector is in an off state.

Step 1802 includes driving the first read current through the selected MRAM cell while the threshold switching selector remains on. With reference to FIG. 9, $I_{access}$ is driven by current driver 910g through selected first conductive line 906g to drive $I_{access}$ through memory cell 401a using a current of, for example, 15 μa. With reference to FIG. 9, $V_{select\_BL}$ is applied by voltage driver 912b to second conductive line 908b. In one embodiment, for example, $I_{access}$ is 15 μA and $V_{select\_BL}$ is 0V. In another embodiment, the current is −15 μa and $V_{select\_BL}$ is 3.3V for 20 nm CD MRAM with RA 10 that may have low resistance state of about 25 ΩQ and high resistance state of about 50 kΩ.

FIGS. 19A and 19B will now be discussed with respect to one MRAM cell 401 to further elaborate on step 1802. With reference to FIG. 19A, the current remains at $I_{read}$ between t2 and t4. With reference to FIG. 19B, the threshold switching selector 502 remains on between t2 and t4 (in a low resistance state). Once the threshold switching selector 502 is in the on state (at t2), the $I_{read}$ current will flow through the selected memory cell 401. As the access current is held fixed at $I_{read}$, the voltage across the memory cell will drop to a level dependent upon the series resistance of the MTJ element 902 and the on-state resistance of the threshold switching selector 502. For a binary embodiment in which a memory cell only stores two states, the memory cell will have a high resistance, AP-state, for example 50 kΩ, and a low resistance, P-state, for ex example 25 kΩ. The resultant voltage across the series connected MTJ element 902 and threshold switching selector 502 in response to the $I_{read}$ current for the high resistance state (HRS) and low resistance state (LRS) are respectively shown as lines 1910 and 1912. Although the discussion here is in the context of an MTJ based memory cell being placed in series with the threshold switching selector, this read technique can similarly be applied to other programmable resistance memory cells, such as PCM or ReRAM devices.

Returning again to FIG. 18, step 1804 includes sensing a voltage across the selected memory cell. Step 1804 may also include storing the sensed voltage on, for example, a capacitor. Step 1805 includes adjusting the stored voltage by adding (Deck1) or subtracting (Deck2) a reference voltage (e.g., a 150 mV). In one embodiment, Deck1 and Deck2 are two different layers (see 418, 420 in FIG. 4D).

Step 1806 includes driving a write current through the selected word line while applying a select voltage to the selected bit line to force the write current through the selected MRAM cell. With reference to FIG. 9, $I_{access}$ is driven by current driver 910g through selected first conductive line 906g to force $I_{access}$ through memory cell 401a. With reference to FIG. 9, $V_{select\_BL}$ is applied by voltage driver 912b to second conductive line 908b. In one embodiment, $I_{access}$ to write is 30 μA and $V_{select\_BL}$ is 0V. In another embodiment, $I_{access}$ to write is −30 μA and $V_{select\_BL}$ is 3.3V FIGS. 19A and 19B will now be discussed with respect to one MRAM cell 401 to further elaborate on step 1806. With reference to FIG. 19A, the access current is increased to $I_{write}$ at time t4 and is held at $I_{write}$ until t6. With reference to FIG. 19B, at t4 the voltage across the MRAM cell 401 increases. If the MRAM cell 401 was in the HRS (line 1910), then the voltage across the MRAM cell will increase to the level indicated by line 1920 at t4 and stay there until t6. Recall that the HRS is the AP-state. Thus, this MRAM cell will stay in the AP-state.

If the MRAM cell 401 was in the LRS (line 1912), then the voltage across the MRAM cell will increase to the level indicated by line 1922 at t4 as a result of the MTJ P-state (LRS of the MTJ cell 401) switching to the AP-state (HRS of the MTJ cell 401). FIG. 19B shows line 1922 increases at t5 to meet with line 1920. This represents the MRAM cell has switched from the P-state (LRS) to the AP-state (HRS).

Returning again to FIG. 18, step 1808 includes driving a second read current through the selected word line while the threshold switching selector remains on. Step 1808 includes applying the select voltage to the selected bit line while driving the read current to the selected word line in order to force the second access current through the selected MRAM cell. In one embodiment, the second access current has the same direction and substantially the same magnitude as the first access current. With reference to FIG. 9, $I_{access}$ is driven by current driver 910g through selected first conductive line 906g to force $I_{access}$ through memory cell 401a. With reference to FIG. 9, $V_{select}$ is applied by voltage driver 912b to second conductive line 908b. In one embodiment, $I_{access}$ is 15 μA and $V_{select}$ is 0V.

FIGS. 19A and 19B will now be discussed with respect to one MRAM cell 401 to further elaborate on step 1808. With reference to FIG. 19A, the access current is decreased from $I_{write}$ to $I_{read}$ at time t6 and is held at $I_{read}$ until t7. With reference to FIG. 19B, the voltage across the memory cell 401 decreases at t6 to the level indicated by 1930 and holds at that level until t7. Note that line 1930 is at the HRS level. Also recall that regardless of the initial state of the MRAM cell, the MRAM cell was placed into the HRS state (AP-state) in step 1808.

Returning again to FIG. 18, step 1810 includes sensing the voltage across the selected memory cell. Step 1810 also includes comparing the voltage sensed in step 1810 with the stored voltage (as adjusted in step 1805).

Step 1812 includes determining a pre-read state of the selected MRAM cell. Step 1812 is based on a comparison of a stored voltage from driving the first read current through the selected memory cell (as adjusted by step 1805) to the voltage from forcing the second read current through the selected memory cell.

FIGS. 19A and 19B will now be discussed with respect to one MRAM cell 401 to further elaborate on step 1812. The first voltage on the selected word line from applying the first read current will be the voltage between t2 and t4. Hence, the first voltage is either the HRS level 1910 or the LRS level 1912. Note that this first voltage may be stored in step 1804 by, for example, charging a sense capacitor using the word line voltage. However, this voltage is adjusted as described in step 1805. The second voltage on the selected word line from applying the second read current will be the voltage between t6 and t7. This second voltage will typically be at about the HRS level 1910. However, the second voltage could be slightly different from the HRS level 1910. Comparing the first (adjusted) voltage with the second voltage may thus be used to determine whether the MRAM cell was at the HRS level 1910 or the LRS level 1912 between t2 and t4. To facilitate comparison, the level generated by the Read1 current to the AP-state may be stored and adjusted positive by about half the voltage difference between HRS and LRS, for example 150 mV. Alternatively, the level may be adjusted negative if the Read1 current is to the P-state. These choices may be reversed depending on MRAM cell orientation as will be apparent to one reasonably skilled in the art.

Returning again to FIG. 18, in step 1814, error detection and correction may be applied to correct any errors in the ECC codeword data that was stored in a group of MRAM cells. Step 1816 includes writing the memory cell to refresh the data. Step 1816 includes driving a write current through the selected word line to refresh the data.

In some embodiments, threshold switching selector refresh is performed in parallel on a group of programmable resistance memory cells. A group of programmable resistance memory cells that undergo the selector refresh operation in parallel will be referred to as a selector refresh group. The same group may also undergo the memory element refresh in parallel, which may be referred to herein as a memory element refresh group. There are a number of ways to form the refresh groups.

Figure 20:
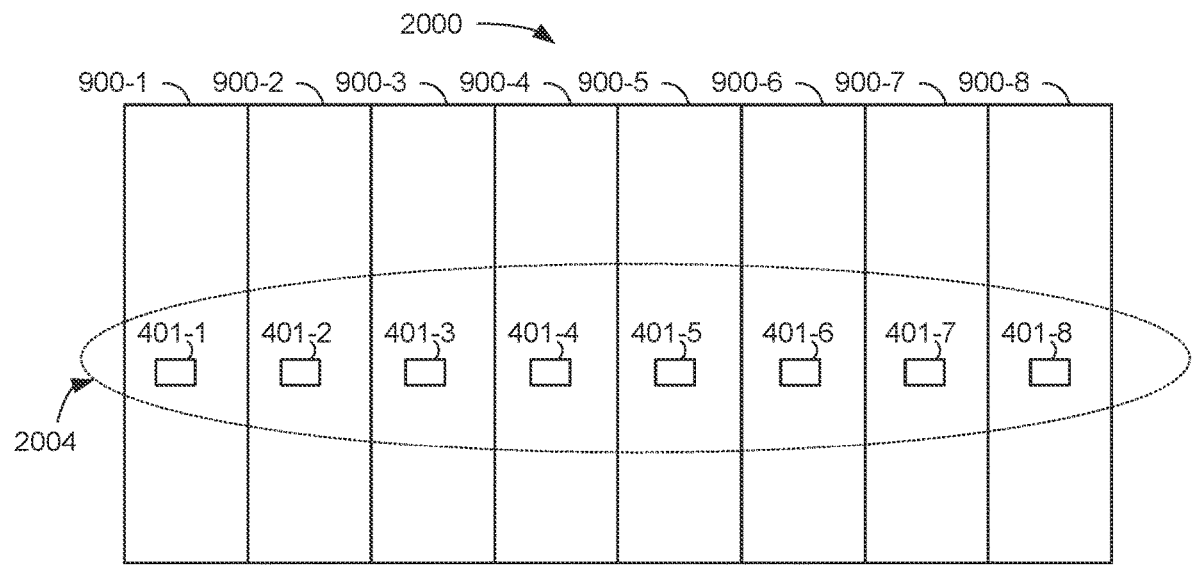
FIG. 20 depicts a bank of programmable resistance memory cells in which an embodiment of selector refresh is performed in parallel.

FIG. 20 depicts a bank 2000 that include tiles of programmable resistance memory cells. The bank 2000 is divided into a number of tiles 900-1 to 900-8. In this example, eight tiles 900 are depicted, but there may be more or fewer than eight tiles per bank. Each tile 900 has a number of programmable resistance memory cells. In one embodiment, a selector refresh group has one memory cell in each tile 900. In one embodiment, a selector refresh group has multiple memory cells in each tile 900. In one embodiment, a tile 900 includes a two-dimensional (e.g., single layer) cross-point array. In one embodiment, a tile 900 includes a three-dimensional (e.g., multi-layer) cross-point array.

FIG. 20 shows a selector refresh group 2004 that has eight programmable resistance memory cells 401-1, 401-2, 401-3, 401-4, 401-5, 401-6, 401-7, and 401-8. In one embodiment, the selector refresh group 2004 corresponds to the memory cells that store an ECC codeword. The ECC codeword includes both the data bits and the parity bits. Thus, the entire ECC codeword can undergo selector refresh in parallel, thereby leading to a very efficient refresh. Note that the ECC codeword may have more (or fewer) than the example eight bits depicted in FIG. 20.

Figure 21:
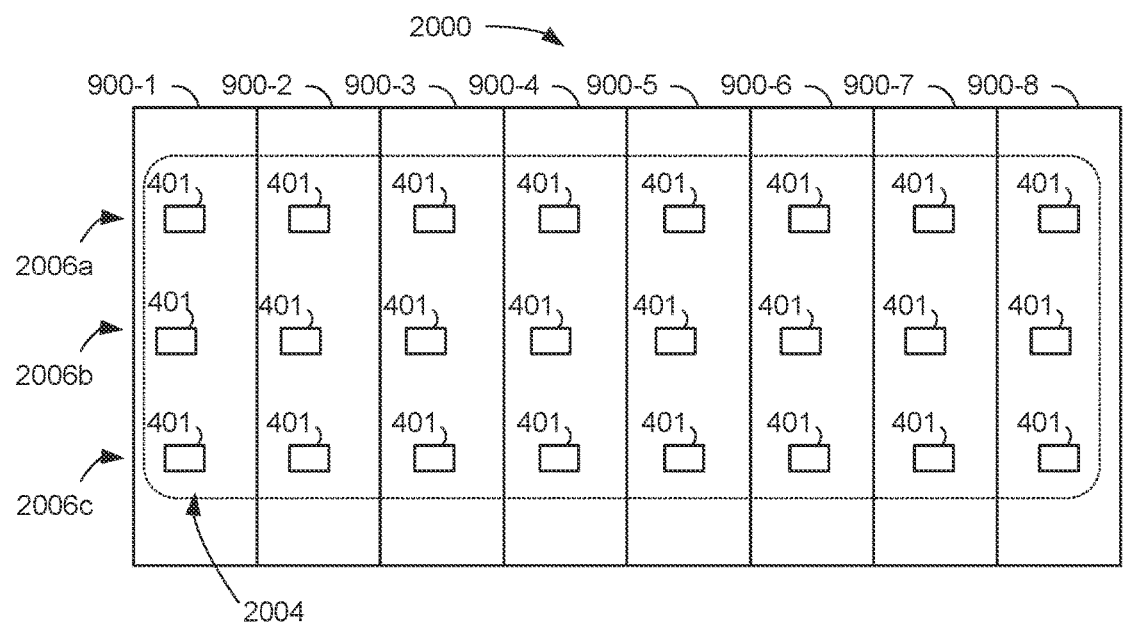
FIG. 21 shows a selector refresh group in which an embodiment of selector refresh is performed in parallel.

As noted, the selector refresh group 2004 can include memory cells that cover more than one ECC codeword. FIG. 21 shows a selector refresh group 2004 that has 24 programmable resistance memory cells. Each row of cells corresponds to an ECC codeword 2006. Thus, the top row of memory cells 401 corresponds to a first ECC codeword 2006a, the middle row of memory cells 401 corresponds to a second ECC codeword 2006b, and the bottom row of memory cells 401 corresponds to a third ECC codeword 2006c. Thus, all three entire ECC codewords can undergo selector refresh in parallel, thereby reducing the overall time needed to refresh all of the bits in the bank.

In an embodiment in which n ECC codeword 2006 undergo selector refresh in parallel, n memory cells in each tile 900 are selected for selector refresh, wherein n is an integer greater than 1. In one embodiment, those n memory cells are connected to the same word line, but n different bit lines. In one embodiment, those n memory cells are connected to the bit word line, but n different word lines. However, it is not required that all n memory cells be connected to the same conductive line (WL or BL). For example, n/2 of the memory cells may be connected to a first word line, n/2 of the memory cells may be connected to a second word line, with the memory cells connected to n different bit lines. Other possibilities exist for which n memory cells are selected within each tile 900.

In one embodiment, the choice of whether to use a current-force operation or a voltage-force operation may depend on how many ECC codewords are in the selector refresh group. In one embodiment, a current-force operation is used when there is one ECC codeword in the selector refresh group but a voltage-force operation is used when there are multiple ECC codewords in the selector refresh group. However, optionally, the voltage-force operation may be used when there is one ECC codeword in the selector refresh group. Likewise, optionally, the current-force operation may be used when there are multiple ECC codewords in the selector refresh group.

Figure 22:
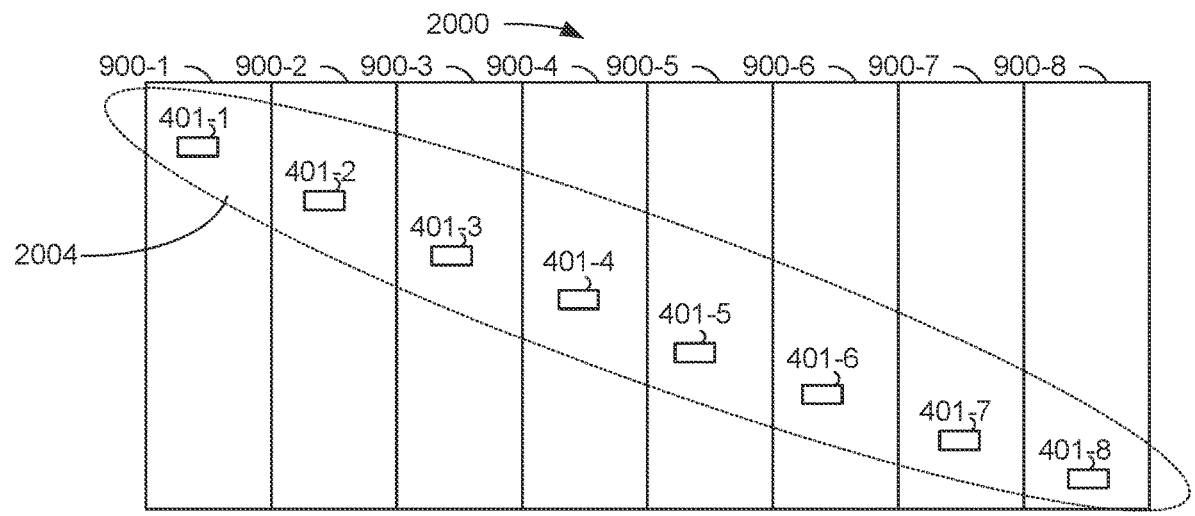
FIG. 22 shows one embodiment in which the selector refresh group is what is referred to herein as an ECC crossword.

As noted herein, the Vt of the threshold switching selector drifts since the last reset. However, the act of reading the memory cells that correspond to an ECC codeword can also reset the Vt of the threshold switching selectors. Therefore, there may be a correlation between the Vt drift and the last time ECC codeword was read. This correlated drift could potentially increase the risk that there are too many errors in the ECC codeword to successfully decode the ECC codeword. In one embodiment, the selector refresh groups contains memory cells that store many different ECC codeworks. However, the selector refresh group does not contain all of the memory cells that store a given ECC codeword. FIG. 22 shows one embodiment in which the selector refresh group 2004 is what is referred to herein as an ECC crossword. In the example in FIG. 22, the selector refresh group 2004 contains eight memory cells 401, each of which corresponds to a different ECC codeword. In one embodiment, a single bit from each ECC codeword is included in the selector refresh group 2004. However, multiple bits from each ECC codeword could be included in the selector refresh group 2004. Forming the selector refresh group from such an "ECC crossword" may reduce the risk of multi-bit failures in an ECC codeword. In effect, the amount of Vt drift of the memory cells in the ECC codeword will have a wide range of times.

Figure 23:
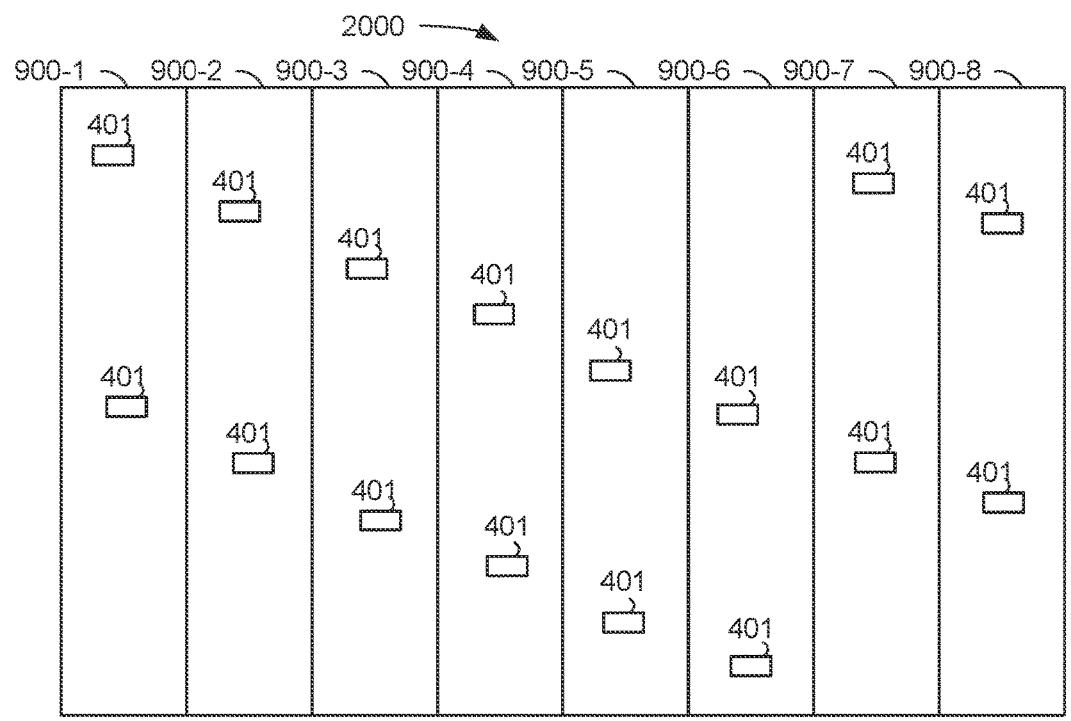
FIG. 23 shows another embodiment in which the selector refresh group is what is referred to herein as an ECC crossword.

FIG. 23 shows another embodiment in which the selector refresh group is what is referred to herein as an ECC crossword. In the example in FIG. 23, the selector refresh group 2004 contains two memory cells 401 from each tile 900. In the example of FIG. 23, there are 16 memory cells 401 in the selector refresh group. In an embodiment, these 16 memory cells 401 are from 16 different ECC codewords. In one embodiment, some of the memory cells 401 in the selector refresh group could come from the same ECC codeword.

Figure 24:
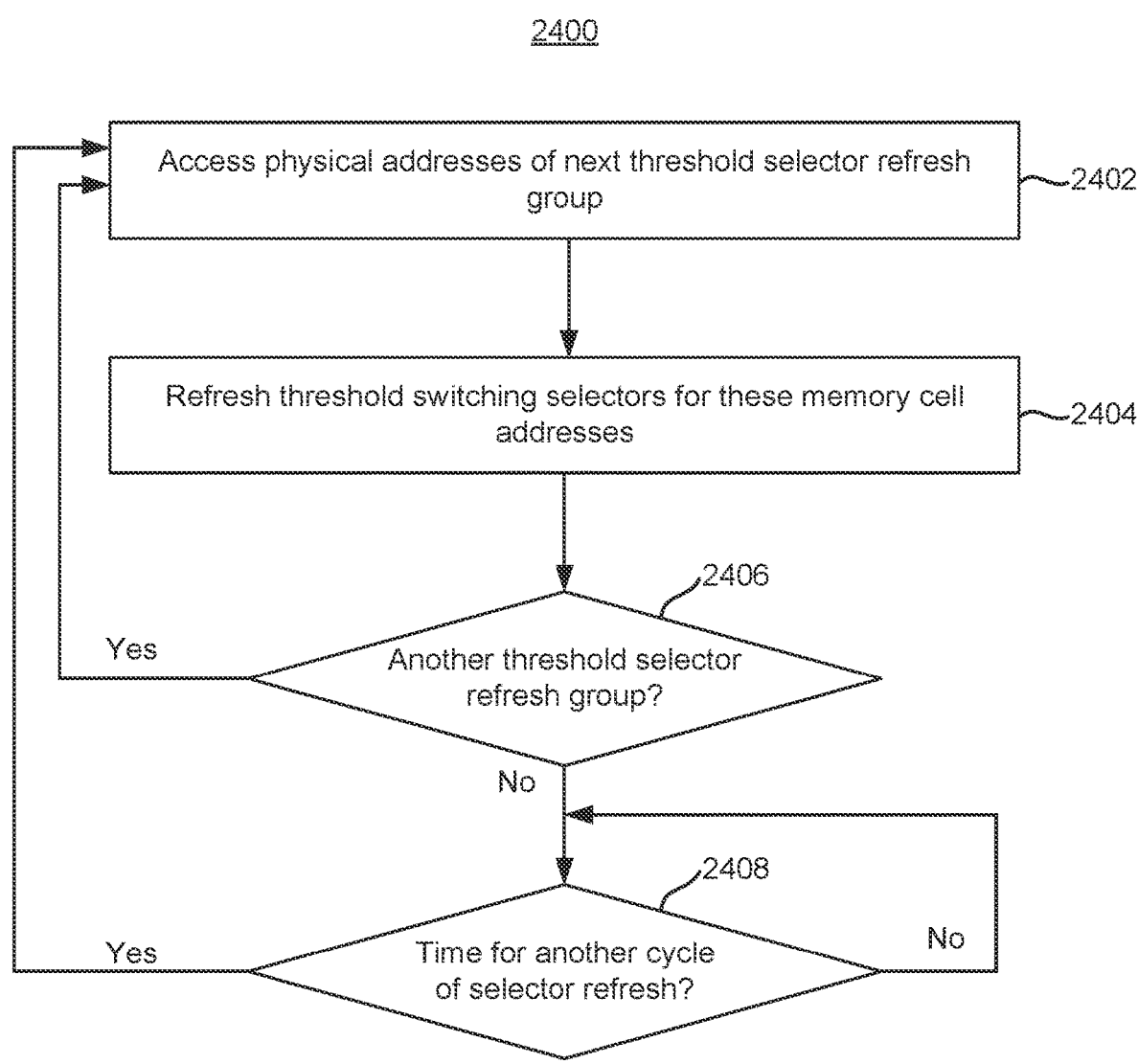
FIG. 24 is a flowchart of one embodiment of a process of periodically refreshing the threshold switching selectors of all memory cells in a memory structure having at least one cross-point array.

FIG. 24 is a flowchart of one embodiment of a process 2400 of periodically refreshing the threshold switching selectors 502 of all memory cells in a memory structure 202 having at least one cross-point array. In process 2400, one group of memory cells undergoes the selector refresh at a time. The process 2400 cycles through all selector refresh groups 2004 until have been refreshed. The process is then repeated at regular intervals, such that all memory cells will have their selectors refreshed at a target rate. The selector refresh group 2004 may be, but is not limited to, any of the selector refresh groups 2004 discussed above in connection with FIGS. 20-23. In one embodiment, the memory system 100 maintains information that defines what memory cells are in each selector refresh group 2004. This information may be used to determine the physical addresses of the memory cells in each selector refresh group 2004.

Step 2402 includes accessing the physical addresses of the next selector refresh group. Step 2404 includes refreshing the threshold switching selectors 502 for the memory cells 401 at these physical addresses. In one embodiment, process 1000 (see FIG. 10) is performed in parallel on each memory cell in the selector refresh group 2004. Step 2406 is a determination of there is another selector refresh group 2004 to be refreshed for this refresh cycle. If so, the process 2400 returns to step 2402. When all selector refresh groups 2004 have been refreshed for this cycle, the memory system determines whether it is time for another cycle of selector refresh (step 2408). In an embodiment, the memory system (e.g., memory controller 102 or system control logic 260) keeps track of the time between cycles. When the memory system determines that it is time for another cycle of refresh operations, the process returns to step 2402 for the next selector refresh of each memory cell in the memory structure.

Figure 25:
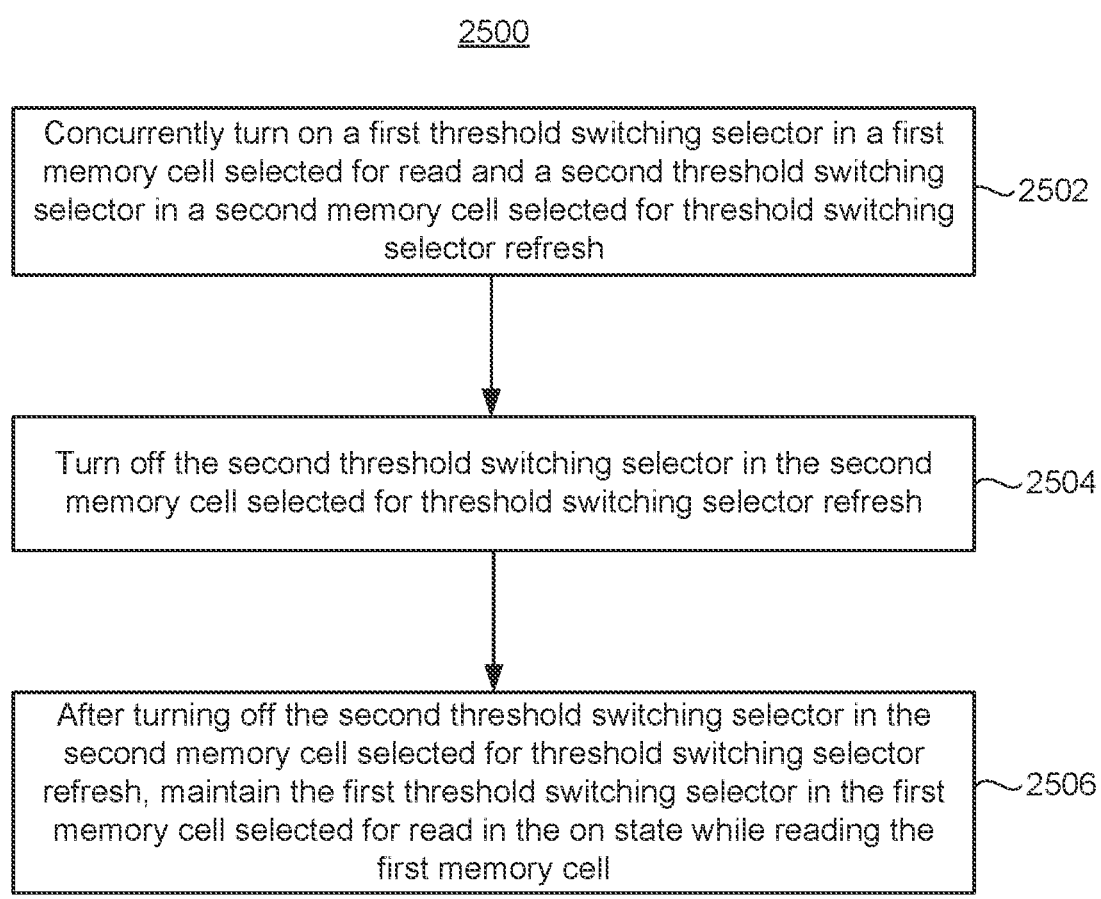
FIG. 25 is a flowchart of one embodiment of a process of performing a threshold switching selector refresh of one memory cell in concert with a read operation of another memory cell.

In one embodiment the threshold switching selector refresh of one memory cell is performed concurrently with a portion of a read operation of another memory cell. This effectively hides the refresh time. These two memory cells may be in the same tile 900. These two memory cells may share (i.e., be connected to) a common conductive line (e.g., WL, BL). FIG. 25 is a flowchart of one embodiment of a process 2500 of performing a threshold switching selector refresh of one memory cell in concert with a read operation of another memory cell. The process 2500 may use a current-force approach or a voltage-force approach. The read operation may be a fast read (see FIGS. 17B, 17C for a current-force approach) or a SRR (see FIGS. 19A, 19B for a current-force approach). Step 2502 includes concurrently turning on a first threshold switching selector 502 in a first memory cell selected for read and a second threshold switching selector 502 in a second memory cell selected for threshold switching selector refresh. In one embodiment, these two memory cells share one conductive line of the cross-point array. With reference to FIG. 9A, the two memory cells 401 may each be connected to the same word line (e.g., WL line 906g) but be connected to different bit lines (e.g., BLs 908b and 908d). Alternatively, the two memory cells 401 may each be connected to the same bit line (e.g., BL line 908b) but be connected to different word lines (e.g., WLs 906g and 906b).

In an embodiment in which the memory cells are connected to the same word line, turning on the threshold switching selectors 502 includes driving the refresh current into the selected word line while applying a select voltage to the two BLs associated with the two memory cells. Alternatively, a voltage-force approach can be used in which a voltage is applied to the selected word line in order to charge up the selected WL.

In an embodiment in which the memory cells are connected to the same bit line, turning on the threshold switching selectors 502 may include driving the refresh current into two different word lines while applying a select voltage to the common BL connected to the two memory cells. Alternatively, a voltage-force approach can be used.

Step 2504 includes turning off the second threshold switching selector 502 in the second memory cell 401 selected for threshold switching selector refresh. Step 2504 is performed after the Vt of the threshold switching selector 502 has been reset. In the example of FIG. 17C, step 2504 is performed at t3. In the example of FIG. 19B, step 2504 is performed at t3.

In one embodiment in which the two memory cells are connected to different bit lines, step 2504 includes changing the voltage on the bit line connected to the second memory cell selected for selector refresh. For example, initially the bit line voltage may be 0V to select the bit line. At step 2504, the bit line voltage may be changed to a voltage that results in less than Vhold being across the second threshold switching selector 502, wherein the second threshold switching selector 502 will shut off.

In one embodiment in which the two memory cells are connected to different word lines, step 2504 includes changing the signal on the word line connected to the second memory cell selected for selector refresh. At step 2504 in a current-force approach, the current to the word line connected to the second memory cell may be removed, wherein the second threshold switching selector 502 will shut off. Alternatively, a voltage-force approach can be used.

Step 2506 includes maintaining the threshold switching selector 502 in the memory cell selected for read in the on state while reading the selected memory cell. This step is performed after turning off the threshold switching selector 502 in the memory cell 401 selected for threshold switching selector refresh. In the example of FIG. 17C, the threshold switching selector 502 of the memory cell selected for read is kept on after time t3 until at least t4. The memory cell read occurs at least in part during the internal between t3 and t4. In the example of FIG. 19B, the threshold switching selector 502 of the memory cell selected for read is kept on after time t3 until at least t4. The memory cell read occurs at least in part during the internal between t3 and t4.

In view of the foregoing, it can be seen that, according to a first embodiment, an apparatus comprises one or more control circuits configured to communicate with one or more cross-point arrays. Each array comprises a plurality of first conductive lines, a plurality of second conductive lines, and programmable resistance memory cells. Each programmable resistance memory cell comprises a programmable resistance memory element in series with a two terminal threshold switching selector having a threshold voltage. Each memory cell is connected between one of the first conductive lines and one of the second conductive lines. The one or more control circuits are configured to read a selected programmable resistance memory cell by turning on the threshold switching selector in the selected programmable resistance memory cell and keeping the threshold switching selector on for a first period of time to read a state of the programmable resistance memory element in the selected programmable resistance memory cell. The one or more control circuits are configured to refresh the threshold switching selector in the selected programmable resistance memory cell by turning on the threshold switching selector in the selected programmable resistance memory cell and keeping on the threshold switching selector for a second period of time that is less than the first period of time to reset the threshold voltage of the threshold switching selector.

In a second embodiment, in furtherance of the first embodiment, the one or more control circuits are configured to refresh the threshold switching selectors in respective programmable resistance memory cells at a first rate, including apply signals to a particular programmable resistance memory cell to turn on the threshold switching selector in order to reset the threshold voltage of the threshold switching selector. The one or more control circuits are configured to refresh the programmable resistance memory elements in the respective programmable resistance memory cells at a second rate that is lower than the first rate, including applying signals to the particular programmable resistance memory cell to refresh data stored in the programmable resistance memory element of the particular programmable resistance memory cell.

In a third embodiment, in furtherance of the first or second embodiments, the one or more control circuits are configured to apply a signal to the selected programmable resistance memory cell for a pre-determined period of time in order to turn on the threshold switching selector and keep the threshold switching selector on for the second period of time.

In a fourth embodiment, in furtherance of the first or second embodiments, the one or more control circuits are configured to apply a signal to the selected programmable resistance memory cell to turn on the threshold switching selector; detect that the threshold switching selector has turned on in response to the signal; and remove the signal from the selected programmable resistance memory to turn off the threshold switching selector in response to detecting that the threshold switching selector has turned on in order to keep the threshold switching selector on for the second period of time.

In a fifth embodiment, in furtherance of any of the first to fourth embodiments, the one or more control circuits are configured to: i) select a selector refresh group for refresh of the threshold switching selectors of the respective programmable resistance memory cells in the selector refresh group, wherein the selector refresh group comprises a plurality of programmable resistance memory cells in the one or more cross-point arrays; ii) reset threshold voltages of the threshold switching selectors of the respective programmable resistance memory cells in the selected selector refresh group without refreshing data stored in the programmable resistance memory cells; iii) repeat said i) and said ii) for other selector refresh groups in the one or more cross-point arrays; and iv) repeat said i), said ii) and said iii) at regular intervals to periodically refresh threshold switching selectors in each selector refresh group.

In a sixth embodiment, in furtherance of the fifth embodiment, each selector refresh group is configured to store a plurality of ECC codewords.

In a seventh embodiment, in furtherance of the fifth embodiment, each selector refresh group is configured to store an ECC crossword, wherein each ECC crossword corresponds to a plurality of different ECC codewords and contains only a subset of the bits of the different ECC codewords.

In an eighth embodiment, in furtherance of any of the first to seventh embodiments, the one or more control circuits are configured to concurrently turn on a first threshold switching selector in a first programmable resistance memory cell that is selected for read and a second threshold switching selector in a second programmable resistance memory cell that is selected for threshold switching selector refresh. The one or more control circuits are configured to turn off the second threshold switching selector in the second programmable resistance memory cell after resetting the Vt of the second threshold switching selector. The one or more control circuits are configured to maintain the first threshold switching selector in the on state while reading the first programmable resistance memory cell after turning off the second threshold switching selector.

In a ninth embodiment, in furtherance of any of the eighth embodiment, the one or more control circuits are configured to drive a current through a selected first conductive line that is connected to both the first memory cell and the second memory cell while applying a select voltage to a first bit line connected to the first memory cell and to a second bit line connected to the second memory cell to turn on the first threshold switching selector concurrently with turning on the second threshold switching selector. The one or more control circuits are configured to change the select voltage applied to the second bit line to an unselect voltage to end a refresh operation for the second threshold switching selector. The one or more control circuits are configured to keep the select voltage applied to the first bit line at the select voltage to read the first memory cell while continuing to drive the current through the selected first conductive line.

In a tenth embodiment, in furtherance of any of the first to ninth embodiments, the one or more control circuits are configured to force a current through a selected first conductive line connected to the selected programmable resistance memory cell to turn on the threshold switching selector in the selected programmable resistance memory cell during a refresh operation that refreshes the threshold switching selector in the selected programmable resistance memory cell. The one or more control circuits are configured to remove the current to turn off the threshold switching selector to end the refresh operation.

In an eleventh embodiment, in furtherance of any of the first to tenth embodiments, the one or more control circuits are configured to apply a voltage across a selected first conductive line connected to the selected programmable resistance memory cell to turn on the threshold switching selector in the selected programmable resistance memory cell during a refresh operation that refreshes the threshold switching selector in the selected programmable resistance memory cell. The one or more control circuits are configured to remove the voltage to turn off the threshold switching selector to end the refresh operation.

In a twelfth embodiment, in furtherance of any of the first to eleventh embodiments, the programmable resistance memory element comprises a magnetic tunnel junction (MTJ) and the threshold switching selector comprises an Ovonic Threshold Switch (OTS).

A further embodiment includes a method for refreshing magnetoresistive memory cells (MRAM cells) in a memory structure having one or more cross-point arrays. Each MRAM cell has a magnetoresistive element in series with a threshold switching selector having a threshold voltage at which the threshold switching selector turns on. The method comprises refreshing the threshold switching selectors in respective MRAM cells at a first rate, including applying first signals to a particular MRAM cell to turn on the threshold switching selector in order to reset the threshold voltage of the threshold switching selector. The method comprises refreshing the magnetoresistive elements in the respective MRAM cells at a second rate that is lower than the first rate, including applying second signals to the particular MRAM cell to refresh data stored in the magnetoresistive element of the particular MRAM cell.

A further embodiment includes a memory system, comprising a memory structure having a plurality of cross-point arrays. Each cross-point array comprising a plurality of first conductive lines, a plurality of second conductive lines, and magnetoresistive memory (MRAM) cells. Each MRAM cell comprising a magnetoresistive memory element in series with a threshold switching selector. Each memory cell connected between one of the first conductive lines and one of the second conductive lines. The memory system has one or more control circuits in communication with the memory structure. The one or more control circuits are configured to: i) select a selector refresh group, wherein each selector refresh group comprises at least one memory cell in a group of the plurality of cross-point array; ii) reset threshold voltages of the threshold switching selectors of the respective MRAM cells in the selected selector refresh group without refreshing data stored in the MRAM cells; iii) repeat said i) and said ii) for a plurality of other selector refresh groups; and iv) repeat said i), said ii) and said iii) at regular intervals to periodically refresh threshold switching selectors in the memory structure.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A memory system, comprising:
   a memory structure having a plurality of cross-point arrays, each cross-point array comprising a plurality of first conductive lines, a plurality of second conductive lines, and programmable resistance memory cells, each programmable resistance memory cell comprising a programmable resistance memory element in series with a threshold switching selector, each memory cell connected between one of the first conductive lines and one of the second conductive lines; and
   one or more control circuits in communication with the memory structure, the one or more control circuits configured to:
      i) select a selector refresh group of a plurality of selector refresh groups in the memory structure, wherein each selector refresh group comprises at least one memory cell in a group of the plurality of cross-point arrays;
      ii) reset threshold voltages of the threshold switching selectors of the respective programmable resistance memory cells in the selected selector refresh group without refreshing data stored in the programmable resistance memory cells in the selected selector refresh group;
      iii) repeat said i) and said ii) for other selector refresh groups in the plurality of selector refresh groups; and
      iv) repeat said i), said ii) and said iii) at regular intervals to periodically refresh threshold switching selectors in the plurality of selector refresh groups.

2. The memory system of claim 1, wherein the one or more control circuits are configured to:
   refresh the threshold switching selectors in the plurality of selector refresh groups at a first refresh rate; and
   refresh data stored in the programmable resistance memory cells in the plurality of selector refresh groups at a second refresh rate that is less than the first refresh rate.

3. The memory system of claim 1, wherein the one or more control circuits are configured to:
   apply a signal to the programmable resistance memory cells in the selected selector refresh group for a predetermined period of time in order to turn on the respective threshold switching selectors to reset threshold voltages of the respective threshold switching selectors of the programmable resistance memory cells in the selected selector refresh group without refreshing data stored in the programmable resistance memory cells in the selected selector refresh group.

4. The memory system of claim 1, wherein each selector refresh group maintained by the one or more control circuits comprises programmable resistance memory cells that collectively store an ECC codeword.

5. The memory system of claim 1, wherein each selector refresh group maintained by the one or more control circuits comprises programmable resistance memory cells that collectively store a plurality of ECC codewords.

6. The memory system of claim 5, wherein:
   the plurality of ECC codewords comprise n ECC codewords, wherein n is an integer greater than 1; and
   each selector refresh group comprises n programmable resistance memory cells in each tile of a plurality of tiles in the memory structure.

7. The memory system of claim 1, wherein each selector refresh group maintained by the one or more control circuits comprises programmable resistance memory cells that collectively store an ECC crossword, wherein each ECC crossword corresponds to a plurality of different ECC codewords and contains only a subset of bits of the different ECC codewords.

8. The memory system of claim 7, wherein:
   each selector refresh group comprises n programmable resistance memory cells in each tile of a plurality of tiles in the memory structure.

9. The memory system of claim 1, wherein the one or more control circuits configured to:
   turn on a first threshold switching selector in a first programmable resistance memory cell that is selected for read concurrently with turning on a second threshold switching selector in a second programmable resistance memory cell that is selected for threshold switching selector refresh;

turn off the second threshold switching selector after resetting the second threshold switching selector; and after turning off the second threshold switching selector, maintain the first threshold switching selector in an on state while reading the first programmable resistance memory cell.

10. The memory system of claim 9, wherein:
the first programmable resistance memory cell and the second threshold switching selector reside in the same tile in the memory structure; and
the first programmable resistance memory cell and the second threshold switching selector are connected to the same first conductive line in the tile.

11. The memory system of claim 1, wherein the programmable resistance memory element of each programmable resistance memory cell includes a magnetoresistive memory element.

12. A method of operating a memory system, the method comprising:
i) selecting a selector refresh group, wherein the selected selector refresh group comprises at least one memory cell in each cross-point array of a group of cross-point arrays, each cross-point array comprising a plurality of first conductive lines, a plurality of second conductive lines, and magnetoresistive memory (MRAM) cells, each MRAM cell comprising a magnetoresistive memory element in series with a threshold switching selector, each memory cell connected between one of the first conductive lines and one of the second conductive lines;
ii) resetting threshold voltages of the threshold switching selectors of the respective MRAM cells in the selected selector refresh group without refreshing data stored in the MRAM cells in the selected selector refresh group;
iii) repeating said i) and said ii) for a plurality of other selector refresh groups; and
iv) repeating said i), said ii) and said iii) at regular intervals to periodically refresh threshold switching selectors in the memory system.

13. The method of claim 12, wherein periodically refreshing the threshold switching selectors in the memory system is performed at a first refresh rate, and further comprising refreshing data stored in the MRAM cells in the memory system at a second refresh rate that is less than the first refresh rate.

14. The method of claim 12, wherein resetting the threshold voltages of the threshold switching selectors of the respective MRAM cells in the selected selector refresh group without refreshing data stored in the MRAM cells comprises applying a signal to the MRAM cells in the selected selector refresh group for a pre-determined period of time in order to turn on the respective threshold switching selectors.

15. A memory system comprising:
a plurality of tiles, each tile comprising a plurality of word lines, a plurality of bit lines, and magnetoresistive memory (MRAM) cells, each MRAM cell comprising a magnetoresistive memory element in series with a threshold switching selector, each MRAM cell connected between one of the word lines and one of the bit lines; and
one or more control circuits in communication with the plurality of tiles, the one or more control circuits configured to:
i) access physical addresses of a group of the MRAM cells, wherein the group of MRAM cells comprises at least one MRAM cell in each tile of a group of the plurality of tiles;
ii) reset threshold voltages of the threshold switching selectors of the respective MRAM cells in the group of MRAM cells without refreshing data stored in the magnetoresistive memory element of the respective MRAM cells;
iii) repeat said i) and said ii) for a plurality of other groups of the MRAM cells in the memory system; and
iv) repeat said i), said ii) and said iii) at regular intervals to periodically refresh threshold switching selectors in the memory system.

16. The memory system of claim 15, wherein the one or more control circuits are configured to:
refresh the threshold switching selectors in the memory system at a first refresh rate; and
refresh data stored in the MRAM cells in the memory system at a second refresh rate that is less than the first refresh rate.

17. The memory system of claim 15, wherein the one or more control circuits are configured to:
apply a signal to the MRAM cells in the group of MRAM cells selected for refresh of the threshold switching selectors for a pre-determined period of time in order to turn on the respective threshold switching selectors to reset threshold voltages of the respective threshold switching selectors of the MRAM cells in the group of MRAM cells without refreshing data stored in the MRAM cells.

18. The memory system of claim 15, wherein each group of MRAM cells that is selected for refresh of the threshold switching selectors comprises MRAM cells that collectively store an ECC codeword.

19. The memory system of claim 15, wherein each group of MRAM cells that is selected for refresh of the threshold switching selectors comprises MRAM cells that collectively store a plurality of ECC codewords.

20. The memory system of claim 15, wherein each group of MRAM cells that is selected for refresh of the threshold switching selectors comprises MRAM cells that collectively store an ECC crossword, the ECC crossword having at least one bit from each of a plurality of ECC codewords, the ECC crossword contains only a subset of the MRAM cells of each of the ECC codewords.

* * * * *